(12) United States Patent
Kwon et al.

(10) Patent No.: US 11,264,330 B2
(45) Date of Patent: Mar. 1, 2022

(54) CHIP PACKAGE WITH CONNECTION PORTION THAT PASSES THROUGH AN ENCAPSULATION PORTION

(71) Applicant: NEPES CO., LTD., Chungcheongbuk-do (KR)

(72) Inventors: Yongtae Kwon, Cheongju-si (KR); Eung Ju Lee, Cheongju-si (KR); Yong Woon Yeo, Cheongju-si (KR); Yun Mook Park, Cheongju-si (KR); Hyo Young Kim, Cheongju-si (KR); Jun Kyu Lee, Cheongju-si (KR); Seok Hwi Cheon, Cheongju-si (KR)

(73) Assignee: NEPES CO., LTD.

( * ) Notice: Subject to any disclaimer, the term of this patent is extended or adjusted under 35 U.S.C. 154(b) by 0 days.

(21) Appl. No.: 16/636,638

(22) PCT Filed: Aug. 3, 2018

(86) PCT No.: PCT/KR2018/008816
§ 371 (c)(1),
(2) Date: Feb. 4, 2020

(87) PCT Pub. No.: WO2019/027278
PCT Pub. Date: Feb. 7, 2019

(65) Prior Publication Data
US 2021/0151379 A1    May 20, 2021

(30) Foreign Application Priority Data

Aug. 4, 2017  (KR) .................. 10-2017-0098911
Sep. 28, 2017  (KR) .................. 10-2017-0126263
(Continued)

(51) Int. Cl.
*H01L 23/538* (2006.01)
*G06K 9/00* (2022.01)
*H01L 23/31* (2006.01)

(52) U.S. Cl.
CPC ...... *H01L 23/5386* (2013.01); *G06K 9/00053* (2013.01); *H01L 23/31* (2013.01); *H01L 23/5384* (2013.01)

(58) Field of Classification Search
CPC ................................................ H01L 23/5386
(Continued)

(56) References Cited

U.S. PATENT DOCUMENTS 7,378,733 B1 *  5/2008  Hoang ............... H01L 23/50
                                                    257/724
2009/0026567 A1 *  1/2009  Chen ............... H01L 27/14618
                                                    257/434
(Continued)

FOREIGN PATENT DOCUMENTS

KR      20110123297 A    11/2011
KR      20130129100 A    11/2013
(Continued)

*Primary Examiner* — Ajay Arora
(74) *Attorney, Agent, or Firm* — Renaissance IP Law Group LLP

(57) ABSTRACT

Disclosed are a chip package capable of improving the strength of a package and simplifying a manufacturing process and a manufacturing method therefor. This invention may improve the durability of the package by further forming a reinforcing layer on a chip by using an adhesive layer and molding the chip and the reinforcing layer so as to be integrated by using a molding layer. Also, the strength of the package may be improved by having a structure in which solder balls are formed between a base substrate and a re-wiring layer and integrated with the molding layer, and a wiring layer may be formed directly on the molding layer by (Continued)

using polyimide (PI) as the molding layer without using a separate insulating layer formed on the molding layer as in the conventional art.

16 Claims, 36 Drawing Sheets

(30) Foreign Application Priority Data

| Sep. 28, 2017 | (KR) | 10-2017-0126334 |
| Sep. 28, 2017 | (KR) | 10-2017-0126398 |
| Jul. 13, 2018 | (KR) | 10-2018-0081717 |

(58) Field of Classification Search
USPC .................................................... 257/774
See application file for complete search history.

(56) References Cited

U.S. PATENT DOCUMENTS

| 2011/0316150 A1 | 12/2011 | Ozawa | |
| 2016/0099210 A1* | 4/2016 | Kwon | H01L 23/528 |
| | | | 257/774 |
| 2016/0197057 A1* | 7/2016 | Umemoto | H01L 23/5389 |
| | | | 257/738 |

FOREIGN PATENT DOCUMENTS

| KR | 20160039752 A | 4/2016 | |
| KR | 20160083977 A | 7/2016 | |
| WO | WO-2019027278 A1 * | 2/2019 | H01L 24/24 |

* cited by examiner

CHIP PACKAGE WITH CONNECTION PORTION THAT PASSES THROUGH AN ENCAPSULATION PORTION

TECHNICAL FIELD

The present disclosure relates to a chip package and a manufacturing method thereof, and more particularly, to a chip package and a manufacturing method thereof which are capable of improving the strength of a package and simplify a manufacturing process.

BACKGROUND ART

Recently, biometric authentication technology has been applied for checking identification in industries and research institutes for security and confidentiality, access control of general homes and apartments, automated teller machines (ATMs) in financial sectors, and mobile phones.

As types of biometrics for security authentication, fingerprints, irises, voices, faces, blood vessels, and the like which are different in people are being used. Among the types, fingerprint sensing is most commonly used due to various reasons such as convenience and security.

Like a general semiconductor chip, a sensor package for fingerprint sensing is sealed by a resin material such as an epoxy molding compound (EMC) and assembled to a main board of an electronic device.

However, as electronic devices on which fingerprint recognition sensor packages are mounted are recently miniaturized and thinned, the fingerprint recognition sensor packages also need to be miniaturized and thinned.

DISCLOSURE

Technical Problem

The present inventive concept is directed to providing a chip package capable of improving the strength of a package and simplifying a manufacturing process.

The present inventive concept is also directed to providing a manufacturing method of a chip package for achieving the above objective of the present inventive concept.

Technical Solution

One aspect of the present inventive concept provides a chip package including a chip including an active surface on which a pad is formed and a non-active surface opposite to the active surface, an encapsulation portion including a first surface which covers the chip and is formed in the same direction as the active surface of the chip and a second surface opposite to the first surface, an external connection terminal connected to the chip and electrically connected to the outside, and a wiring portion electrically connected to the pad and the external connection terminal.

The upper wiring portion may include an upper insulating layer formed on the active surface of the chip and the first surface of the encapsulation portion, and an upper wiring layer formed on the upper insulating layer and electrically connected to the pad.

A light transmissive insulating layer may be formed on the active region of the chip.

The connection portion may include a first mold via and a second mold via which are formed in the encapsulation portion.

The upper wiring portion may include an upper wiring layer formed to be in contact with the first surface of the encapsulation portion and configured to electrically connect the first mold via to the second mold via, and an upper insulating layer formed on the upper wiring layer.

The wiring portion may include a lower wiring portion formed on the second surface of the encapsulation portion, and a connection portion configured to electrically connect the upper wiring portion to the lower wiring portion.

The connection portion may include a body portion, at least one through portion configured to pass through at least a portion of the body portion, and a conductive connection portion provided in the through portion.

The connection portion may include a via post configured to protrude upward from the body portion and electrically connect to the conductive connection portion.

A diameter of the via post may be greater than or equal to that of the conductive connection portion.

The connection portion may be formed to pass through the encapsulation portion, and a width of the connection portion may become narrower in a vertical direction based on a center point of a vertical cross section of the connection portion.

A mold via configured to electrically connect the conductive connection portion to the lower wiring portion may be included on the second surface of the encapsulation portion.

The connection portion may be disposed in a region of one side of the chip or disposed in regions of both sides thereof.

The connection portion may be formed to surround a periphery of the chip.

The chip package may further include a reinforcing layer provided on the non-active surface of the chip.

The reinforcing layer may be formed of any one among stainless steel (SUS), Cu, Ag, Au, W, Pt, Cr, epoxy, and urethane.

The reinforcing layer may include an insertion hole formed to allow the connection portion to be inserted thereinto, and an injection hole formed to allow the encapsulation portion to be injected below the reinforcing layer to cover the chip.

The chip package may further include a protective layer provided on the upper wiring portion and configured to cover the upper wiring portion.

Advantageous Effects

According to the above-described present inventive concept, durability of a package can be improved by further forming a reinforcing layer on a chip using an adhesive layer and integrally molding the chip and the reinforcing layer using a molding layer.

Further, the strength of the package can be improved by forming a solder ball between a base substrate and a re-wiring layer to achieve a structure of integrating the base substrate and the re-wiring layer with the molding layer. Polyimide (PI) is used as the molding layer so that a wiring layer can be directly formed on the molding layer without consuming a separate insulating layer formed on the molding layer as in the related art. Therefore, since a process of forming a separate insulating layer below the wiring layer may be omitted, there is an effect which is capable of reducing the consumption of the insulating layer, a process time, and a thickness of the package due to the reduction of the insulating layer.

Further, since the re-wiring layers are formed on upper and lower portions of the via frame, the chip may be electrically connected to an external connection terminal so that it is possible to effectively reduce a thickness of the package.

It should be noted that technical effects of the present inventive concept are not limited to the above-described effects, and other technical effects of the present inventive concept will be apparent to those skilled in the art from the appended claims.

DETAILED DESCRIPTION

Figure 1:
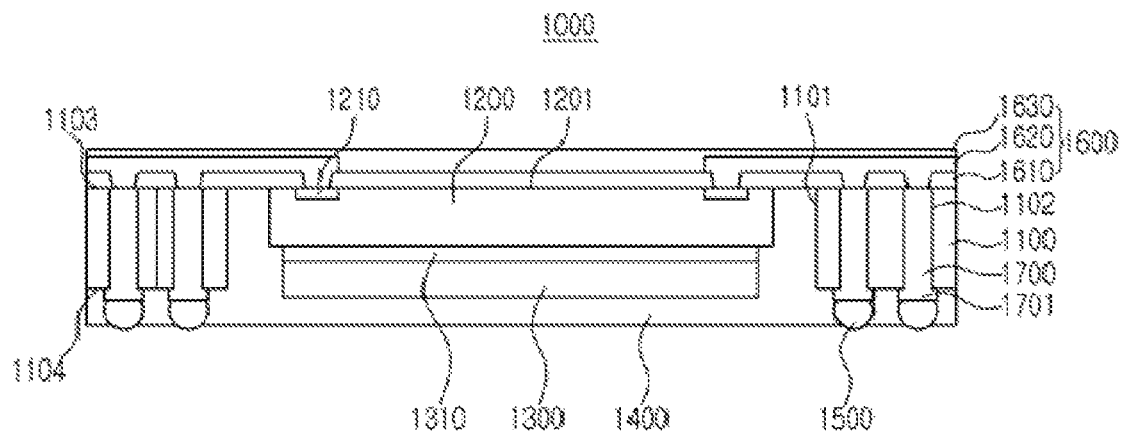
FIG. 1 is a cross-sectional view illustrating a chip package according to a first embodiment of the present inventive concept.

The present inventive concept may be modified in various forms and may have a variety of embodiments, and, therefore, specific embodiments will be illustrated in the drawings and a description thereof will be described in detail in the following description. The embodiments to be disclosed below, however, are not to be taken in a sense which limits the present inventive concept to specific embodiments and should be construed to include modifications, equivalents, or substitutes within the spirit and technical scope of the present inventive concept. In describing each drawing, a similar reference numeral is given to a similar component.

Unless otherwise defined, all terms including technical or scientific terms used herein have the same meaning as commonly understood by those skilled in the art to which the present inventive concept pertains. General terms that are defined in a dictionary shall be construed as having meanings that are consistent with the context of the relevant art and are not to be interpreted as having an idealistic or excessively formalistic meaning unless clearly defined in the present application.

Hereinafter, exemplary embodiments of the present inventive concept will be described in detail with reference to the accompanying drawings.

Embodiments

FIG. 1 is a cross-sectional view illustrating a chip package according to a first embodiment of the present inventive concept.

Figure 2:
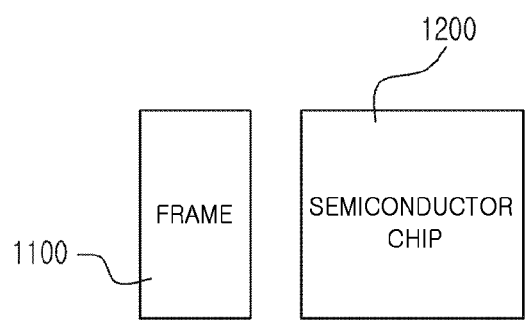
FIGS. 2 and 3 are diagrams illustrating another example of a frame arrangement according to the first embodiment of the present inventive concept.
Figure 3:
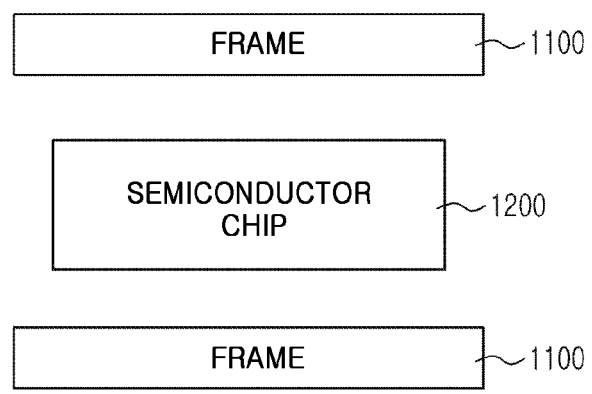

FIGS. 2 and 3 are diagrams illustrating another example of a frame arrangement according to the first embodiment of the present inventive concept.

Referring to FIGS. 1 to 3, a chip package 1000 according to the first embodiment of the present inventive concept includes a frame 1100, a chip 1200, a reinforcing layer 1300, a molding layer 1400, an external connection terminal 1500, and a re-wiring layer 1600.

The frame 1100 is preferably made of an insulating material or a semiconductor material. Further, the frame 1100 preferably has a thermal expansion coefficient similar to that of a carrier substrate 1110, which will be described below, or the molding layer 1400. Therefore, the frame 1100 may be made of an insulating ceramic or a ceramic semiconductor material. Various materials may be used as the insulating ceramic. A metal oxide, a metal nitride, soda-lime glass, or sapphire may be used as the insulating ceramic.

Further, a silicon material may be used as the ceramic semiconductor material. In addition to the silicon material, ZnO, GaN, GaAs, or the like may be used as the ceramic semiconductor material. However, a material of the frame 1100 may be variously selected according to a material of the carrier substrate 1110 or the molding layer 1400.

The frame 1100 includes a through-hole 1101 and a via hole 1102 formed around the through-hole 1101. When the frame 1100 is made of a semiconductor material, a separate insulating layer may be formed on an inner circumferential surface of the through-hole 1101. The insulating layer may be provided to block an electrical connection between the frame 1100 and the chip 1200, each of which are made of a semiconductor material. Further, when the frame 1100 is made of a semiconductor material, a separate insulating layer may also be formed on an inner circumferential surface of the via hole 1102.

The through-hole 1101 of the frame 1100 may be provided to pass through the frame 1100 and located at a central portion of the frame 1100. The through-hole 1101 may be provided to be larger than a width of the chip 1200 to accommodate the chip 1200. Further, a thickness of the frame 1100 may be greater than or equal to that of the chip 1200.

However, as shown in FIGS. 2 and 3, the frame 1100 may have a structure in which the frame 1100 is disposed on one side of the chip 1200 or disposed on both sides thereof according to embodiments. Therefore, a wiring layer 1620 connected to the via hole 1102 of the frame 1100 may be changed according to an arrangement of the frame 1100.

The via hole 1102 may be formed to pass through the frame 1100 and provided as a plurality of via holes 1102 along an outer edge of the chip 1200. Further, a via contact 1700 may be provided in the via hole 1102 to transmit an electrical signal in a vertical direction. The via contact 1700 may transmit an electrical signal transmitted from the re-wiring layer 1600 provided on a first surface 1103 of the frame 1100 to a second surface 104 which is a surface opposite to the first surface 1103 of the frame 1100. For example, the first surface 1103 of the via contact 1700 may be connected to the re-wiring layer 1600 and electrically connected to the chip 1200 through the wiring layer 1620, and the second surface 1104 may be electrically connected to an external connection terminal 1500 to be connected to an external substrate.

Further, the via contact 1700 may be a conductive material filling in the via hole 1102 or may be a metal layer applied on the via hole 1102. For example, the via contact 1700 may be provided in a cylindrical shape. Alternatively, the via contact 1700 may be provided in the form of a solder ball to pass through the via hole 1102 or may be solder resist ink filling in the via hole 1102.

The external connection terminal 1500, which is electrically connected to a top portion of the via contact 1700 and partially exposed by the molding layer 1400, may be further included on the second surface 1104 of the frame 1100. The external connection terminal 1500 may be electrically connected to the via contact 1700 to electrically connect the chip package to an external substrate or another semiconductor package. Further, surface treatment such as organic coating or metal plating may be performed on a surface of the external connection terminal 1500 to prevent the surface thereof from being oxidized. For example, the organic coating may be an organic solder preservation (OSP) coating, and the metal plating may be performed as gold (Au), nickel (Ni), lead (Pb), or silver (Ag) plating.

The chip 1200 is disposed in the through-holes 1101 of the frame 1100. One surface of the chip 1200 may be an active surface including an active area in which a circuit is formed. Meanwhile, a rear surface of the chip 1200 may be a non-active surface. Alternatively, both surfaces of the chip 1200 may be provided as active surfaces. A pad 1210 for exchanging a signal with the outside may be provided on the active surface of the chip 1200 as a plurality of pads 1210.

The pad 1210 may be formed of a conductive material film such as aluminum (Al). The pad 1210 may be integrally formed with the chip 1200.

The pad 1210 of the chip 1200 may be disposed to face the re-wiring layer 1600. Further, the active surface of the chip 1200 is preferably coplanar with the first surface 1103 of the frame 1100.

Further, when a package of the chip 1200 according to the present inventive concept is applied as a fingerprint sensor, a sensing portion 201 for detecting a fingerprint may be included on the active surface of the chip 1200. The sensing portion 1201 may be formed in various shapes. For example, the sensing portion 1201 may be formed using a conductor. The sensing portion 1201 may find a difference in capacitance due to a difference in height according to shapes of a peak and a valley of a fingerprint of a user's finger and generate a fingerprint image by scanning an image of the fingerprint. Accordingly, the active surface of the chip 1200 according to the present inventive concept may be formed in an open shape with respect to the upper re-wiring layer 1600, which will be described below, and the sensing portion 1201 may collect external information, for example, fingerprint information on the user's finger through the open active surface. Further, although the sensing portion 1201 of the chip 1200 in the present inventive concept is described as a fingerprint sensor, the chip 1200 may be applied as a chip 1200 for electromagnetic sensing, optical sensing, or medical sensing in addition to the fingerprint sensor.

A thickness of the chip 1200 may be equal to or different from that of the frame 1100. However, it is preferable for the chip 1200 to have a thickness that is smaller than that of the frame 1100 in consideration of the reinforcing layer 1300, which will be described below, stacked on the chip 1200.

The reinforcing layer 1300 may be formed on the chip 1200. The reinforcing layer 1300 may be formed on the chip 1200 and stacked on the chip 1200 using an adhesive layer between the chip 1200 and the reinforcing layer 1300. That is, the reinforcing layer 1300 may be stacked on a non-active surface of the chip 1200 using an adhesive layer 1310.

Figure 4:
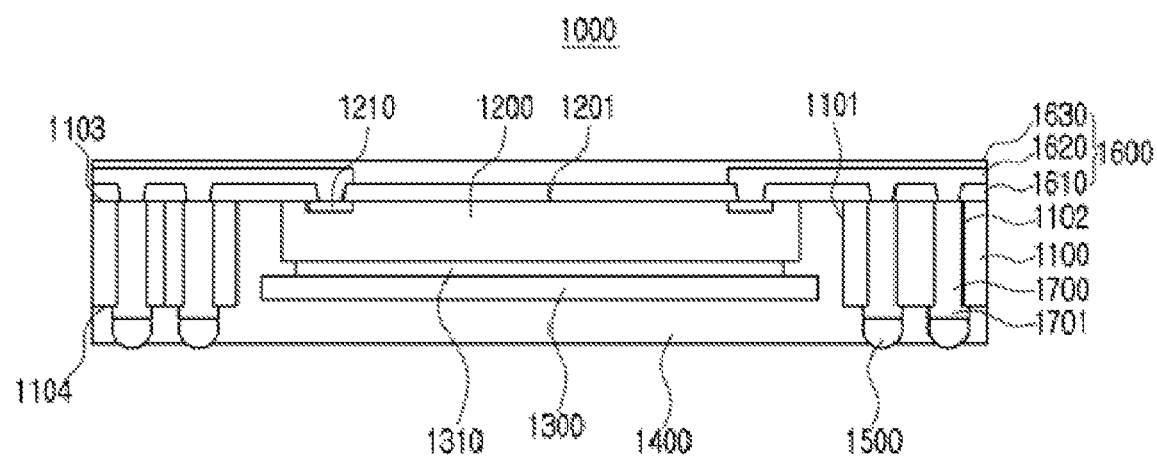
FIGS. 4 to 6 are diagrams illustrating another example of a reinforcing layer according to the present inventive concept.
Figure 5:
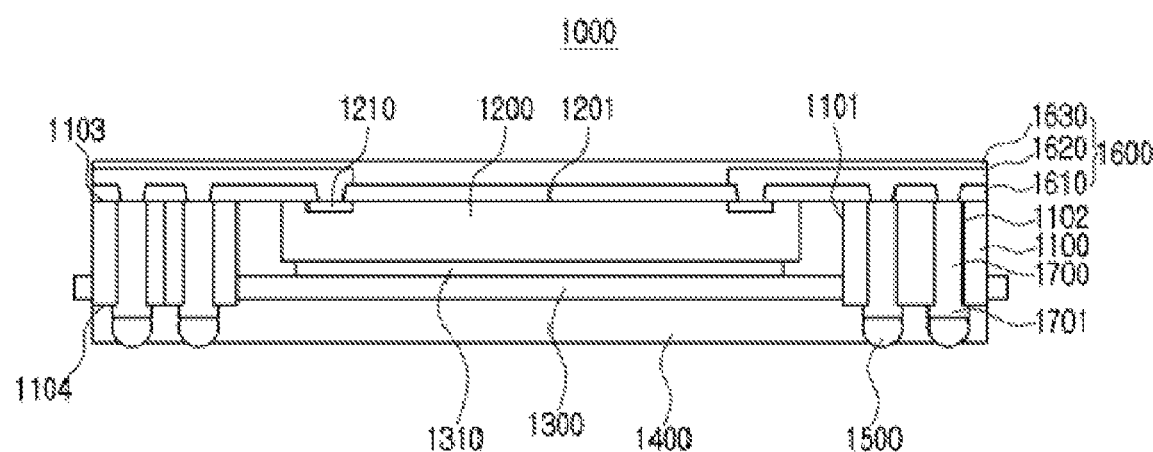
Figure 6:
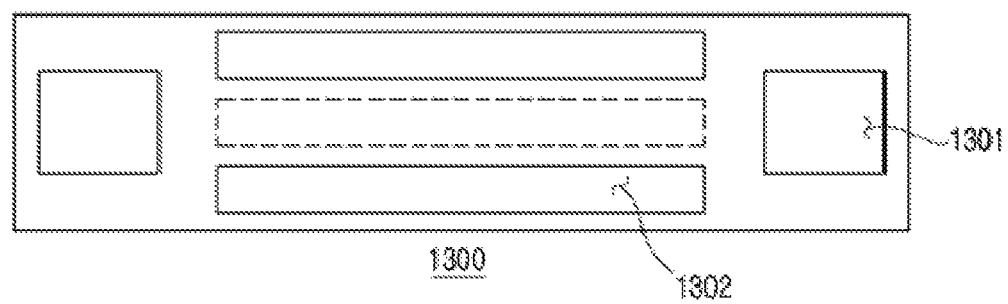

FIGS. 4 to 6 are diagrams illustrating another example of a reinforcing layer according to the present inventive concept.

FIGS. 4 to 6 illustrate another example of the reinforcing layer 1300 according to the present inventive concept. A width of the reinforcing layer 1300 may be less than or equal to that of the chip 1200. Further, as still another example shown in FIGS. 4 and 5, the reinforcing layer 1300 has a width that is larger than that of the chip 1200 and may have a width that is smaller than that of the frame 1100 or have a width that is larger than an entire width of the frame 1100 so as to surround the frame 1100. As shown in FIG. 6, when the reinforcing layer 1300 has a width that is larger than that of the frame 1100, an insertion hole 1301 for the frame 1100 thereinto by passing therethrough may be included on both sides of the reinforcing layer 1300 so as to prevent the frame 1100 from interfering with the reinforcing layer 1300 when the reinforcing layer 1300 formed in a plate shape is bonded to the chip 1200. In addition, an injection hole 1302 may be included so as to inject the molding layer 1400 into the package to form the molding layer 1400 after the reinforcing layer 1300 is inserted into the frame 1100.

The reinforcing layer 1300 may include at least one among a metal, a metal alloy, and a ceramic material. For example, the reinforcing layer 1300 may be stainless steel (SUS), Ag, copper (Cu), Au, Al, tungsten (W), platinum (Pt), chromium (Cr), and an alloy thereof. Preferably, the reinforcing layer 1300 may be formed of SUS or Cu. Alternatively, the reinforcing layer 1300 may include a material having improved rigidity, such as epoxy or urethane. That is, since the reinforcing layer 1300 is stacked on the chip 1200, when the molding layer 1400 is encapsulated and thermally cured, bending of the chip 1200 may be corrected and a wafer may be kept flat after a molding process such that there is an effect which is capable of improving durability of the package.

Accordingly, since the reinforcing layer 1300 according to the present inventive concept may serve to reinforce the chip 1200 and allow the chip 1200 to undergo almost all processes in a state of being reinforced, the reinforcing layer 1300 may be suitable for implementing thinness of a wafer level package and prevent a crack of the chip 1200 which occurs conventionally.

The molding layer 1400 may integrally mold the chip 1200 and the frame 1100 which are disposed in the through-hole 1101. That is, the molding layer 1400 may be formed to cover a side surface of the chip 1200 and the reinforcing layer 1300 stacked on the chip 1200 and formed to cover the frame 1100 and the external connection terminal 1500 formed on the second surface 1104 of the frame 1100. In this case, the molding layer 1400 may be provided to expose an end portion of the external connection terminal 1500. That is, the molding layer 1400 may be provided to cover the frame 1100 and the reinforcing layer 1300 to not be exposed to the outside and provided to expose the end portion of the external connection terminal 1500 and have a height that is lower than that of the end portion of the external connection terminal 1500.

The molding layer 1400 may include a conventional epoxy molding compound (EMC) material and the EMC material may be supplied in a liquid phase or a powder phase. When the EMC material is supplied in a liquid phase, the EMC material is formed into the molding layer 1400 through volatilization of a solvent. Further, the molding layer 1400 may include an insulating polymer as a main component and may further include silica particles and the like.

The re-wiring layer 1600 may be provided to electrically connect the pad 1210 of the chip 1200 to one side of the via contact 1700. For example, the re-wiring layer 1600 may include a first insulating layer 1610, the wiring layer 1620, and a second insulating layer 1630. The first insulating layer 1610 and the second insulating layer 1630 are formed of an insulating material and provided to insulate the wiring layer 1620.

The first insulating layer 1610 may be formed to be stacked on the active surface of the chip 1200, the molding layer 1400, and the first surface 1103 of the frame 1100. Further, the first insulating layer 1610 may expose the pad 1210 of the chip 1200 and the via contact 1700 such that the wiring layer 1620 stacked on the first insulating layer 1610 may be connected to the pad 1210 and the via contact 1700.

The wiring layer 1620 includes a conductive material and may be stacked on the first insulating layer 1610 through a relocation process. However, when the chip 1200 of the chip package according to the present inventive concept performs a function of a fingerprint sensor, it is preferable that the wiring layer 1620 is formed to open the active surface of the chip 1200 so that the sensing portion 1201 of the chip 1200 has an open form.

The wiring layer 1620 may include a metal as a conductive material, for example, Cu, a Cu alloy, Al, or an Al alloy.

The second insulating layer 1630 may be formed to be stacked on the first insulating layer 1610 and the wiring layer 1620 to insulate the wiring layer 1620 from the outside.

However, in the drawing, the second insulating layer 1630 has been shown as encapsulating the wiring layer 1620. Alternatively, the second insulating layer 1630 may be provided to expose a portion of the wiring layer 1620, and an additional wiring line is formed through the exposed portion of the wiring layer 1620 so that the wiring layer 1620 may be electrically connected to the outside (a main substrate, the chip, or the package). That is, a package on package (POP) structure in which a package is stacked on a package or a system in package (SIP) structure may be achieved. Alternatively, a plurality of chips may be disposed close to each other or in contact with each other in a width direction.

Although only the re-wiring layer 1600 formed on the chip 1200 has been shown in the above embodiment, in some embodiments, a lower re-wiring layer may be formed to electrically connect the external connection terminal 1500 to a surface opposite to the molding layer 1400 on which the re-wiring layer 1600 is formed.

FIGS. 7 to 16 are cross-sectional views for describing a manufacturing method of the chip package shown in FIGS. 1 and 3 according to the first embodiment of the present inventive concept.

Referring to FIGS. 7 to 16, a manufacturing method of the chip package 1000 according to the first embodiment of the present inventive concept includes providing the frame 1100 having the through-hole 1101 and the via hole 1102 formed around the through-hole 1101, arranging the frame 1100 on the carrier substrate 1110 and arranging the chip 1200 in the through-hole 1101 such that the pad 1210 formed on the active surface of the chip 1200 faces the carrier substrate 1110, forming the reinforcing layer 1300 on the non-active surface of the chip 1200, covering the frame 1100 and the chip 1200 with the molding layer 1400, and forming the re-wiring layer 1600 on the pad 1210 of the chip 1200 and electrically connecting the re-wiring layer 1600 to the via contact 1700.

Figure 7:
FIGS. 7 to 16 are cross-sectional views for describing a manufacturing method of the chip package shown in FIGS. 1 and 3 according to the first embodiment of the present inventive concept.

FIG. 7 illustrates the provision of the frame 1100 having the through-hole 1101 and the via hole 1102. That is, the through-hole 1101 may be formed at a center of the frame 1100, and a plurality of via holes 1102 may be formed around the through-hole 1101 formed at the center. In FIG. 4, the via holes 1102 formed around one through-hole 1101 have been shown as being formed on only left and right sides of the through-hole 1101. However, the via holes 1102 may be formed at various positions around the through-hole 1101.

When the frame 1100 includes a semiconductor material, an insulating layer of oxide or nitride may be applied on a surface of the frame 1100. Therefore, the insulating layer may be applied on an inner circumferential surface of the through-hole 1101 and an inner circumferential surface of the via hole 1102 which are formed in the frame 1100.

Figure 8:
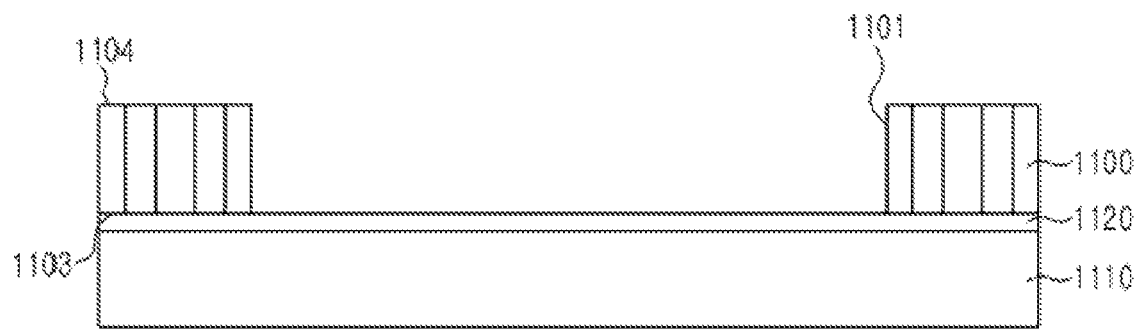
Figure 9:
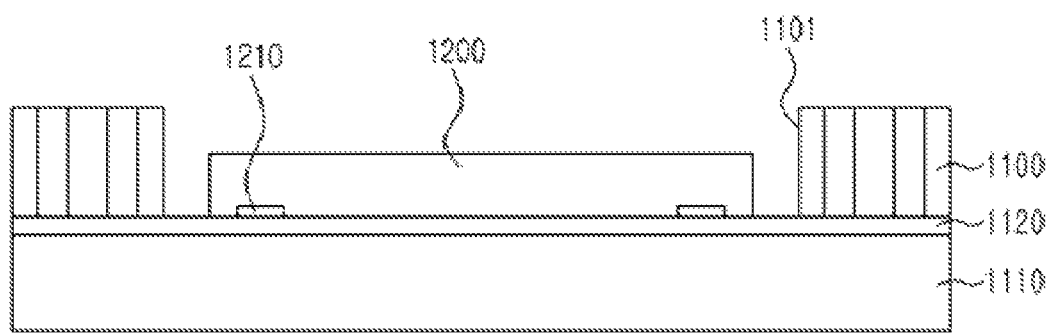

FIGS. 8 and 9 illustrate the arranging of the frame 1100 and the chip 1200 on the carrier substrate 1110. As shown in FIG. 8, an adhesive portion 1120 is formed on the carrier substrate 1110, and the frame 1100 is disposed on the adhesive portion 1120. In this case, the first surface 1103 of the frame 1100 is disposed to face the carrier substrate 1110, and a surface of the carrier substrate 1110 is exposed through the through-hole 1101 and the via hole 1102.

The carrier substrate 1110 may be provided to support the frame 1100 and the chip 1200 and made of a material having considerable rigidity and low thermal deformation. The carrier substrate 1110 may be made of a rigid type material. For example, the carrier substrate 1110 may employ a material such as a mold molding or a molimide tape.

The adhesive portion 1120 may employ a double-sided adhesive film, one surface of the adhesive portion 1120 may be bonded and fixed to the carrier substrate 1110, and the frame 1100 may be bonded to the other surface of the adhesive portion 1120.

As shown in FIG. 9, when the frame 1100 is disposed on the carrier substrate 1110, the chip 1200 is disposed on the carrier substrate 1110. More specifically, the chip 1200 may be disposed in the through-hole 1101 located at the center of the frame 1100, and both side surfaces of the chip 1200 may be disposed to be spaced apart from the frame 1100. Further, the active surface of the chip 1200 may be disposed to face the carrier substrate 1110.

Figure 10:
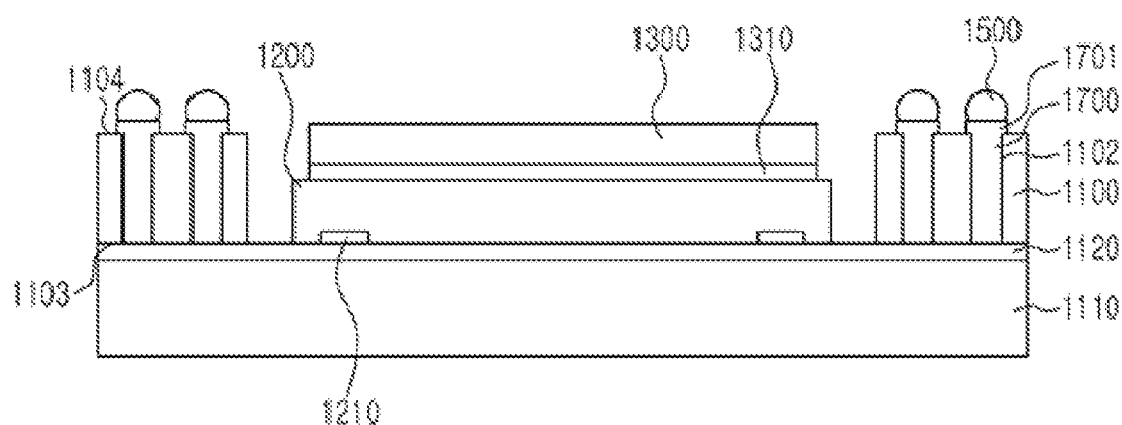

FIG. 10 illustrates the formation of the reinforcing layer 1300 on the chip 1200. As shown in FIG. 10, the reinforcing layer 1300 may be formed on the chip 1200. The reinforcing layer 1300 may be formed on the chip 1200 and stacked on the chip 1200 using the adhesive layer 1310 between the chip 1200 and the reinforcing layer 1300. That is, the reinforcing layer 1300 may be stacked on the non-active surface of the chip 1200 using the adhesive layer 1310.

The reinforcing layer 1300 may include at least one among a metal, a metal alloy, and a ceramic material. For example, the reinforcing layer 1300 may be SUS, Ag, Cu, Au, Al, W, Pt, Cr, and an alloy thereof. Preferably, the reinforcing layer 1300 may be formed of SUS or Cu. Alternatively, the reinforcing layer 1300 may include a material having improved rigidity, such as epoxy or urethane. When the reinforcing layer 1300 is formed of epoxy or urethane, the reinforcing layer 1300 may be formed on the chip 1200 through a deposition process or an application process.

That is, since the reinforcing layer 1300 is stacked on the chip 1200, when the molding layer 1400 encapsulates and thermally cured, bending of the chip 1200 may be corrected and a wafer may be kept flat after a molding process such that there is an effect which is capable of improving durability of the package.

Accordingly, since the reinforcing layer 1300 according to the present inventive concept may serve to reinforce the chip 1200 and allow the chip 1200 to undergo almost all processes in a state of being reinforced, the reinforcing layer 1300 may be suitable for implementing thinness of a wafer level package and prevent a crack of the chip 1200 which occurs conventionally.

Further, although the reinforcing layer 1300 has been described as being stacked on the chip 1200 after the chip 1200 is stacked on the carrier substrate 1110, the reinforcing layer 1300 may be bonded to a rear surface of the chip 1200 of a wafer level in a wafer level operation of the chip 1200 and then stacked on the carrier substrate 1110 in the form in which the reinforcing layer 1300 is stacked on the chip 1200 using a sawing process.

Subsequently, the via contact 1700 may be provided in the frame 1100. That is, the via contact 1700 may fill in the via hole 1102 to electrically connect both surfaces of the frame 1100. Further, a connection pad 1701 connected to the via contact 1700 may be provided on the second surface 1104 of the frame 1100 on which the via contact 1700 is formed, and the connection pad 1701 may be a signal lead. The via contact 1700 and the connection pad 1701 may be formed in one process.

Further, the external connection terminal 1500 may be formed on a top surface of the via contact 1700. The external connection terminal 1500 is bonded to one surface of the via contact 1700 to electrically connect the chip package to the outside. The outside may be a circuit board or another semiconductor package.

Meanwhile, although a solder ball is illustrated as an example of the external connection terminal 1500, the external connection terminal 1500 may include a solder bump.

Figure 11:
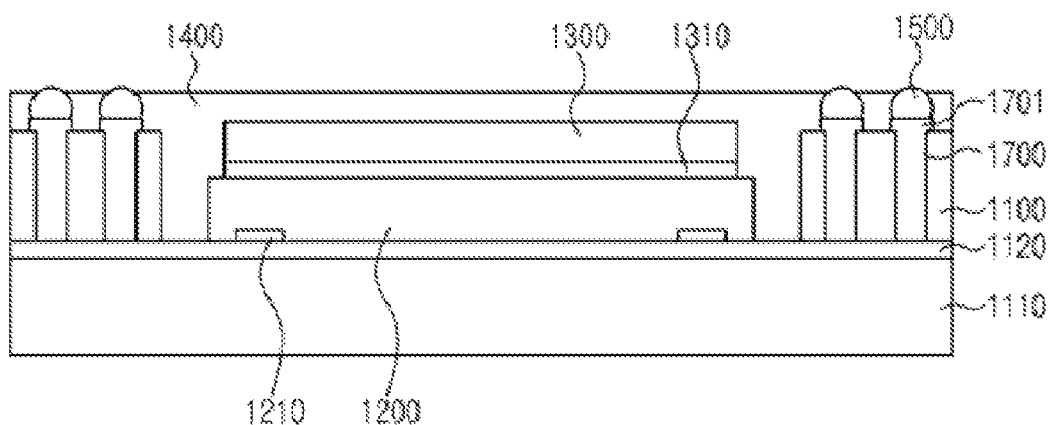

FIG. 11 illustrates the covering of the frame 1100 and the chip 1200 with the molding layer 1400. The molding layer 1400 may be injected between the carrier substrate 1110 and an upper mold (not shown) in a state of having flowability to be provided on the carrier substrate 1110. The molding layer 1400 may be pressed by the upper mold in in a high temperature state and then cured.

The molding layer 1400 is poured into a mold and molded to cover the frame 1100, the chip 1200, and the reinforcing layer 1300. With the passage of time, the molding layer 1400 is cured and, during this process, the frame 1100, the chip 1200, and the reinforcing layer 1300 are integrated.

A method of encapsulating the molding layer 1400 has been described as that the molding layer 1400 is injected in a state of having flowability. Alternatively, a method of applying or printing the molding layer 1400 may be used. Further, various techniques conventionally used in the art may be used as a molding method of the molding layer 1400.

The molding layer 1400 may be formed to expose the end portion of the external connection terminal 1500. In the process of molding the molding layer 1400, a thickness of the molding layer 1400 may be controlled to expose the external connection terminal 1500. In order to control the thickness of the molding layer 1400, a masking member (not shown) may be in contact with an exposed portion of the external connection terminal 1500. The masking member may be a film for preventing bonding between the upper mold (not shown) and the molding layer 1400. For example, the masking member may be a release film. Further, the masking member includes a member which is separately inserted below the upper mold.

The masking member may have stretchability. Thus, the masking member may accommodate the exposed portion of the external connection terminal 1500. Thus, when the molding layer 1400 fills between the carrier substrate 1110 and the masking member, the exposed portion of the external connection terminal 1500 may not be encapsulated by the molding layer 1400. Further, as another example for exposing the external connection terminal 1500, after the molding, the exposed portion of the external connection terminal 1500 may be exposed by performing a grinding process or a sand blasting process on an upper portion of the molding layer 1400 to expose the external connection terminal 1500.

In the first embodiment 1000 of the present inventive concept, the external connection terminal 1500 has been described as being formed before the molding layer 1400 is covered. Alternatively, it is also possible to form the external connection terminal 1500 on the top surface of the via contact 1700 after the molding layer 1400 is formed.

Figure 12:
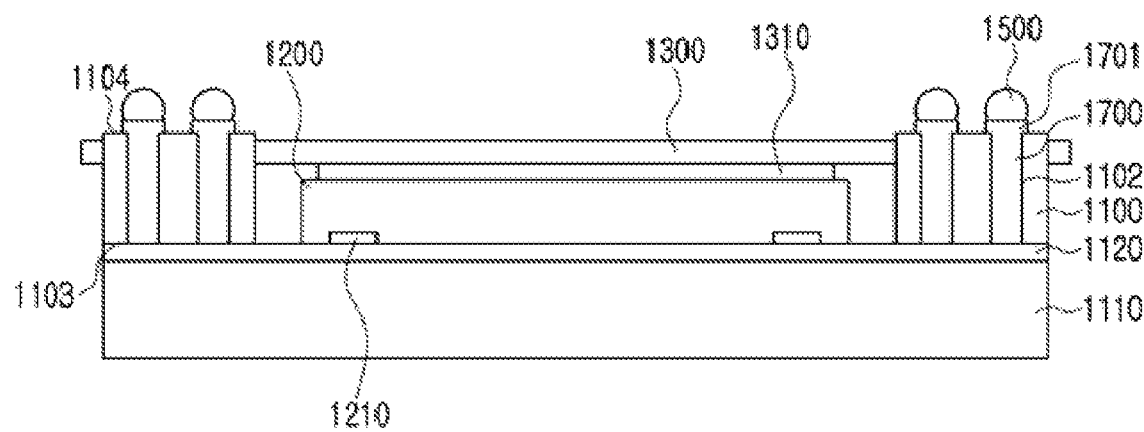
Figure 13:
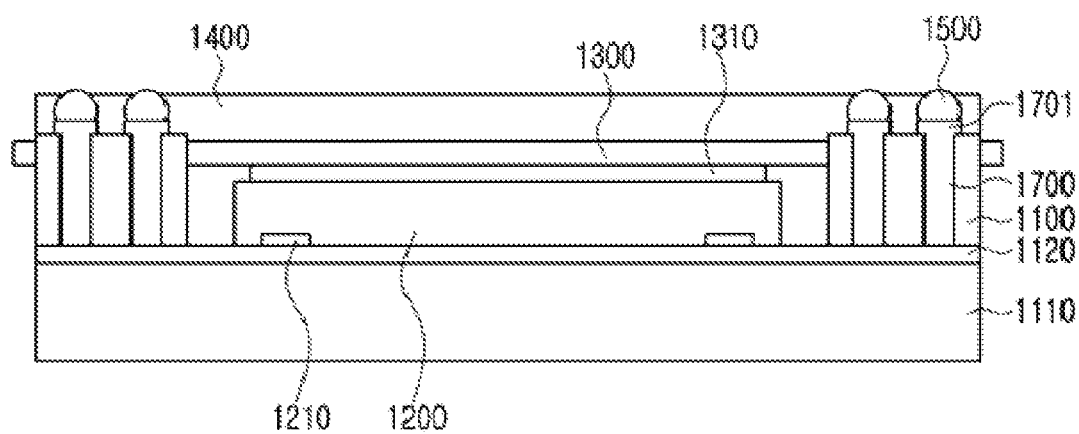

FIGS. 12 and 13 are diagrams for describing a manufacturing method of a reinforcing layer according to another example shown in FIG. 3.

As shown in FIG. 12, a reinforcing layer formed in a plate shape may be formed on the adhesive layer 1310. In this case, since the frame is inserted into the insertion hole formed in the reinforcing layer to be mounted therein, the reinforcing layer may be stacked on the adhesive layer and bonded to the chip. Further, as shown in FIG. 13, the molding layer 1400 is poured into a mold and molded to cover the frame 1100, the chip 1200, and the reinforcing layer 1300. In this case, since the molding layer may be injected below the reinforcing layer through the injection hole formed on the reinforcing layer, the molding layer may be molded to cover the chip disposed below the reinforcing layer.

Figure 14:
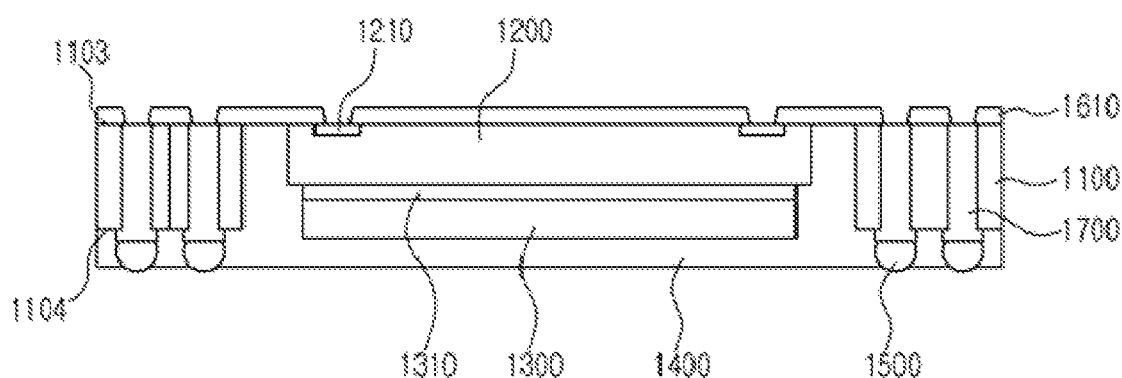
Figure 15:
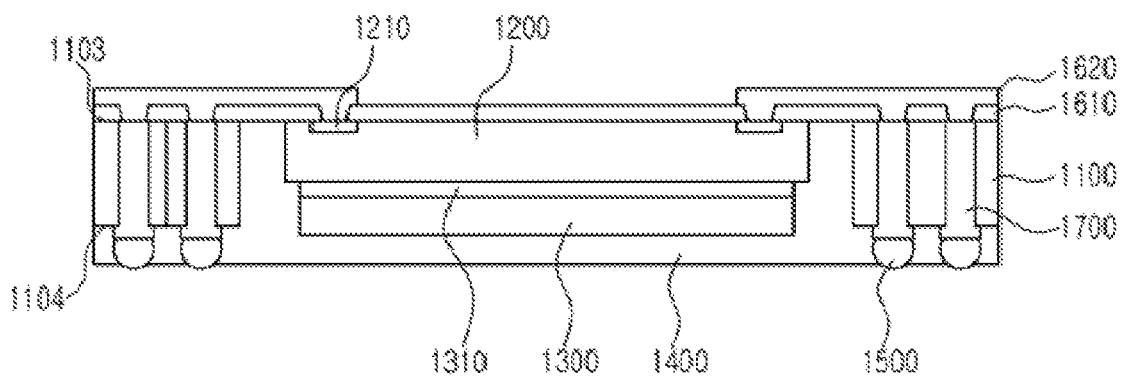
Figure 16:
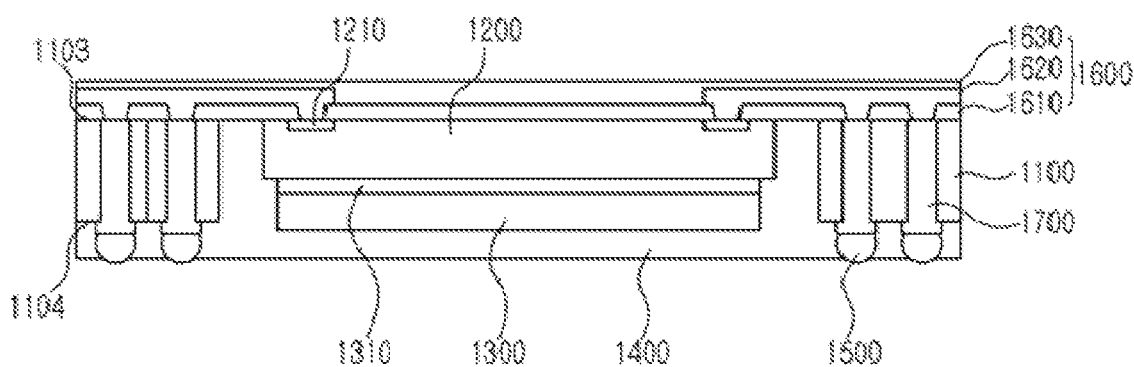

FIGS. 14 to 16 illustrate a process in which the carrier substrate 1110 is removed and the re-wiring layer 1600 is formed on the active surface of the chip 1200 and the first surface 1103 of the frame 1100.

First, the frame 1100 on which the molding layer 1400 is formed is separated from the carrier substrate 1110. The pad 1210 of the chip 1200 and the first surface 1103 of the frame 1100 are exposed through the separation from the carrier substrate 1110. Further, the re-wiring layer 1600 is formed on the pad 1210 of the chip 1200 and the first surface 1103 of the frame 1100. The re-wiring layer 1600 may include a first insulating layer 1610, a wiring layer 1620, and a second insulating layer 1630.

The first insulating layer 1610 may be stacked to cover the chip 1200, the frame 1100, and the molding layer 1400. In this case, the first insulating layer 1610 may be formed to expose the via contact 1700 and the pad 1210 of the chip 1200. A process of removing a portion of the first insulating layer 1610 may employ an etching process or a laser removal process. The first insulating layer 1610 may include an insulator, for example, an oxide, a nitride, an EMC, or the like.

After the first insulating layer 1610 is formed, the wiring layer 1620 may be formed. The wiring layer 1620 may be stacked on the first insulating layer 1610 and may form a re-wiring pattern for electrically connecting the pad 1210 of the chip 1200 to the via contact 1700. The wiring layer 1620 may fill an open portion of the first insulating layer 1610 and, during this process, the wiring layer 1620 may be connected to the pad 1210 and the via contact 1700 of the chip 1200. However, when the chip 1200 of the chip package 1000 according to the first embodiment of the present inventive concept performs a function of a fingerprint sensor, it is preferable that the wiring layer 1620 is formed to open the active surface of the chip 1200 so that the sensing portion 201 of the chip 1200 has an open form. The wiring layer 1620 may include a metal as a conductive material, for example, Cu, a Cu alloy, Al, or an Al alloy.

After the wiring layer 1620 is formed, the second insulating layer 1630 may be formed. The second insulating layer 1630 may be stacked on the exposed surfaces of the first insulating layer 1610 and the wiring layer 1620. In the drawings, the second insulating layer 1630 has been shown as covering the wiring layer 1620 so as to not be exposed to the outside. Alternatively, a portion of the second insulating layer 1630 may be removed to expose the wiring layer 1620 to the outside. In this case, the exposed wiring layer 1620 may be used as a path which is capable of electrically connecting to the outside. The second insulating layer 1630 may include an insulator, for example, an oxide, a nitride, an EMC, or the like.

Through the above-described process, the chip 1200 is mounted in the through-hole 1101 of the frame 1100, and the reinforcing layer 1300 is stacked on the chip 1200. Further, after the via contact 1700 is formed in the via hole 1102, the frame 1100 and the chip 1200 on which the reinforcing layer 1300 is stacked are integrated by the molding layer 1400. When the molding layer 1400 is formed, the re-wiring layer 1600 is formed on the active surface of the chip 1200 and the first surface 1103 of the frame 1100.

Figure 17:
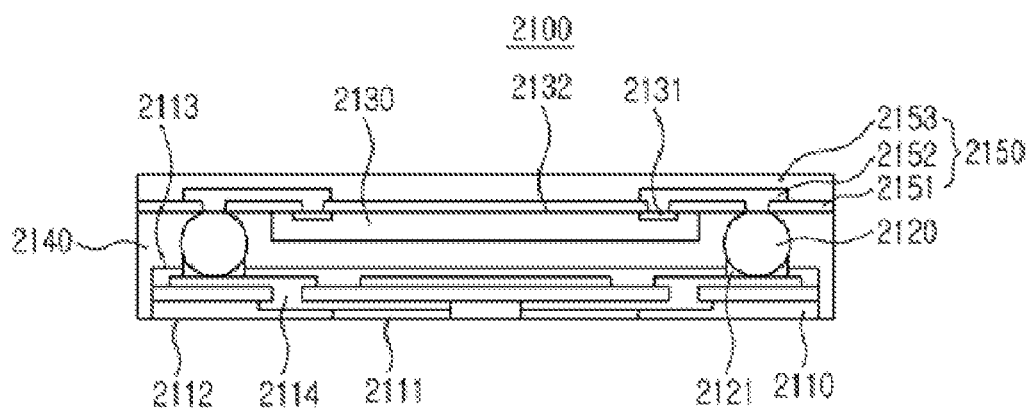
FIG. 17 is a cross-sectional view illustrating a chip package according to a second embodiment of the present inventive concept.

FIG. 17 is a cross-sectional view illustrating a chip package according to a second embodiment of the present inventive concept.

Referring to FIG. 17, a chip package 2100 according to a second embodiment of the present inventive concept includes a base substrate 2110, a solder ball 2120, a chip 2130, a molding layer 2140, and a re-wiring layer 2150.

The base substrate 2110 may be formed in a flat plate shape. Further, a top surface and a bottom surface of the base substrate 2110 may be in the form of a rectangular shape, but the present inventive concept is not limited thereto. The base substrate 2110 includes a first surface 2112 on which a metal pad 2111 is formed and a second surface 2113 opposite the first surface 2112. The metal pad 2111 formed on the first surface 2112 may be used to input or output signals or to supply power. The metal pad 2111 may be formed of a material such as electronic nickel immersion gold (ENIG) so as to prevent corrosion of a contact portion and to improve contact performance.

A solder ball 2120, which will be described below, may be formed on the second surface 2113 of the base substrate 2110. The solder ball 2120 may be electrically connected to the metal pad 2111 formed on the first surface 2112 through an internal wiring 2114 in the base substrate 2110.

The base substrate 2110 may be a printed circuit board (PCB) or flexible printed circuit board (FPCB) on which a circuit is printed. Preferably, the base substrate 2110 may be a single-sided PCB. Further, the PCB may include a thin film, glass, or a tape. As described above, since the single-sided PCB is used as the base substrate 2110, a thickness of the package may be reduced so that an ultra-thin package may be implemented.

The solder ball 2120 may be fused to the second surface 2113 of the base substrate 2110. Further, in order to fuse the solder ball 2120 to the base substrate 2110, a solder ball pad 2121 may be formed on the internal wiring 2114 exposed on the second surface 2113 of the base substrate 2110. That is, the solder ball 2120 may be fused above the base substrate 2110 due to the solder ball pad 2121. The solder ball 2120 serves to electrically connect the re-wiring layer 2150, which will be described below, to the base substrate 2110.

The chip 2130 may be disposed between the solder balls 2120 formed on the base substrate 2110.

One surface of the chip 2130 may be an active surface including an active area in which a circuit is formed. Meanwhile, a rear surface of the chip 2130 opposite the active surface thereof may be a non-active surface. Alternatively, both surfaces of the chip 2130 may be provided as active surfaces. A pad 2131 for exchanging a signal with the outside may be provided on the active surface of the chip 2130 as a plurality of pads 2131. The pad 2131 may be formed of a conductive material film such as Al. The pad 2131 may be integrally formed with the chip 2130.

The active surface on which the pad 2131 of the chip 2130 is formed may be disposed to face the re-wiring layer 2150. That is, the non-active surface of the chip 2130 may be disposed opposite to the base substrate 2110.

The chip 2130 may have a thickness that is smaller than that of the solder ball 2120 formed on the base substrate 2110. For example, when a height of the solder ball 2120 is 1, the thickness of the chip 2130 with respect to a height of the solder ball 2120 is preferably within 0.8. More preferably, the thickness of the chip 2130 with respect to the height of the solder ball 2120 is preferably within 0.5. When the thickness of the chip 2130 with respect to the height of the solder ball 2120 is greater than or equal to 0.8 and the base substrate 2110 is stacked on the chip 2130, interference may occur between the base substrate 2110 and the chip 2130.

Further, the solder balls 2120 may be disposed around the chip 2130.

Figure 18:
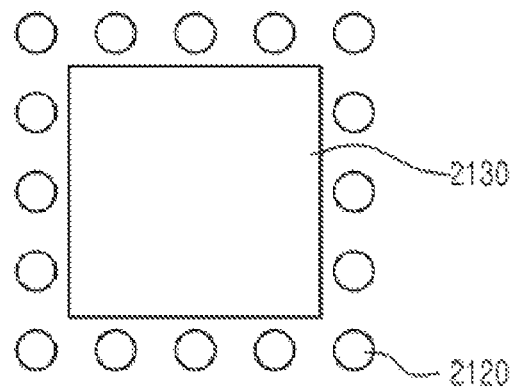
FIGS. 18 to 20 are diagrams illustrating an arrangement of solder balls around a chip of the chip package of the present inventive concept.
Figure 19:
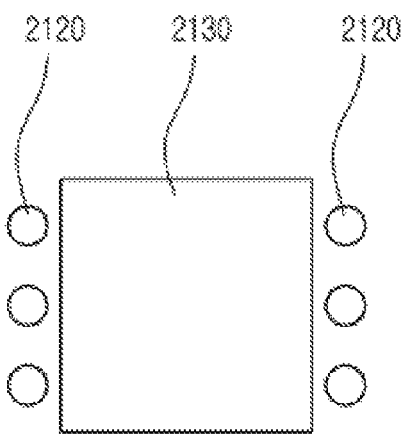
Figure 20:
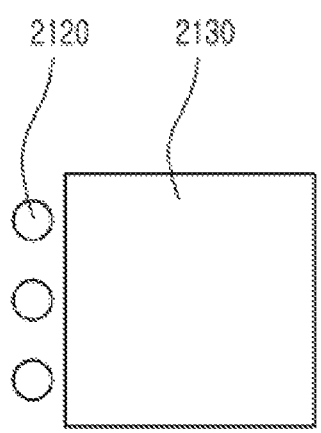

FIGS. 18 to 20 are diagrams illustrating an arrangement of solder balls around a chip of the chip package of the present inventive concept.

Referring to FIGS. 18 to 20, the solder ball 2120 may be disposed to surround a periphery of the chip 2130 as shown in FIG. 18, or the solder ball 2120 may be disposed at one side or both sides of the chip 2130 as shown in FIGS. 19 and 20. As described above, according to the arrangement of the solder balls 2120 around the chip 2130, a structure of the re-wiring layer 2150 electrically connecting the pad 2131 of the chip 2130 to the solder ball 2120 may also be changed to match the arrangement of the solder balls 2120.

The molding layer 2140 may be formed on a side surface and the non-active surfaces of the chip 2130. Further, the molding layer 2140 may be formed to surround the solder ball 2120 and the second surface 2113 and a side surface of the base substrate 2110. That is, all of an upper portion and the side surfaces of the base substrate 2110 may be filled with the molding layer 2140 except for the first surface 2112 on which the metal pad 2111 is formed. The molding layer 2140 may be formed of a conventional EMC or encapsulant material, and the EMC or encapsulant material may be supplied in a liquid phase or a powder phase. When the EMC or encapsulant material is supplied in a liquid phase, the EMC or encapsulant material is formed into the molding layer 2140 through volatilization of a solvent.

The re-wiring layer 2150 may be provided to electrically connect the pad 2131 of the chip 2130 to an upper portion of the solder ball 2120. For example, the re-wiring layer 2150 may include a first insulating layer 2151, a wiring layer 2152, and a second insulating layer 2153. The first insulating layer 2151 and the second insulating layer 2153 are formed of an insulating material and provided to insulate the wiring layer 2152.

The first insulating layer 2151 may be formed to be stacked on the active surface of the chip 2130, the molding layer 2140, and one side of the solder ball 2120. Further, the first insulating layer 2151 may expose the pad 2131 of the chip 2130 and the upper portion of the solder ball 2120 such that the wiring layer 2152 stacked on the first insulating layer 2151 may be connected to the pad 2131 and the solder ball 2120.

The wiring layer 2152 includes a conductive material and may be stacked on the first insulating layer 2151 through a relocation process. However, when the chip 2130 of the chip package according to the present inventive concept performs a function of a fingerprint sensor, like the first embodiment 1000, it is preferable that the wiring layer 2152 is formed to open the active surface of the chip 2130 so that a sensing portion 2132 of the chip 2130 has an open form.

The second insulating layer 2153 may be formed to be stacked on the first insulating layer 2151 and the wiring layer 2152 to insulate the wiring layer 2152 from the outside. However, as in the first embodiment 1000, in the drawing, the second insulating layer 2153 has been shown as encapsulating the wiring layer 2152. In some embodiments, the second insulating layer 2153 may be provided to expose a portion of the wiring layer 2152, and an additional wiring line is formed through the exposed portion of the wiring layer 2152 so that the wiring layer 2152 may be electrically connected to the outside (a main substrate, the chip, or the package). That is, a POP structure in which a package is stacked on a package or a SIP structure may be achieved.

Alternatively, a plurality of chips may be disposed adjacent to each other or in contact with each other in a width direction.

Figure 21:
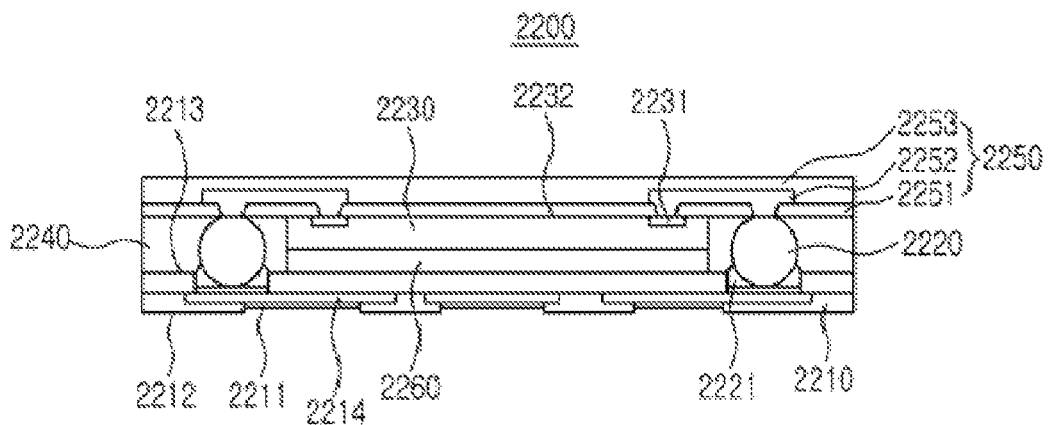
FIG. 21 is a cross-sectional view illustrating a chip package according to a third embodiment of the present inventive concept.

FIG. 21 is a cross-sectional view illustrating a chip package according to a third embodiment of the present inventive concept.

Referring to FIG. 21, as in the second embodiment 2100, a chip package 2200 according to a third embodiment of the present inventive concept may include a base substrate 2210, a solder ball 2220, a chip 2230, a molding layer 2240, and a re-wiring layer 2250.

However, in the chip 2230 of the second embodiment 2100, an adhesive layer 260 may be formed on a non-active surface of the chip 2230. That is, unlike the chip 2130 in the second embodiment 2100, the chip 2230 in the third embodiment 2200 may be bonded to the base substrate 2210 by an adhesive layer 2260 formed on the non-active surface of the chip 2230.

For example, the adhesive layer 2260 may bond the base substrate 2210 to the chip 2130 in the form of a film. Alternatively, the adhesive layer 2260 may be applied on the base substrate 2210 in the form of a resin and then may bond the chip 2230 to the base substrate 2210.

As described above, since the chip 2230 may be bonded and fixed to the base substrate 2210 by the adhesive layer 2260, the chip package 2200 in the third embodiment may improve the strength of the package more than that of the structure of the chip package 2100 in the second embodiment 2100.

Further, the molding layer 2240 fills to cover the solder ball 2220 and the chip 2230 on the base substrate 2210. Unlike the molding layer filling the side surface of the base substrate 2110 and between the chip 2130 and the second surface 2113 of the base substrate 2110 in the second embodiment 2100, the molding layer 2240 in the third embodiment 2200 may fill a side surface of the chip 2230. That is, since the non-active surface of the chip 2230 is bonded to the base substrate 2210 by the adhesive layer 2260, the molding layer 2240 may be formed to surround the side surface of the chip 2230 and the solder ball 2220. Thus, the side surface of the base substrate 2210 and a first surface 2212 may be exposed by the molding layer 2240.

In addition to the above description, the solder ball 2220 formed on a second surface 2213 of the base substrate 2210 and the re-wiring layer 2250 formed on the active surface of the chip 2230 have the same structure as the second embodiment 2100.

FIGS. 22 to 32 are cross-sectional views for describing a manufacturing method of the chip package according to the second embodiment of the present inventive concept.

Referring to FIGS. 22 to 32, a manufacturing method of the chip package 2100 according to the second embodiment of the present inventive concept includes providing the base substrate 2110 having the first surface 2112 on which the metal pad 2111 is formed and the second surface 2113 opposite to the first surface 2112, forming the solder ball 2120 on the second surface 2113 of the base substrate 2110, cutting the base substrate 2110 on which the solder ball 2120 is formed, stacking the cut base substrate 2110 and the chip 2130 on a carrier substrate 2101, covering the chip 2130 and the solder ball 2120 with the molding layer 2140, and forming the re-wiring layer 2150 formed on the active surface of the chip 2130 and configured to electrically connect the pad 2131 of the chip 2130 to the solder ball 2120.

Figure 22:
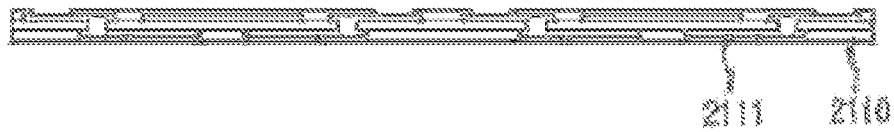
FIGS. 22 to 32 are cross-sectional views for describing a manufacturing method of the chip package according to the second embodiment of the present inventive concept.
Figure 23:
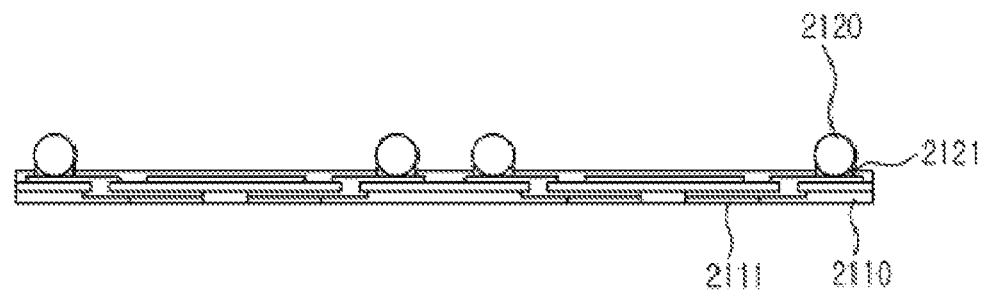
Figure 24:
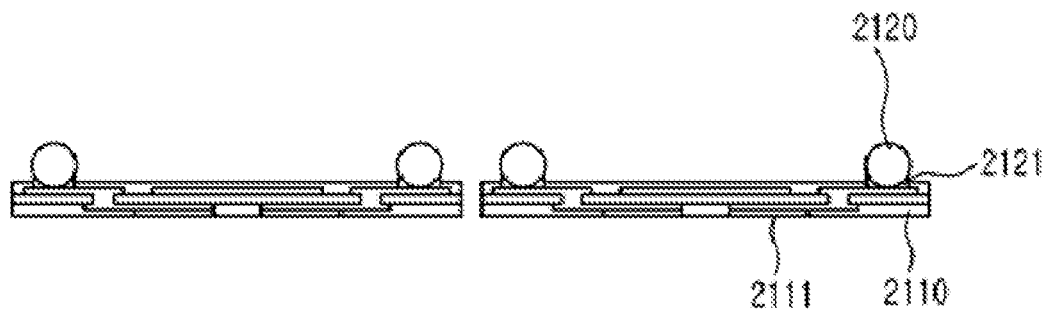

FIGS. 22 and 24 illustrate the formation of the solder ball 2120 on the second surface 2113. That is, as shown in FIG.

22, the base substrate 2110 having the first surface 2112 on which the metal pad 2111 is formed and the second surface 2113 opposite to the first surface 2112 is provided. The metal pad 2111 formed on the first surface 2112 may be used to input or output signals or to supply power. The metal pad 2111 may be formed of a material such as ENIG so as to prevent corrosion of a contact portion and to improve contact performance.

The base substrate 2110 may be a PCB or FPCB on which a circuit is printed. Preferably, the base substrate 2110 may be a single-sided PCB. Further, the PCB may include a thin film, glass, or a tape. As described above, since the single-sided PCB is used as the base substrate 2110, a thickness of the package may be reduced so that an ultra-thin package may be implemented.

The internal wiring 2114, which is electrically connected to the metal pad 2111 and exposed to the second surface 2113, may be formed in the base substrate 2110. The solder ball 2120 may be formed on the second surface 2113 on which the internal wiring 2114 is exposed, and the solder ball 2120 may be fused to the base substrate 2110 through the solder ball pad 2121. In this case, a height of the solder ball 2120 is preferably formed to be larger than that of the chip 2130 which will be described below.

As shown in FIG. 24, after the solder ball 2120 is fused on the base substrate 2110, the base substrate 2110 is cut so as to obtain the base substrate 2110 of the individualized chip package.

Figure 25:
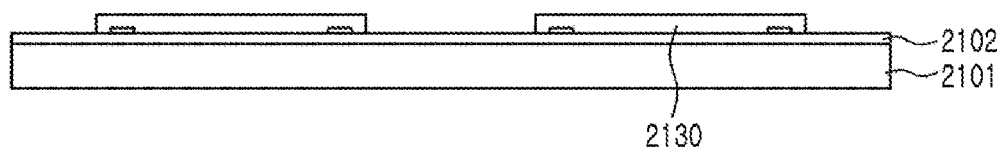
Figure 26:
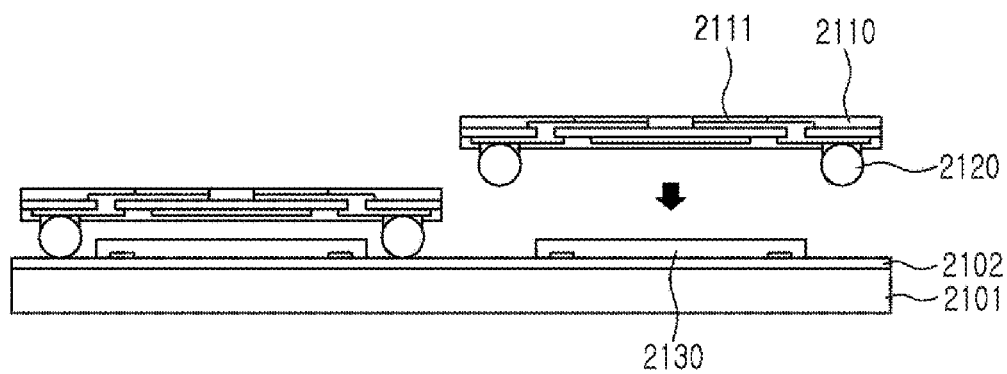

FIGS. 25 and 26 illustrate the stacking of the chip 2130 and the base substrate 2110 on the carrier substrate 2101. First, as shown in FIG. 25, the chip 2130 is stacked on the carrier substrate 101 on which a first adhesive portion 2102 is formed. For example, the carrier substrate 101 may include silicon, glass, ceramic, plastic, polymer, or the like. Further, the first adhesive portion 2102 may be a liquid adhesive or an adhesive tape.

The chip 2130 is stacked on the carrier substrate 2101. The active surface of the chip 2130 is preferably stacked to be in contact with the carrier substrate 2101.

After the chip 2130 is stacked on the carrier substrate 2101, the base substrate 2110 is stacked on the carrier substrate 2101. In this case, the base substrate 2110 is stacked to be located on the chip 2130. It is preferable to stack the base substrate 2110 on the carrier substrate 2101 such that the second surface 2113 of the base substrate 2110 faces the non-active surface of the chip 2130, and the solder ball 2120 is in contact with the carrier substrate 2101.

In this case, the chip 2130 may have a thickness that is smaller than that of the solder ball 2120 formed on the base substrate 2110. For example, when a height of the solder ball 2120 is 1, the thickness of the chip 2130 with respect to a height of the solder ball 2120 is preferably within 0.8. More preferably, the thickness of the chip 2130 with respect to the height of the solder ball 2120 may be within 0.5. When the thickness of the chip 2130 with respect to the height of the solder ball 2120 is greater than or equal to 0.8 and the base substrate 2110 is stacked on the chip 2130, interference may occur between the base substrate 2110 and the chip 2130.

Figure 27:
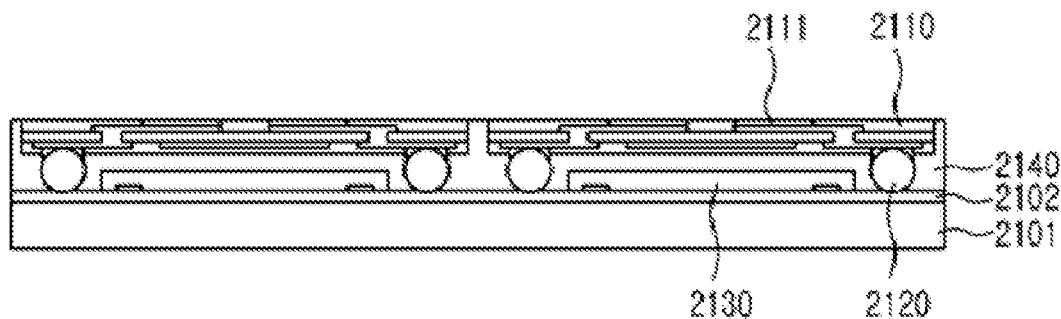

FIG. 27 illustrates the covering of the chip 2130 and the solder ball 2120 with the molding layer 2140. The molding layer 2140 may be formed to surround the solder ball 2120 and the second surface 2113 and the side surface of the base substrate 2110. Further, the molding layer 2140 may fill the side surface of the chip 2130 and between the chip 2130 and the second surface 2113 of the base substrate 2110. The molding layer 2140 may be formed of a conventional EMC or encapsulant material, and the EMC or encapsulant material may be supplied in a liquid phase or a powder phase. When the EMC or encapsulant material is supplied in a liquid phase, the EMC or encapsulant material is formed into the molding layer 2140 through volatilization of a solvent. Further, the molding layer 2140 may be formed using a printing method or a compression molding method.

FIGS. 28 to 31 illustrate the formation of the re-wiring layer 2150. The re-wiring layer 2150 may be formed on the active surface of the chip 2130 and may electrically connect the pad 2131 of the chip 2130 to the solder ball 2120. Further, the re-wiring layer 2150 includes the first insulating layer 2151 formed on the active surface of the chip 2130 and one side of the solder ball 2120, the wiring layer 2152 formed on the first insulating layer 2151 and configured to electrically connect the pad 2131 of the chip 2130 to the solder ball 2120, and the second insulating layer 2153 formed on the wiring layer 2152.

Figure 28:
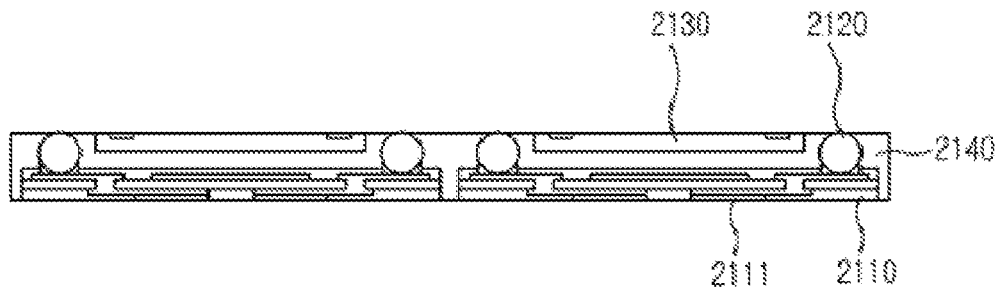
Figure 29:
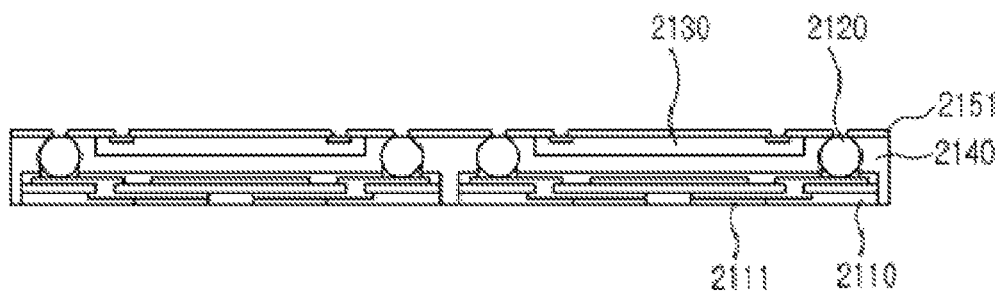

First, as shown in FIG. 28, in order to form the re-wiring layer 2150, the carrier substrate 2101 is removed. As shown in FIG. 29, the first insulating layer 2151 may be stacked to cover the chip 2130, one side surface of the solder ball 2120, and the molding layer 2140. In this case, the first insulating layer 2151 may be formed to expose the pad 2131 of the chip 2130 and one end of the solder ball 2120. A process of removing a portion of the first insulating layer 2151 may employ an etching process or a laser removal process. The first insulating layer 2151 may include an insulator, for example, an oxide, a nitride, an EMC, or the like.

Figure 30:
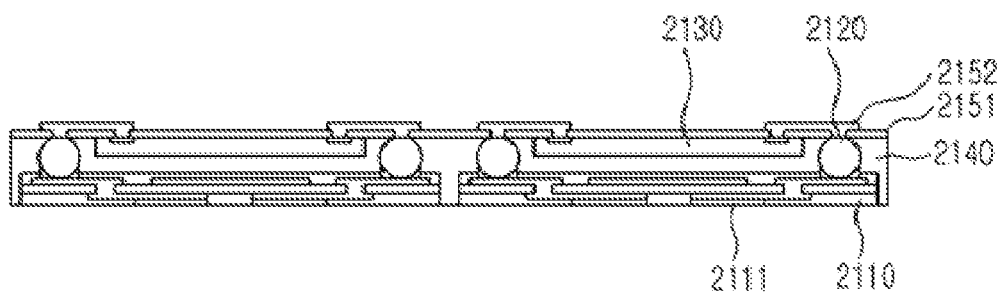

As shown in FIG. 30, the wiring layer 2152 may be formed on the first insulating layer 2151. The wiring layer 2152 may be stacked on the first insulating layer 2151 and may form a re-wiring pattern for electrically connecting the pad 2131 of the chip 2130 to the solder ball 2120. The wiring layer 2152 may fill an open portion of the first insulating layer 2151 and, during this process, the wiring layer 2152 may be connected to the solder ball 2120 and the pad 2131 of the chip 2130. However, since the chip 2130 of the chip package according to the present inventive concept performs a function of a fingerprint sensor, it is preferable that the wiring layer 2152 is formed to open the active surface of the chip 2130 so that the sensing portion 2132 of the chip 2130 has an open form.

The wiring layer 2152 may include a conductive material, for example, a metal such as Cu, a Cu alloy, Al, or an Al alloy. The wiring layer 2152 may be formed using various methods such as deposition, plating, printing, and the like.

Figure 31:
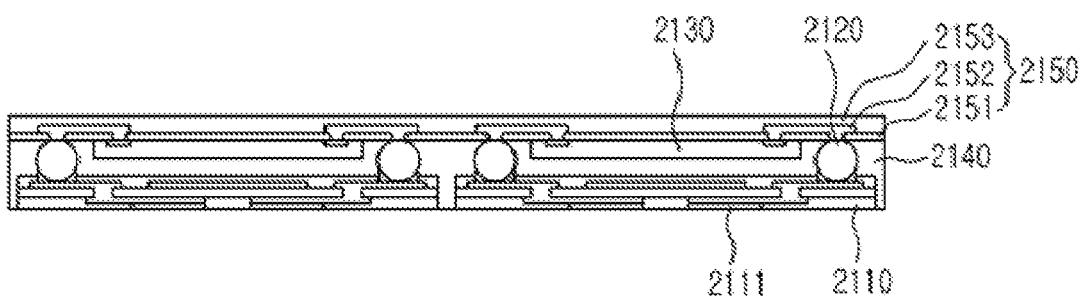

As shown in FIG. 31, the second insulating layer 2153 may be stacked on the exposed surfaces of the first insulating layer 2151 and the wiring layer 2152. The second insulating layer 2153 may include an insulator, for example, an oxide, a nitride, an EMC, or the like.

Figure 32:
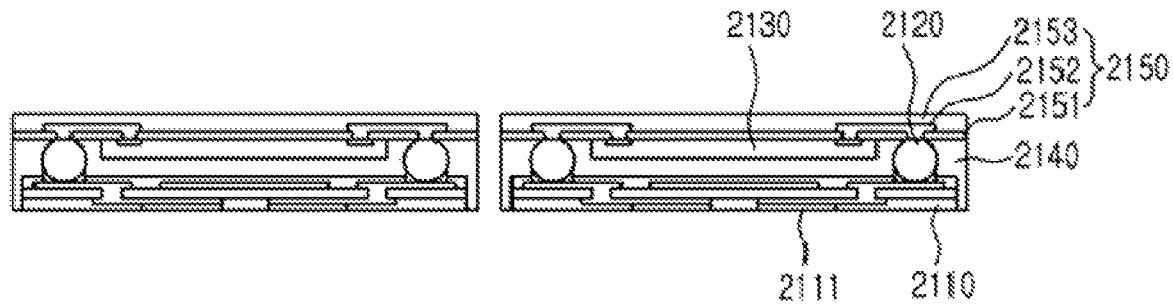

Subsequently, as shown in FIG. 32, an individualized chip package may be obtained by cutting along a cutting line.

FIGS. 33 to 43 are cross-sectional views for describing a manufacturing method of the chip package according to the third embodiment of the present inventive concept.

Figure 33:
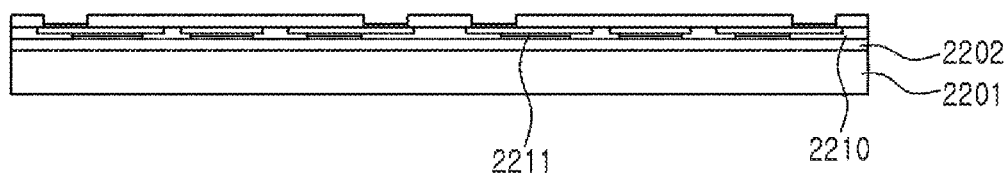
FIGS. 33 to 43 are cross-sectional views for describing a manufacturing method of the chip package according to the third embodiment of the present inventive concept.
Figure 34:
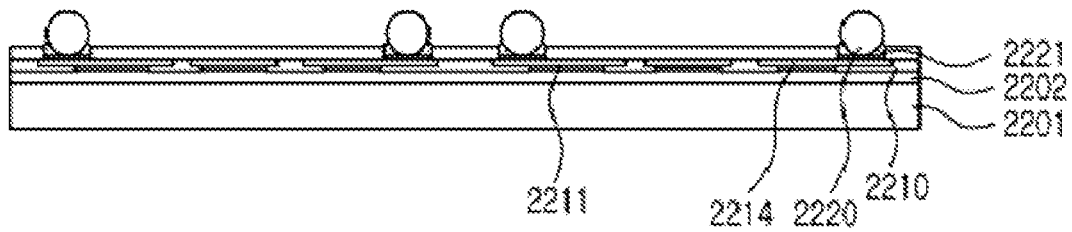
Figure 35:
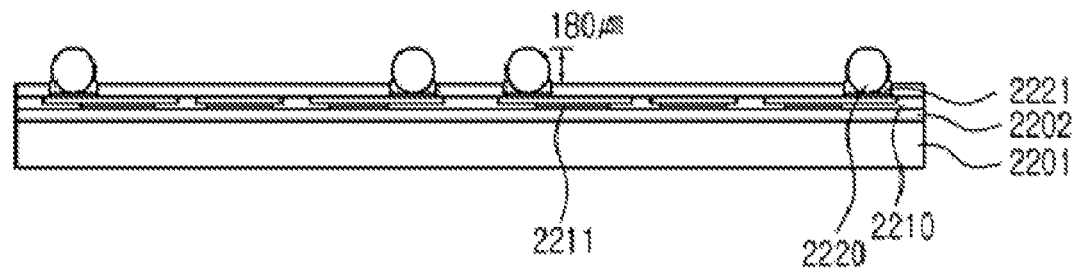

FIGS. 33 to 35 illustrate the formation of the solder ball 2220 on the provided base substrate 2210. Referring to FIG. 33, the base substrate 2210 having the first surface 2212 on which a metal pad 2211 is formed and the second surface 2213 opposite to the first surface 2212 is provided. As in the second embodiment 2100, the base substrate 2210 may be a single-sided PCB. The provided base substrate 2210 is stacked on a first adhesive portion 2202 formed on the first carrier substrate 2201. The provided base substrate 2210 may be stacked such that the first surface 2212 of the base substrate 2210 is bonded to the first adhesive portion 2202.

After the base substrate 2210 is stacked on the first carrier substrate 2201, the solder ball 2220 may be formed on the second surface 2213 on which an internal wiring 2214 of the base substrate 2210 is exposed. In this case, a solder ball pad 221 may be formed on the exposed internal wiring 2214, and the solder ball 2220 may be fused to the base substrate 2210 through the solder ball pad 221.

After the solder ball 2220 is formed, grinding treatment may be performed on an upper portion of the solder ball 2220. This is because, when the chip 2230 is stacked on the base substrate 2210 in an operation of stacking the chip 2230, which will be described below, a height of the active surface of the chip 2230 is made to be coplanar with a height of the solder ball 2220.

For example, assuming that the height of the solder ball 2220 is 1 when the chip 2230 is stacked on the base substrate 2210, a thickness of the chip 2230 with respect to the height of the solder ball 2220 is preferably within 0.8. In some embodiments, it is preferable to grind the upper portion of the solder ball 2220 such that a height from the second surface 2213 of the base substrate 2210 to the upper portion of the solder ball 2220 become 180 μm.

Figure 36:
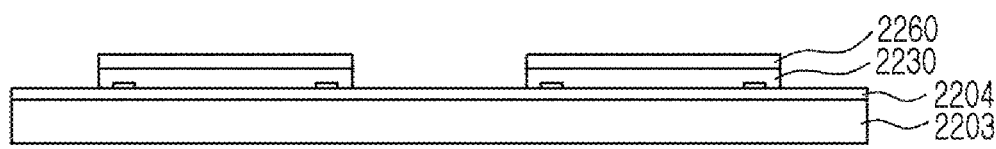
Figure 37:
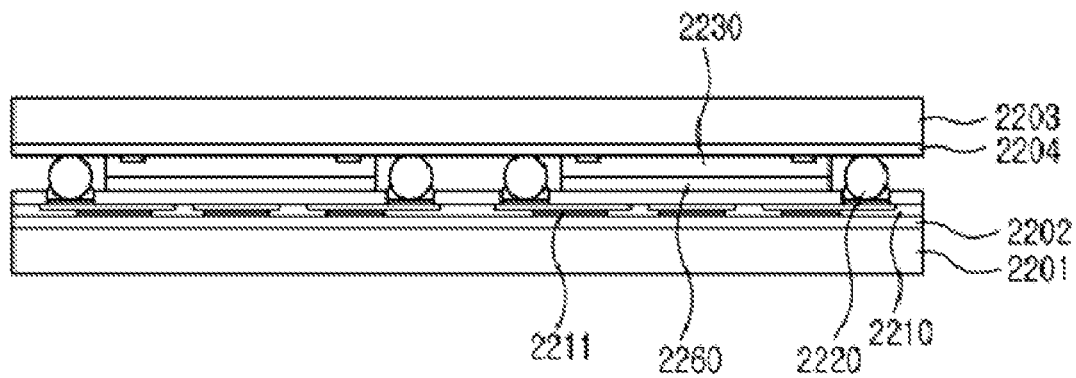

FIGS. 36 and 37 illustrate the stacking of the chip 2230 on the carrier substrate 2210. Before the chip 2230 is stacked on the base substrate 2210, the adhesive layer 2260 is formed on the non-active surface of the chip 2230. As shown in FIG. 36, the chip 2230 on which the adhesive layer 2260 is formed is stacked on a second carrier substrate 2203 on which a second adhesive portion 2204 is formed. In this case, the chip 2230 is preferably stacked such that the active surface of the chip 2230 is in contact with the second carrier substrate 2203. Here, the second carrier substrate 2203 may include silicon, glass, ceramic, plastic, polymer, or the like. The second adhesive portion 2204 may be a liquid adhesive or an adhesive tape.

As shown in FIG. 37, the chip 2230 stacked on the second carrier substrate 2203 may be stacked such that the adhesive layer 2260 is bonded to the base substrate 2210. In this case, the solder ball 2220 may be in contact with the second adhesive portion 2204 of the second carrier substrate 2203 such that the active surface of the chip 2230 is coplanar with the upper portion of the solder ball 2220.

Figure 38:
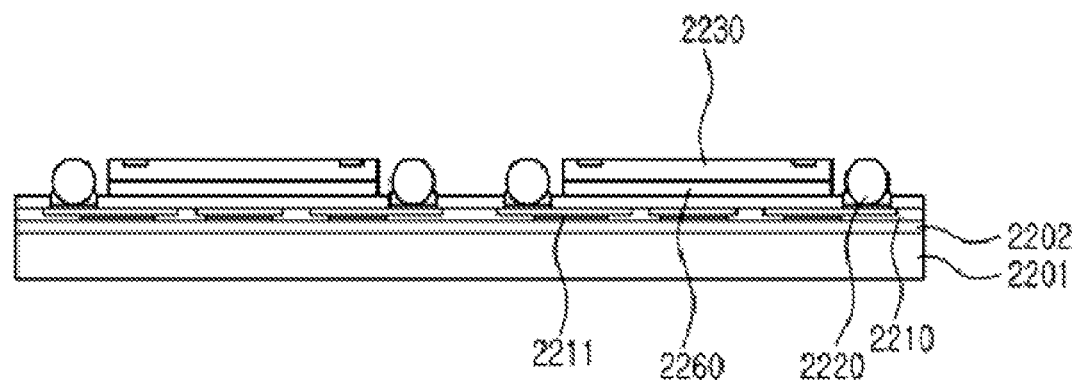
Figure 39:
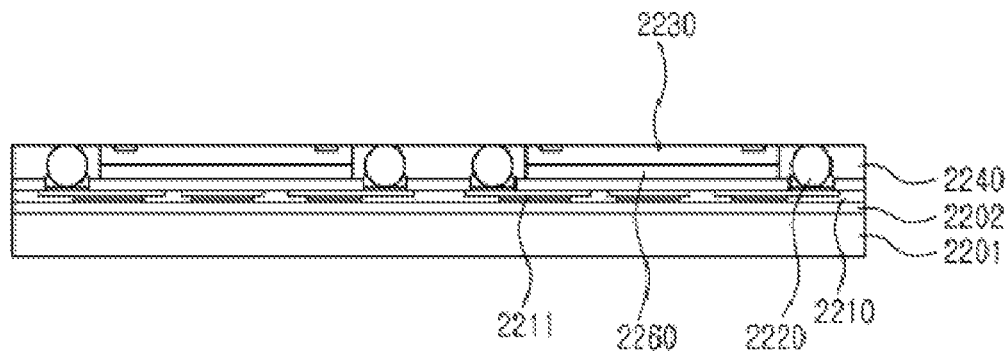

FIGS. 38 and 39 illustrate the formation of the molding layer 2240. As shown in FIG. 38, the molding layer 2240 may be formed after the second carrier substrate 2203 is removed so as to cover the chip 2230 and the solder ball 2220 with the molding layer 2240.

Figure 40:
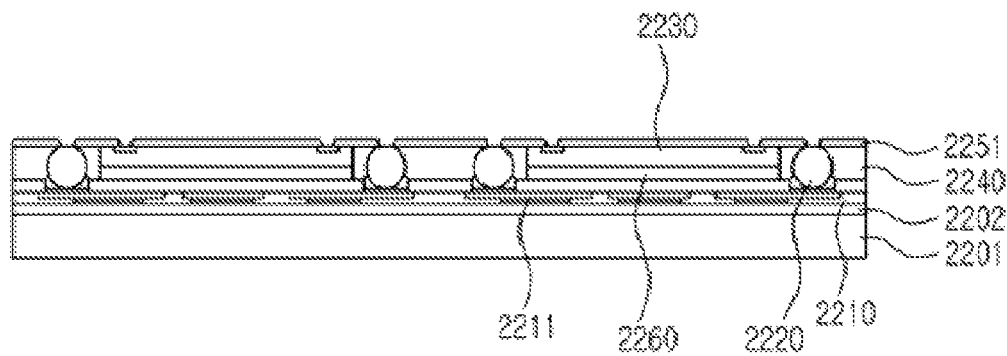
Figure 41:
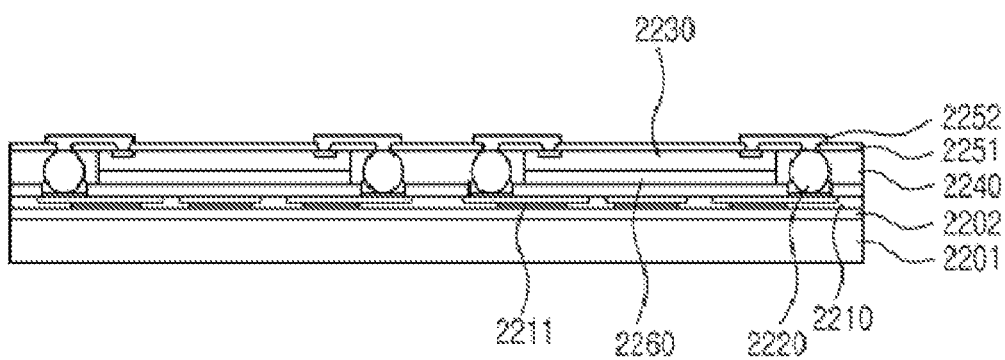
Figure 42:
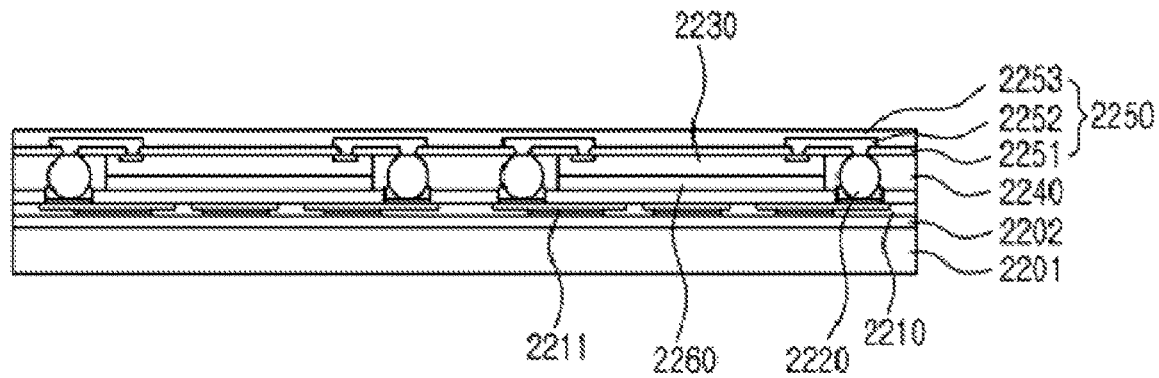
Figure 43:
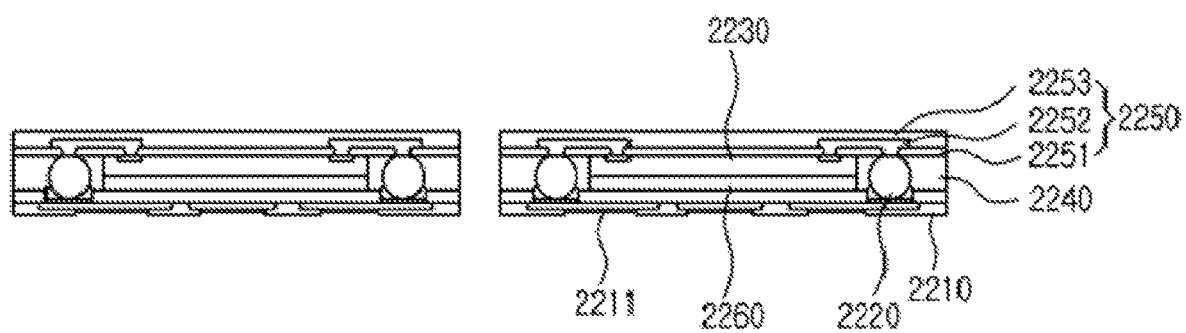

FIGS. 40 and 41 illustrate the formation of the re-wiring layer 2250. The re-wiring layer 2250 may be formed on the active surface of the chip 2230 and may electrically connect a pad 231 of the chip 2230 to the solder ball 2220. Further, the re-wiring layer 2250 includes the first insulating layer 2251 formed on the active surface of the chip 2230 and one side of the solder ball 2220, the wiring layer 2252 formed on the first insulating layer 2251 and configured to electrically connect the pad 231 of the chip 2230 to the solder ball 2220, and the second insulating layer 2253 formed on the wiring layer 2252. The formation of the re-wiring layer 2250 may be the same as in the second embodiment 2100.

After the re-wiring layer 2250 is formed, the first carrier substrate 2201 is removed to expose the metal pad 2211 of the base substrate 2210, and an individualized chip package may be obtained by cutting along a cutting line.

FIGS. 44 to 50 are cross-sectional views for describing another manufacturing method of the chip package according to the third embodiment of the present inventive concept.

Figure 44:
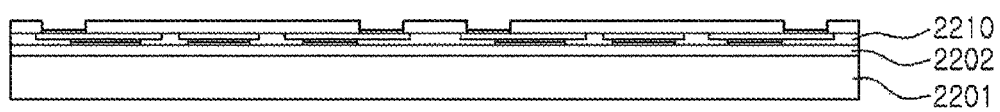
FIGS. 44 to 50 are cross-sectional views for describing another manufacturing method of the chip package according to the third embodiment of the present inventive concept.
Figure 45:
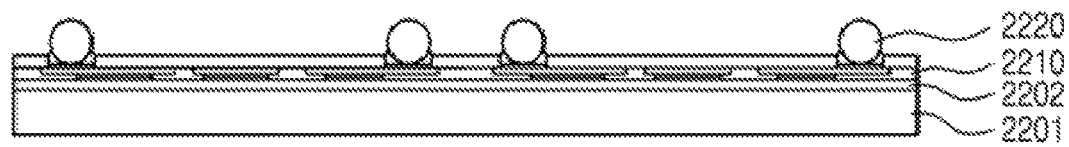
Figure 46:
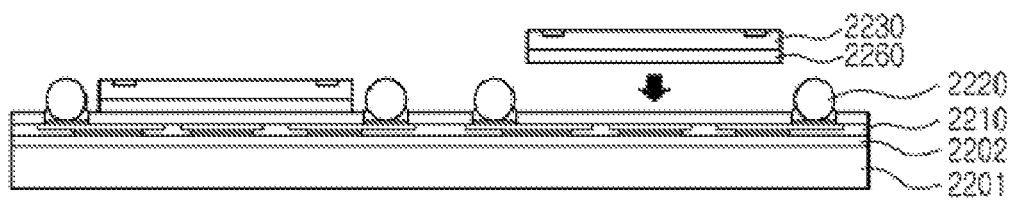
Figure 47:
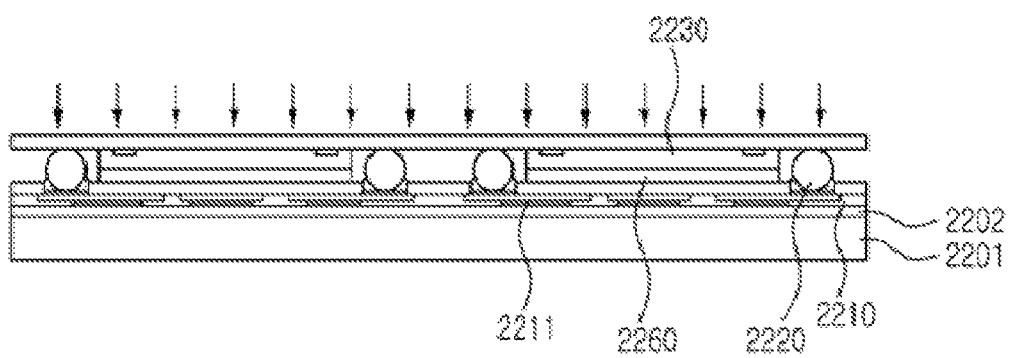
Figure 48:
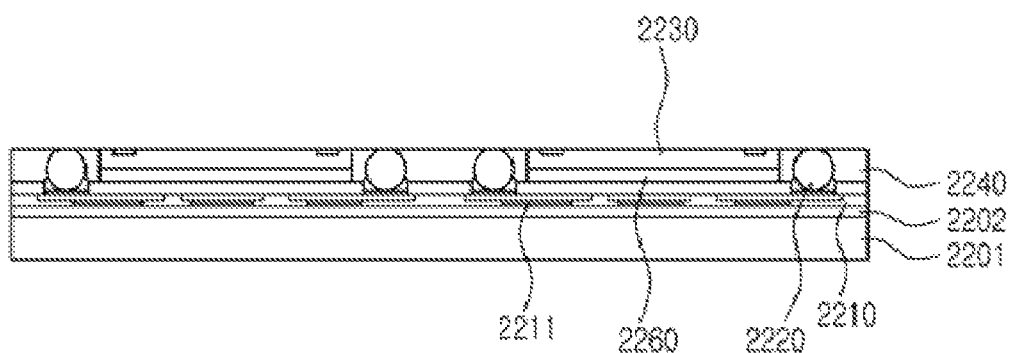
Figure 49:
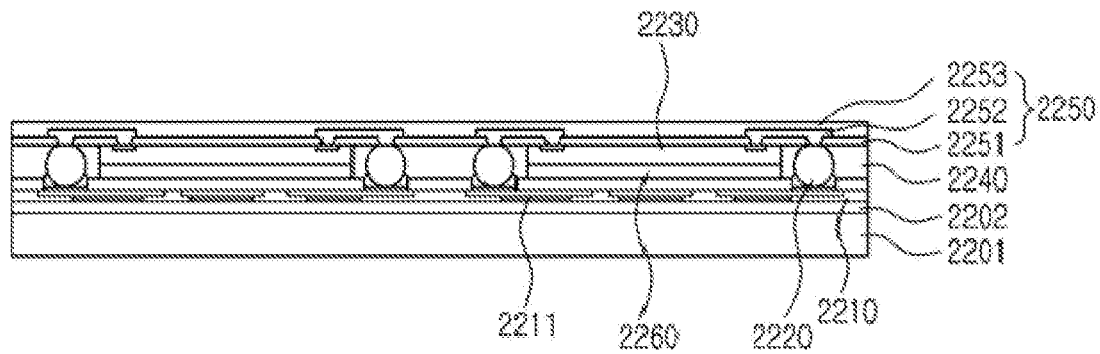
Figure 50:
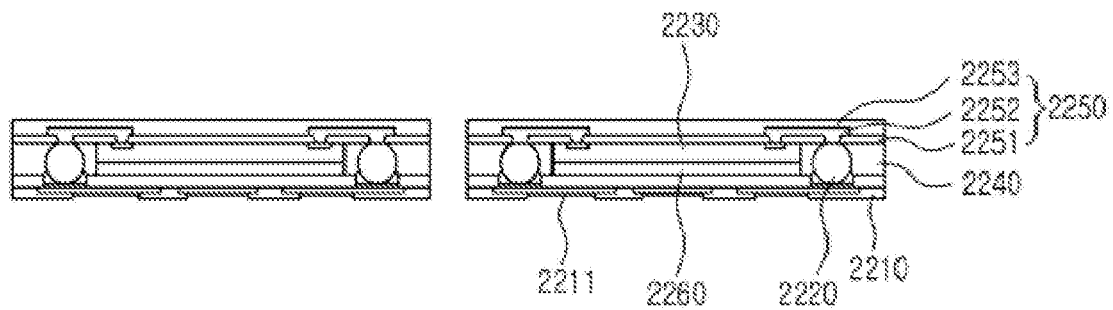

Referring to FIGS. 44 to 50, as shown in FIGS. 44 and 45, in another manufacturing method of the chip package 2200 according to the third embodiment of the present inventive concept, the process of stacking the base substrate 2210, on which the solder ball 2220 is formed, on the first carrier substrate 2201 is the same as the above-described process. However, in the another manufacturing method, as shown in FIG. 46, the chip 2230 on which the adhesive layer 2260 is formed may be directly stacked on the base substrate 2210 using the adhesive layer 2260 without using the second carrier substrate 2203. Accordingly, as shown in FIG. 47, in order to provide the active surface of the chip 2230 coplanar with the upper portion of the solder ball 2220, planarization and bonding curing for planarizing the solder ball 2220 and the chip 2230 may be further included.

When the planarization and the bonding curing are completed, the solder ball 2220 and the chip 2230 are covered using the molding layer 2240, and the re-wiring layer 2250 is formed on the planarized solder ball 2220 and the planarized chip 2230 through the above described same process to obtain an individualized package.

Figure 51:
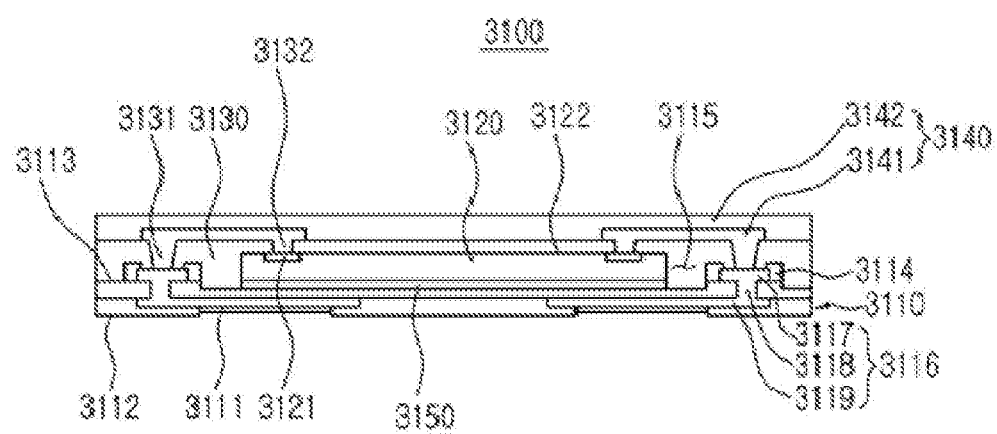
FIG. 51 is a cross-sectional view illustrating a chip package according to a fourth embodiment of the present inventive concept.

FIG. 51 is a cross-sectional view illustrating a chip package according to a fourth embodiment of the present inventive concept.

Referring to FIG. 51, a chip package 3100 according to a fourth embodiment of the present inventive concept includes a base substrate 3110, a chip 3120, a molding layer 3130, and a wiring portion 3140.

The base substrate 3110 may be formed of the substrate used in the second embodiment 2100 or the third embodiment 2200.

The base substrate 3110 may be formed in a flat plate shape. Further, a top surface and a bottom surface of the base substrate 3110 may be in the form of a rectangular shape, but the present inventive concept is not limited thereto. The base substrate 3110 includes a first surface 3112 on which a metal pad 3111 is formed and the second surface 2113 opposite to the first surface 3112. The metal pad 3111 formed on the first surface 3112 may be used to input or output signals or to supply power. The metal pad 3111 may be formed of a material such as ENIG so as to prevent corrosion of a contact portion and to improve contact performance.

A via post 3114 and a seating groove 3115 may be formed on the second surface 3113 of the base substrate 3110. The via post 3114 is formed to protrude from the second surface 3113. A height of the via post 3114 may be formed to be larger or smaller than that of the chip 3120 and electrically connected to the metal pad 3111 through an internal wiring 3116 formed in the via post 3114. Further, a diameter of the via post 3114 may be greater than or equal to that of the internal wiring 3116.

Figure 52:
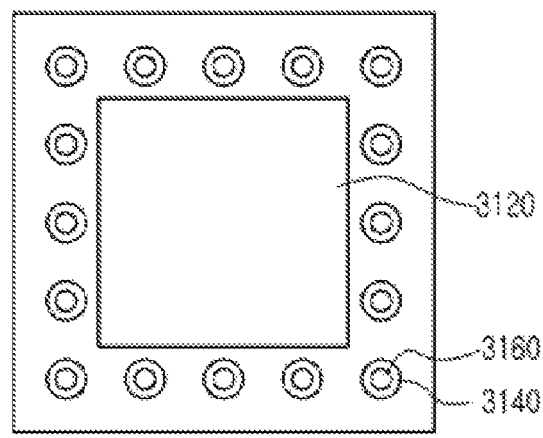
FIGS. 52 to 54 are plan views illustrating an arrangement of via posts according to the fourth embodiment of the present inventive concept.
Figure 53:
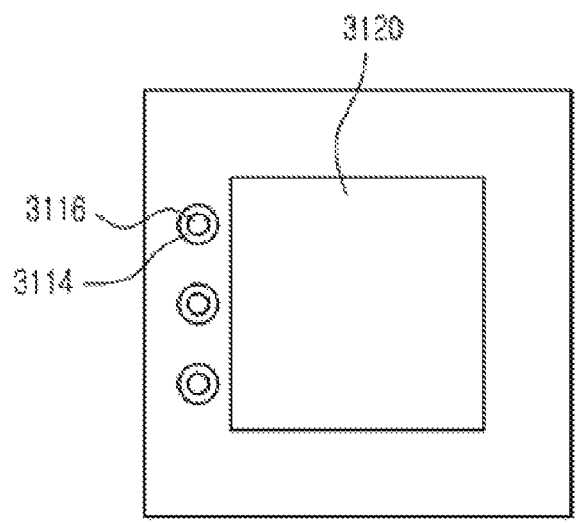
Figure 54:
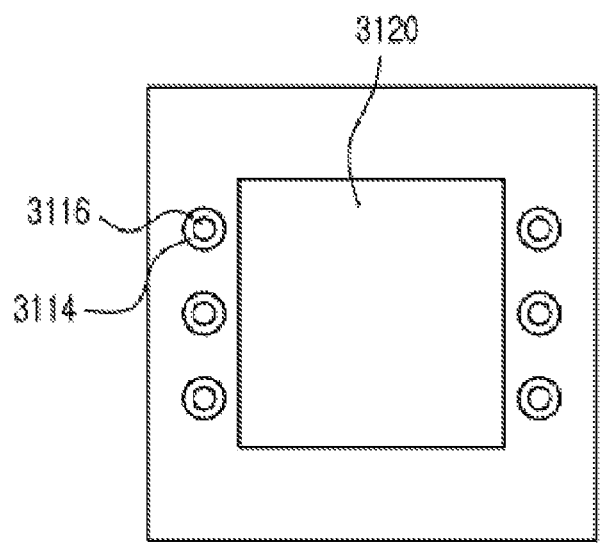

FIGS. 52 to 54 are plan views illustrating an arrangement of via posts according to the fourth embodiment of the present inventive concept.

The via post 3114 may be formed to surround the chip 3120 as shown in FIG. 52 or formed on one or both sides of the chip 3120 as shown in FIGS. 53 and 54. Therefore, a wiring layer 3141 connected to the internal wiring 3116 of the via post 3114 may be changed according to an arrangement of the via post 3114 shown in FIGS. 52 to 54.

The internal wiring 3116 may include a via contact 3117, a via 3118, and a lower wiring 3119, and the via contact 3117 and the lower wiring 3119 may be electrically connected by the via 3118. The via contact 3117 and the lower wiring 3119 are integrated with the via 3118 and are preferably made of the same material. The lower wiring 3119 may be provided in the form of extending a predetermined distance from the via 3118 and may be electrically connected to the metal pad 3111.

Further, the via post 3114 may be electrically connected to the chip 3120 by a first mold via 3131 and the wiring portion 3140, which will be described below. The seating groove 3115 may be formed in a groove shape between the via posts 3114 on the second surface 3113 of the base substrate 3110. The chip 3120 may be disposed in the seating groove 3115, and a size of the seating groove 3115 may be formed to be larger than that of the chip 3120.

The base substrate 3110 may employ the PCB used in the second embodiment 2100 and the third embodiment 2200.

The chip 3120 may be disposed in the seating groove 3115 of the base substrate 3110 using an adhesive layer 3150. One surface of the chip 3120 may be an active surface including an active area in which a circuit is formed. Meanwhile, a rear surface of the chip 3120 opposite the active surface thereof may be a non-active surface. Alternatively, both surfaces of the chip 3120 may be provided as active surfaces. A pad 3121 for exchanging a signal with the outside may be provided on the active surface of the chip 3120 as a plurality of pads 3121. The pad 3121 may be formed of a conductive material film such as Al. The pad 3121 may be integrally formed with the chip 3120.

The active surface on which the pad 3121 of the chip 3120 is formed may be disposed to face the wiring portion 3140. That is, a non-active surface of the chip 3120 may be disposed to face the base substrate 3110 through the adhesive layer 3150 formed below the non-active surface of the chip 3120.

Further, when the chip 3120 of the chip package according to the present inventive concept is applied as a fingerprint sensor, a sensing portion 3122 for detecting a fingerprint may be included on the active surface of the chip 3120. The sensing portion 3122 may be formed in various shapes. For example, the sensing portion 3122 may be formed using a conductor. The sensing portion 3122 may find a difference in capacitance due to a difference in height according to shapes of a peak and a valley of a fingerprint of a user's finger and generate a fingerprint image by scanning an image of the fingerprint. Accordingly, the active surface of the chip 3120 according to the present inventive concept may be formed in an open shape with respect to the upper wiring portion 3140 and the sensing portion 3122 may collect external information, for example, fingerprint information on the user's finger, through the open active surface. Further, although the sensing portion 3122 of the chip 3120 in the present inventive concept is described as a fingerprint sensor, the chip 3120 may be applied as a chip for electromagnetic sensing, optical sensing, or medical sensing in addition to the fingerprint sensor.

The molding layer 3130 may be formed on the base substrate 3110 and the chip 3120. Further, the molding layer 3130 may be formed to surround an upper portion and a side surface of the active surface of the chip 3120 and an upper portion of the base substrate 3110, and the via post 3114. That is, the first surface 3112 on which the metal pad 3111 of the base substrate 3110 is formed may be exposed by the molding layer 3130.

Further, the molding layer 3130 may include the first mold via 3131 and a second mold via 3132. The first mold via 3131 may be formed above the via post 3114, and the second mold via 3132 may be formed on the pad 3121 of the chip 3120. The first mold via 3131 and the second mold via 3132 may be filled with a conductive material. Here, a width of the first mold via 3131 may be formed to become narrower in a downward direction based on a center point of a vertical cross section of the first mold via 3131.

The molding layer 3130 may be formed of polyimide (PI), which is an insulating film, instead of an EMC, an encapsulant, or the like which is conventionally used. Therefore, in a process of forming the wiring portion 3140 which will be described below, the wiring layer 3141 may be directly formed on the molding layer 3130 by omitting a conventional insulating layer formed below the wiring layer 3141. That is, since the wiring layer 3141 may be directly formed on the molding layer 3130 without consuming a separate insulating layer on the molding layer 3130, a process of forming a separate insulating layer below the wiring layer 3141 may be omitted so that there is an effect which is capable of reducing consumption of the insulating layer, a process time, and a thickness of the package due to the reduction of the insulating layer.

Further, the molding layer 3130 according to the present inventive concept may have light transmittance. In a conventional chip package, since a molding layer is formed of a molding compound (EMC) and an insulating layer is formed on an active layer of a chip, the molding layer does not need to have light transmittance. However, in the chip package according to the present inventive concept, since the active surface of the chip 3120 is covered with the molding layer 3130 formed of PI and an insulating layer 3142 surrounding the wiring layer 3141 is formed on the molding layer 3130, the molding layer 3130 may have light transmittance so as to serve as a sensor package.

The wiring portion 3140 may be provided to electrically connect the pad 3121 of the chip 3120 to the via post 3114. For example, the wiring portion 3140 may include the wiring layer 3141 and the insulating layer 3142. The insulating layer 3142 is formed of an insulating material and provided to insulate the wiring layer 3141.

The wiring layer 3141 includes a conductive material and may be formed on the molding layer 3130 through a relocation process. However, when the chip 3120 of the chip package according to the present inventive concept performs a function of a fingerprint sensor, it is preferable that the wiring layer 3141 is formed to open the active surface of the chip 3120 so that the sensing portion 3122 of the chip 3120 has an open form. The chip 3120 may be electrically connected to the base substrate 3110 through the first mold via 3131, the wiring layer 3141, the second mold via 3132, and the via post 3114.

The insulating layer 3142 may be formed on the wiring layer 3141 to insulate the wiring layer 3141 from the outside. That is, the insulating layer 3142 may be stacked on the exposed surfaces of the molding layer 3130 and the wiring portion 3140. However, the insulating layer 3142 has been shown as encapsulating the wiring layer 3141 in the drawings. Alternatively, the insulating layer 3142 may be provided to expose a portion of the wiring layer 3141 and electrically connected to the outside (a main substrate, the chip, the package, or the like) through the exposed wiring layer 3141. That is, a POP structure in which a package is stacked on a package or a SIP structure may be achieved. Alternatively, a plurality of chips may be disposed adjacent to each other or in contact with each other in a width direction.

Figure 55:
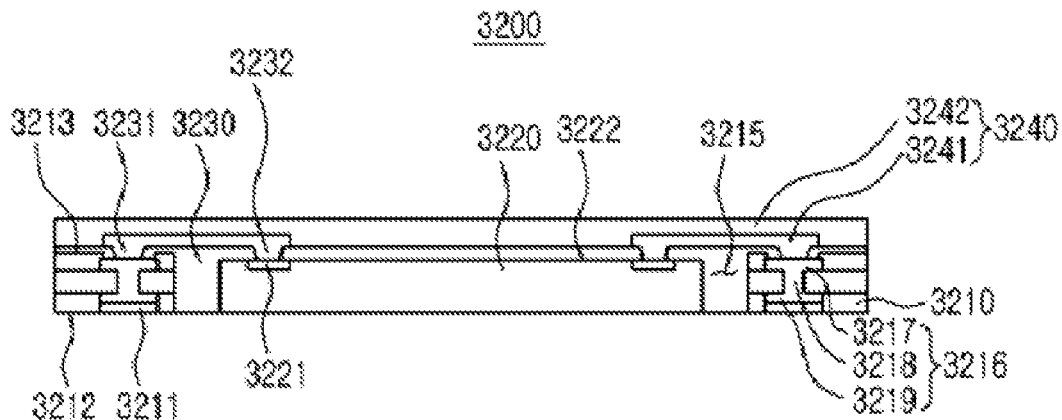
FIG. 55 is a cross-sectional view illustrating a chip package according to a fifth embodiment of the present inventive concept.
Figure 56:
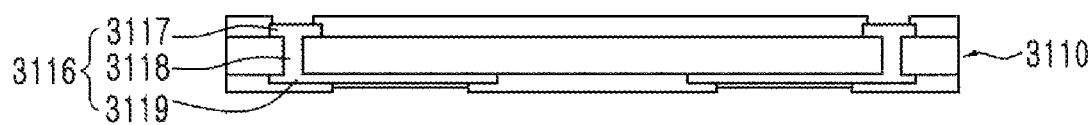
FIGS. 56 to 66 are cross-sectional views for describing a manufacturing method of the chip package according to the fourth embodiment of the present inventive concept.
Figure 57:
Figure 58:
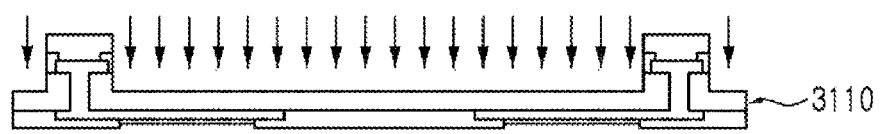
Figure 59:

FIG. 55 is a cross-sectional view illustrating a chip package according to a fifth embodiment of the present inventive concept.

Referring to FIG. 55, a chip package 3200 according to a fifth embodiment of the present inventive concept includes a base substrate 3210, a chip 3220, a molding layer 3230, and a wiring portion 3240.

As in the fourth embodiment 3100, the base substrate 3210 according to the fifth embodiment 3200 includes a first surface 3212 on which a metal pad 3211 is formed and a second surface 3213 opposite to the first surface 3212. However, the base substrate 3210 according to the fifth embodiment 3200 may include a through-hole 3215. The through-hole 3215 may be formed to pass through the base substrate 3210 between the metal pads 3211 of the base substrate 3210. An internal wiring 3216 may be formed on the metal pad 3211 to extend to the second surface 3213 of the base substrate 3210 to be exposed to the outside.

The internal wiring 3216 may include a via contact 3217, a via 3218, and a lower wiring 3219, and the via contact 3217 and the lower wiring 3219 may be electrically connected by the via 3218. The via contact 3217 and the lower wiring 3219 are integrated with the via 3218 and are preferably made of the same material. The lower wiring 3219 may be electrically connected to the metal pad 3211 formed on the first surface 3212 of the base substrate 3210.

The chip 3220 may be disposed in the through-hole 3215 formed on the base substrate 3210. The chip 3220 may be formed such that an active surface on which a pad 3221 is formed faces the wiring portion 3240. Further, a non-active surface of the chip 3220 may be formed coplanar with the first surface 3212 on which the metal pad 3211 of the base substrate 3210 is formed.

The molding layer 3230 may be formed on the base substrate 3210 and the chip 3220. Further, as in the fourth embodiment, the molding layer 3230 may fill in an upper portion and a side surface of the active surface of the chip 3220, an upper portion of the base substrate 3210, and the through-hole 3215. However, the first surface 3212 on which the metal pad 3211 of the base substrate 3210 is formed and a non-active surface of a semiconductor substrate may be exposed by the molding layer 3230.

The molding layer 3230 may include a first mold via 3231 and a second mold via 3232. The first mold via 3231 may be formed on the exposed internal wiring 3216 of the base substrate 3210, and the second mold via 3232 may be formed on the pad 3221 of the chip 3220. The first mold via 3231 and the second mold via 3232 may be filled with a conductive material.

Further, the molding layer 3230 may be formed to fill in the upper portion and the side surface of the active surface of the chip 3220, the upper portion of the base substrate 3210, and the through-hole 3215. That is, the first surface 3212 on which the metal pad 3211 of the base substrate 3210 is formed and the non-active surface of the chip 3220 may be exposed by the molding layer 3230.

Further, as in the fourth embodiment 3100, the molding layer 3230 may be formed of PI which is an insulating film. Therefore, in a process of forming the wiring portion 3240 which will be described below, a wiring layer 3241 may be directly formed on the molding layer 3230 by omitting an insulating layer formed below the wiring layer 3241.

The wiring layer 3240 may be provided to electrically connect the pad 3221 of the chip 3220 to the internal wiring 3216 of the base substrate 3210. For example, as in the fourth embodiment 3100, the wiring portion 3240 may include the wiring layer 3241 and an insulating layer 3242. The insulating layer 3242 is formed of an insulating material and provided to insulate the wiring layer 3241.

Therefore, like the chip package 3100 according to the fourth embodiment, the chip package 3200 according to the fifth embodiment also uses PI as the molding layer 3230 and thus, when the wiring portion 3240 is formed, a conventional insulating layer formed below the wiring layer 3241 is unnecessary so that there is an effect which is capable of simplify a manufacturing process and reducing a production cost.

FIGS. 56 to 66 are cross-sectional views for describing a manufacturing method of the chip package according to the fourth embodiment of the present inventive concept.

Referring to FIGS. 56 to 66, a manufacturing method of the chip package 3100 according to the fourth embodiment of the present inventive concept includes providing the base substrate 3110 having the first surface 3112 on which the metal pad 3111 is formed and the second surface 3113 opposite to the first surface 3112, stacking the base substrate 3110 on a first carrier substrate 3102 such that the first surface 3112 of the base substrate 3110 is in contact with the first carrier substrate 3102 and arranging the chip 3120 on the base substrate 3110, covering the base substrate 3110 and the chip 3120 with the molding layer 3130, forming the first mold via 3131 and the second mold via 3132 on the molding layer 3130, and forming the wiring portion 3140 on the molding layer 3130 and electrically connecting the pad 3121 of the chip 3120 to the via post 3114.

However, in the manufacturing method of the chip package 3100 according to the fourth embodiment of the present inventive concept, the providing of the base substrate 3110 may further include forming the seating groove 3115, in which the via post 3114 and the chip 3120 are disposed, on the base substrate 3110.

FIGS. 56 to 59 illustrate the formation of the via post 3114 and the seating groove 3115 in the base substrate 3110. That is, the base substrate 3110 in which the internal wiring 3116 is formed is provided. The internal wiring 3116 formed in the base substrate 3110 may include the via contact 3117, the via 3118, and the lower wiring 3119, and the via contact 3117 and the lower wiring 3119 may be electrically connected by the via 3118. The via contact 3117 and the lower wiring 3119 are integrated with the via 3118 and are preferably made of the same material. The lower wiring 3119 may be provided in the form of extending a predetermined distance from the via 3118 and may be electrically connected to the metal pad 3111 formed on the first surface 3112 of the base substrate 3110.

When the base substrate 3110 is provided, the via contact 3117 exposed on the base substrate 3110 is masked using a mask 3101. After the masking, a blasting process is performed on the second surface 3113 of the base substrate 3110 to form the via post 3114 and the seating groove 3115 on the second surface 3113. For example, the base substrate 3110 may be a PCB or FPCB on which a circuit is printed. Preferably, the base substrate 3110 may be a double-sided PCB. Further, the PCB may include a thin film, glass, or a tape.

Figure 60:
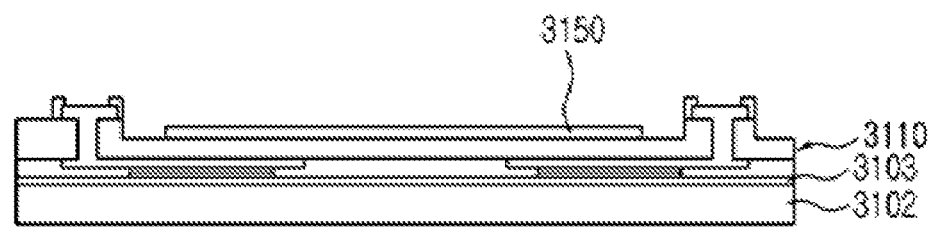
Figure 61:
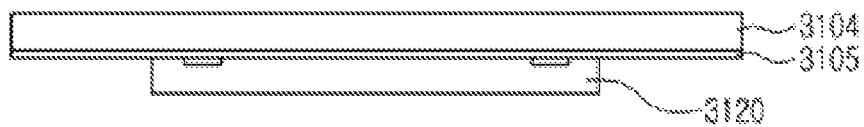
Figure 62:
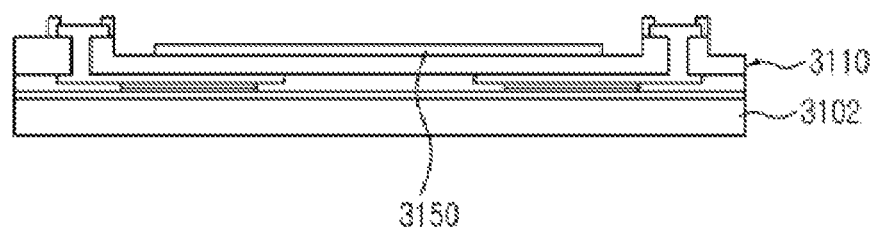

FIGS. 60 to 62 illustrate the arranging of the chip 3120 on the base substrate 3110. That is, the base substrate 3110 is stacked on a first adhesive portion 3103 formed on the first carrier substrate 3102, and the adhesive layer 3150 is formed to bond the chip 3120 to a bottom of the seating groove 3115 of the stacked base substrate 3110. The first adhesive portion 3103 may be a liquid adhesive or an adhesive tape.

After the adhesive layer 3150 is formed, the chip 3120 may be bonded to a second carrier substrate 3104 using a second adhesive portion 3105. In this case, the chip 3120 may be formed such that the active surface of the chip 3120, on which a pad 3121 is formed, faces the second carrier substrate 3104. Like the first carrier substrate 3102, the second carrier substrate 3104 may include silicon, glass, ceramic, plastic, polymer, or the like. The second adhesive portion 3105 may be a liquid adhesive or an adhesive tape.

The chip 3120 stacked on the second carrier substrate 3104 may be stacked in the seating groove 3115 in which the adhesive layer 3150 is formed. That is, the non-active surface of the chip 3120 may be stacked to be disposed on the base substrate 3110 by being in contact with the adhesive layer 3150 and may be cured through a curing process.

Figure 63:
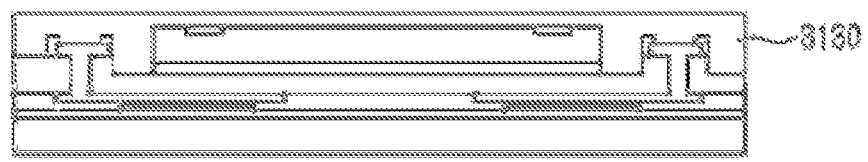

FIG. 63 illustrates the covering of the base substrate 3110 and the chip 3120 with the molding layer 3130. That is, the second carrier substrate 3104 including the second adhesive portion 3105 may be removed, and the base substrate 3110 and the chip 3120 may be covered with the molding layer 3130. The molding layer 3130 may be formed of polyimide (PI), which is an insulating film, instead of an EMC, an encapsulant, or the like which is conventionally used. Therefore, in a process of forming the wiring portion 3140 which will be described below, the wiring layer 3141 may be directly formed on the molding layer 3130 by omitting a conventional insulating layer formed below the wiring layer 3141.

The molding layer 3130 may be formed to surround an upper portion and a side surface of the active surface of the chip 3120 and an upper portion of the base substrate 3110, and the via post 3114. That is, the first surface 3112 on which the metal pad 3111 of the base substrate 3110 is formed may be exposed by the molding layer 3130.

Further, the first mold via 3131 and the second mold via 3132 may be formed in the molding layer 3130 through a patterning process. The first mold via 3131 may be formed above the via post 3114, and the second mold via 3132 may be formed on the pad 3121 of the chip 3120.

Figure 64:
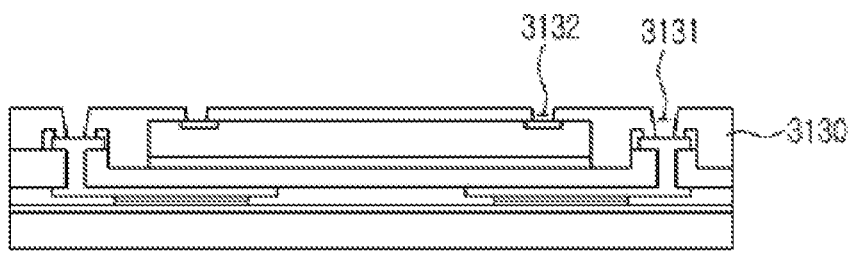
Figure 65:
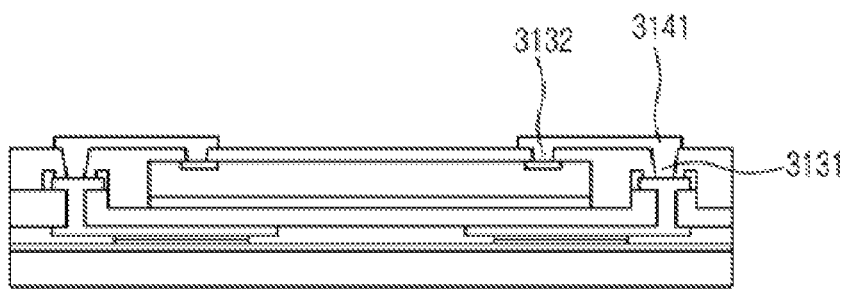
Figure 66:
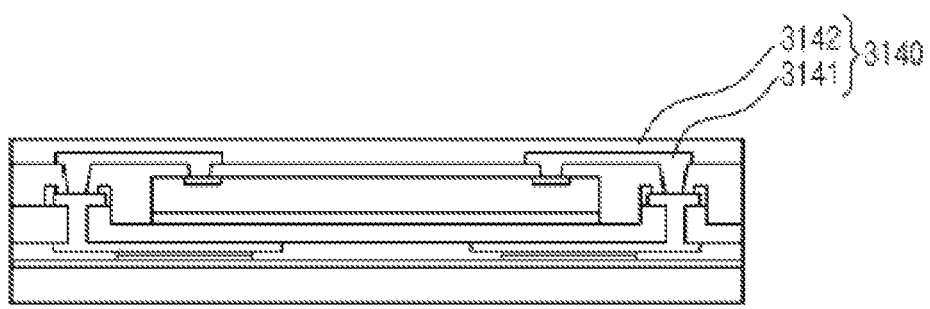
Figure 67:
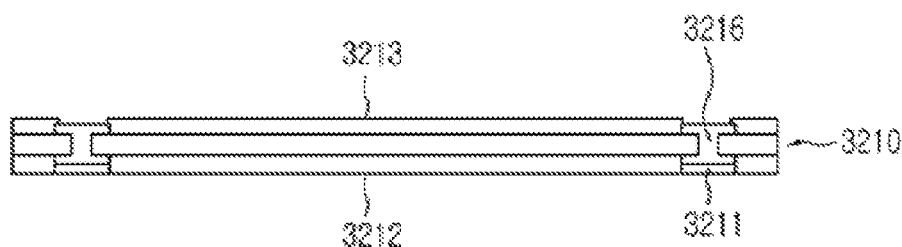
FIGS. 67 to 76 are cross-sectional views for describing a manufacturing method of the chip package according to the fifth embodiment of the present inventive concept.
Figure 68:
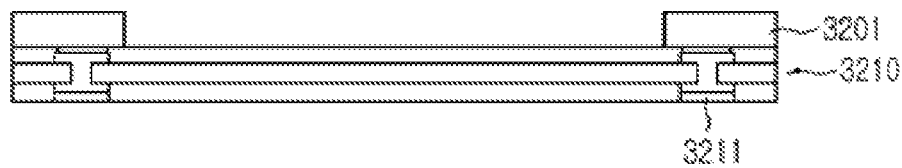
Figure 69:
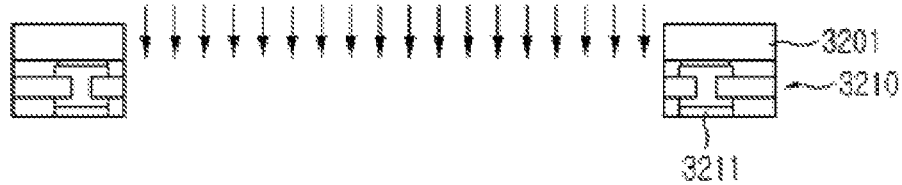
Figure 70:

FIGS. 64 and 65 illustrate the formation of the wiring portion 3140 on the molding layer 3130. That is, after the first mold via 3131 and the second mold via 3132 are formed in the molding layer 3130, the wiring portion 3140 may be formed on the molding layer 3130. Before the wiring portion 3140 is formed, the first mold via 3131 and the second mold via 3132 may be filled with a conductive material. For example, the conductive material may include Cu, a Cu alloy, Al, or an Al alloy. Alternatively, the conductive material may be a conductive paste or solder resist ink.

The wiring portion 3140 may be provided to electrically connect the pad 3121 of the chip 3120 to the via post 3114. For example, the wiring portion 3140 may include the wiring layer 3141 and the insulating layer 3142. The insulating layer 3142 is formed of an insulating material and provided to insulate the wiring layer 3141.

The wiring layer 3141 is formed on the molding layer 3130 and may be formed to electrically connect the first mold via 3131 to the second mold via 3132. The chip 3120 may be electrically connected to the base substrate 3110 through the first mold via 3131, the wiring layer 3141, the second mold via 3132, and the via post 3114 due to the wiring layer 3141.

However, when the chip 3120 of the chip package according to the present inventive concept performs a function of a fingerprint sensor, it is preferable that the wiring layer 3141 is formed to open the active surface of the chip 3120 so that the sensing portion 3122 of the chip 3120 has an open form.

The wiring layer 3141 may include a metal as a conductive material, for example, Cu, a Cu alloy, Al, or an Al alloy and may be formed using various methods such as deposition, plating, printing, and the like.

As described above, since PI is used as the molding layer 3130, the wiring layer 3141 may be directly formed on the molding layer 3130 without consuming a separate insulating layer on the molding layer 3130 as in the related art. Therefore, since a process of forming a separate insulating layer below the wiring layer 3141 may be omitted, there is an effect which is capable of reducing the consumption of the insulating layer, a process time, and a thickness of the package due to the reduction of the insulating layer.

After the wiring layer 3141 is formed, the insulating layer 3142 may be formed. The insulating layer 3142 may be stacked on the exposed surfaces of the molding layer 3130 and the wiring layer 3141. In the drawings, the insulating layer 3142 has been shown as covering the wiring layer 3141 so as to not be exposed to the outside. Alternatively, a portion of the insulating layer 3142 may be removed to expose the wiring layer 3141 to the outside. In this case, the exposed wiring layer 3141 may be used as a path which is capable of electrically connecting to the outside. The insulating layer 3142 may include an insulator, for example, an oxide, a nitride, an EMC, or the like.

After the wiring portion 3140 is formed, the first carrier substrate 3102 is removed to expose the metal pad 3111 of the base substrate 3110.

FIGS. 67 to 76 are cross-sectional views for describing a manufacturing method of the chip package according to the fifth embodiment of the present inventive concept.

Referring to FIGS. 67 to 76, a manufacturing method of the chip package 3200 according to the fifth embodiment of the present inventive concept includes providing the base substrate 3210 having the first surface 3212 on which the metal pad 3211 is formed and the second surface 3213 opposite to the first surface 3212, stacking the base substrate 3210 on a first carrier substrate 3202 such that the first surface 3212 of the base substrate 3210 is in contact with the first carrier substrate 3102 and arranging the chip 3220 on the base substrate 3210, covering the base substrate 3210 and the chip 3220 with the molding layer 3230, forming the first mold via 3231 and the second mold via 3232 on the molding layer 3230, and forming the wiring portion 3240 on the molding layer 3230 and electrically connecting the pad 3221 of the chip 3220 to a via post 3214.

Further, in the manufacturing method according to the fifth embodiment 3200, the providing of the base substrate 3210 may further include forming the through-hole 3215 in the base substrate 3210, and the arranging of the chip 3220 on the base substrate 3210 may further include stacking the chip 3220 on the first carrier substrate 202.

FIGS. 67 to 70 illustrate the forming of the through-hole 3215 in the base substrate 3210. That is, the base substrate 3210 in which the internal wiring 3216 is formed is provided. The internal wiring 3216 formed in the base substrate 3210 may include the via contact 3217, the via 3218, and the lower wiring 3219, and the via contact 3217 and the lower wiring 3219 may be electrically connected by the via 3218. The via contact 3217 and the lower wiring 3219 are integrated with the via 3218 and are preferably made of the same material. The lower wiring 3219 may be electrically connected to the metal pad 3211 formed on the first surface 3212 of the base substrate 3210.

When the base substrate 3210 is provided, the via contact 3217 exposed on the base substrate 3210 is masked using a mask 3201. After the masking, a blasting process is performed on the second surface 3113 of the base substrate 3210 to form the through-hole 3215 in the base substrate 3210.

Figure 71:
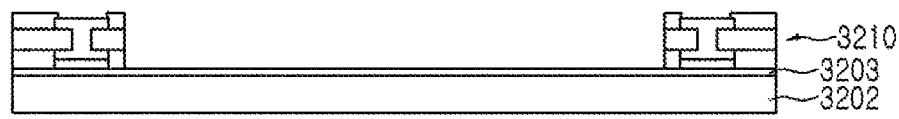
Figure 72:
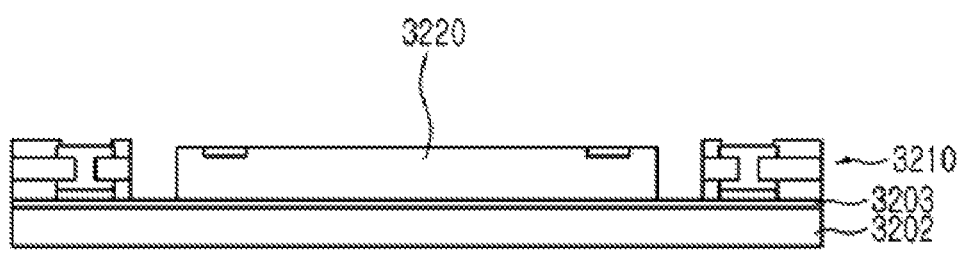

FIGS. 71 and 72 illustrate the arranging of the chip 3220 on the base substrate 3210. The base substrate 3210 on which the through-hole 3215 formed is stacked on the first carrier substrate 3202 on which a first adhesive portion 3203 is formed, and the chip 3220 is inserted into the through-hole 3215 and stacked on the first carrier substrate 3202 through the first adhesive portion 3203. That is, the fourth embodiment 3100 includes the stacking of the chip 3220 on the second carrier substrate 3204 and then stacking the chip 3220 in the seating groove 3215 of the base substrate 3210. However, in the fifth embodiment 3200 of the present inventive concept, since the chip 3220 may be directly stacked on the first carrier substrate 3202, a manufacturing process may be reduced. When the chip 3220 is stacked on the first carrier substrate 3202, the non-active surface of the chip 3220 is preferably to be in contact with the first carrier substrate 3202.

Figure 73:
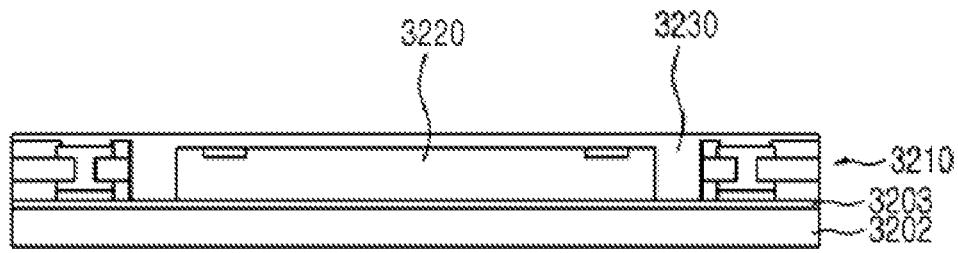

FIG. 73 illustrates the covering of the molding layer 3230 according to the fifth embodiment 3200. That is, the base substrate 3210 and the chip 3220, which are stacked on the first carrier substrate 3202, may be covered with the molding layer 3230. In the fourth embodiment 3100, since the chip 3220 is bonded to the second carrier substrate 3104, the second carrier substrate 3104 is removed before the molding layer 3230 is formed. However, in the fifth embodiment 3200, since the second carrier substrate 3104 is not used separately, removing the second carrier substrate 3104 may be omitted. The molding layer 3230 may be formed to fill in the upper portion and the side surface of the active surface of the chip 3220, the upper portion of the base substrate 3210, and the through-hole 3215.

Further, the first mold via 3231 and the second mold via 3232 may be formed in the molding layer 3230 through a patterning process. The first mold via 3231 may be formed in an upper portion in which the internal wiring of the base substrate 3210 is exposed, and the second mold via 3232 may be formed on the pad 3221 of the chip 3220.

Figure 74:
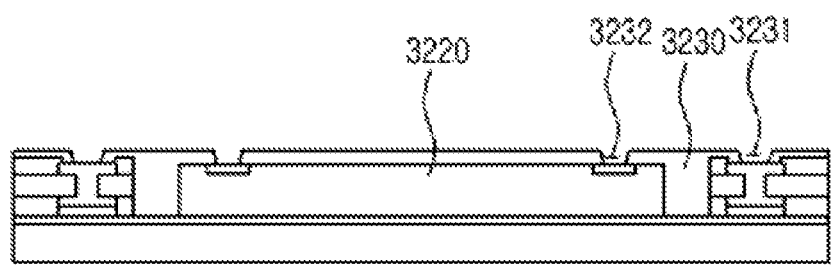
Figure 75:
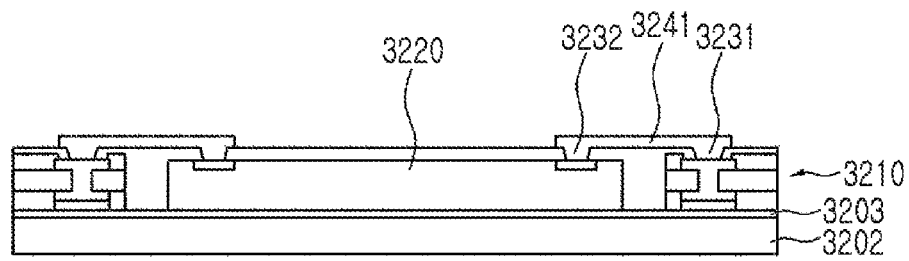
Figure 76:
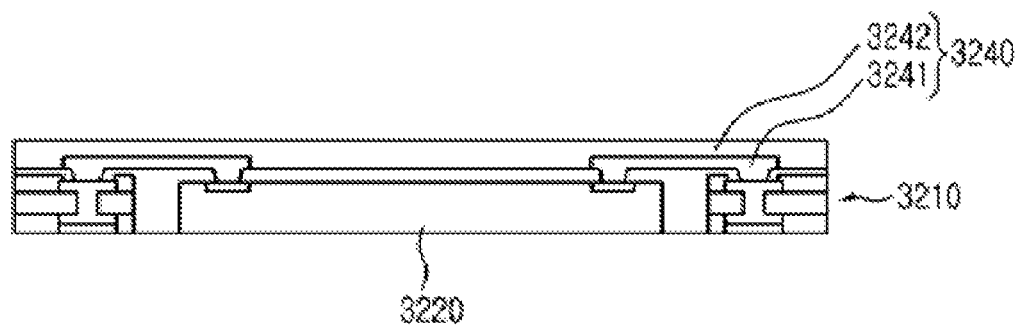

FIGS. 74 and 75 illustrate the formation of the wiring portion 3240. The formation of the wiring portion 3240 is the same as in the fourth embodiment 3100 of the wiring portion 3240, and the wiring portion 3240 may be formed. That is, before the wiring portion 3240 is formed, the first mold via 3231 and the second mold via 3232 may be filled with a conductive material and then formed to electrically connect the first mold via 3231 to the second mold via 3232 using the wiring layer 3241 on the molding layer 3230. Thus, the chip 3220 may be electrically connected to the base substrate 3210 through the first mold via 3231, the wiring layer 3241, and the second mold via 3232 due to the wiring layer 3241.

After the formation of the wiring portion 3240 is completed by stacking the insulating layer 3242 on the exposed surfaces of the molding layer 3230 and the wiring layer 3241, the first carrier substrate 3202 may be removed to expose the metal pad 3211 of the base substrate 3210 and the non-active surface of the chip 3220.

Figure 77:
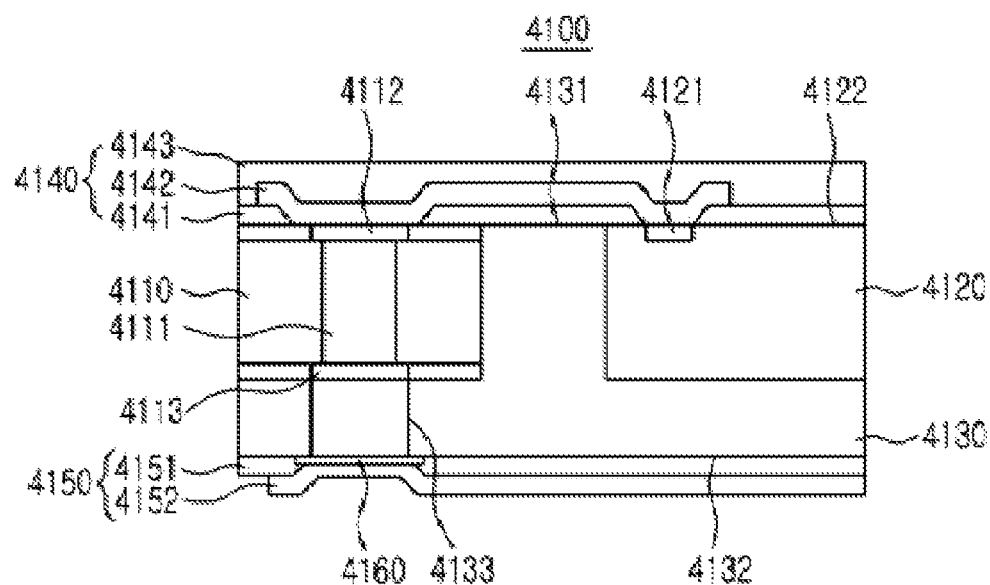
FIG. 77 is a cross-sectional view illustrating a chip package according to a sixth embodiment of the present inventive concept.

FIG. 77 is a cross-sectional view illustrating a chip package according to a sixth embodiment of the present inventive concept.

Referring to FIG. 77, a chip package 4100 according to a sixth embodiment of the present inventive concept includes a via frame 4110, a chip 4120, a molding layer 4130, an upper re-wiring layer 4140, and a lower re-wiring layer 4150.

The via frame 4110 may be made of an insulating substrate. The via frame 4110 may include an insulating material, for example, silicon, glass, ceramic, plastic, or polymer.

Alternatively, the frame 4110 may be made of an insulating ceramic or a ceramic semiconductor material. Various materials may be used as the insulating ceramic. A metal oxide, a metal nitride, soda-lime glass, or sapphire may be used as the insulating ceramic. A silicon material may be used as the ceramic semiconductor material. In addition to the silicon material, ZnO, GaN, GaAs, or the like may be used as the ceramic semiconductor material. However, a material of the frame 4110 may be variously selected according to a material of the carrier substrate or the molding layer 4130.

The via frame 4110 may be provided in a flat-plate shape or provided in various shapes such as a circle shape or a polygon shape.

The via frame 4110 may include a first via hole 4111 which passes through the via frame 4110 vertically. The first via hole 4111 may be used as a path for transmitting an electrical signal in a vertical direction of the chip 4120, and a plurality of via holes may be formed or positions thereof may be changed as necessary. The first via hole 4111 may be filled with a conductive filling material such as a conductive paste or the like. When the via frame 4110 is made of a semiconductor material, a separate insulating layer may be formed on an outer circumferential surface of the via frame 4110. The insulating layer may be provided to block an electrical connection between the via frame 4110 and the chip 4120, each of which are made of a semiconductor material. Further, when the via frame 4110 is made of a semiconductor material, a separate insulating layer may also be formed on an inner circumferential surface of the via hole 4111.

A first via contact pad 4112 and a second via contact pad 4113 may be formed at both ends of the first via hole 4111. A conductive material including a metal may be used in the first via contact pad 4112 and the second via contact pad 4113 so as to more easily transmit an electrical signal through the first via hole 4111.

The chip 4120 is disposed adjacent to the via frame 4110. One surface of the chip 4120 may be an active surface including an active area in which a circuit is formed. Meanwhile, a rear surface of the chip 4120 may be a non-active surface. Alternatively, both surfaces of the chip 4120 may be provided as active surfaces. A pad 4121 for exchanging a signal with the outside may be provided on the active surface of the chip 4120 as a plurality of pads 4121. The pad 4121 may be formed of a conductive material film such as Al. The pad 4121 may be integrally formed with the chip 4120.

The pad 4121 of the chip 4120 may be disposed to face a re-wiring layer. Preferably, the pad 4121 may be disposed to face the upper re-wiring layer 4140. The active surface of the chip 4120 may be coplanar with one surface of the first via contact pad 4112.

Further, when the chip 4120 of the chip package according to the present inventive concept is applied as a fingerprint sensor, a sensing portion 4122 for detecting a fingerprint may be included on the active surface of the chip 4120. The sensing portion 4122 may be formed in various shapes. For example, the sensing portion 4122 may be formed using a conductor. The sensing portion 4122 may find a difference in capacitance due to a difference in height according to shapes of a peak and a valley of a fingerprint of a user's finger and generate a fingerprint image by scanning an image of the fingerprint.

Accordingly, the active surface of the chip 4120 according to the present inventive concept may be formed in an open shape with respect to the upper re-wiring layer 4140, which will be described below, and the sensing portion 4122 may collect external information, for example, fingerprint information on the user's finger, through the open active surface. Although the sensing portion 4122 of the chip 4120 in the present inventive concept is described as a fingerprint sensor, the chip 4120 may be applied as a chip 4120 for electromagnetic sensing, optical sensing, or medical sensing in addition to the fingerprint sensor.

Further, the chip 4120 and the via frame 4110 which are shown in FIG. 1 may be formed in various structures.

Figure 78:
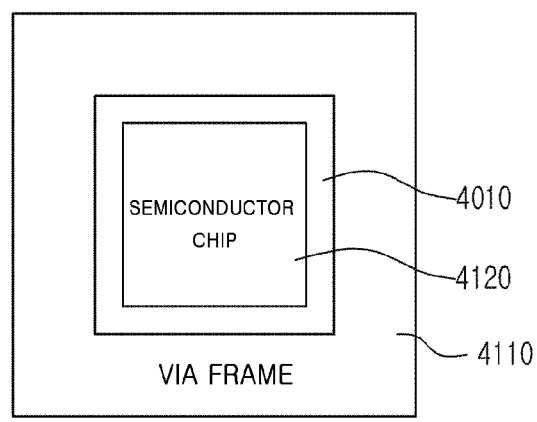
FIGS. 78 to 80 are plan views illustrating a structure of a via frame and a chip according to the sixth embodiment of the present inventive concept.
Figure 79:
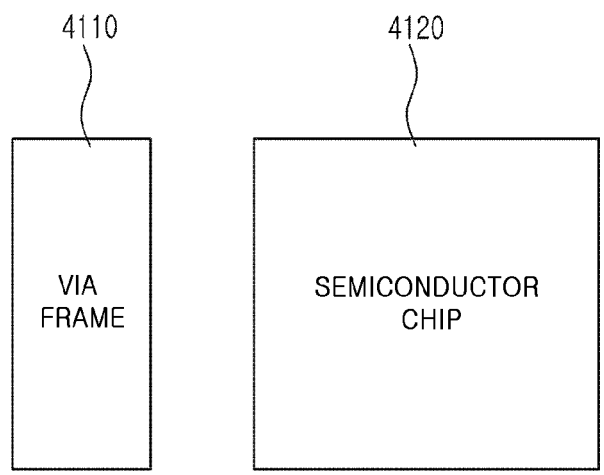
Figure 80:
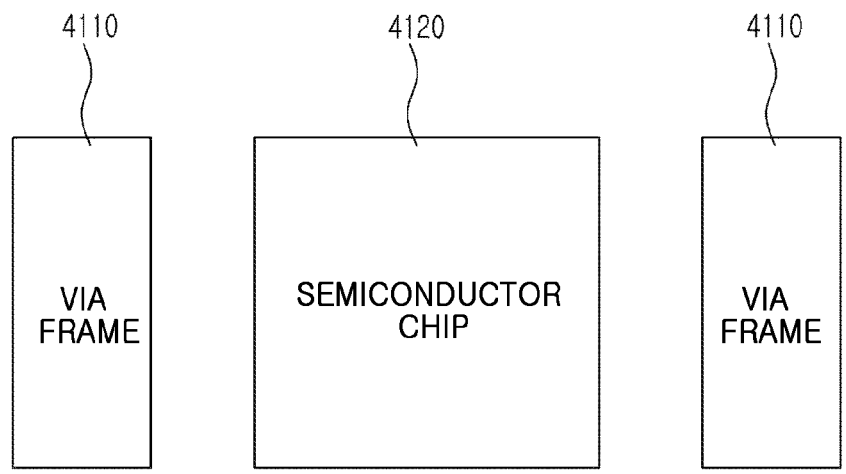

FIGS. 78 to 80 are plan views illustrating a structure of a via frame and a chip according to the sixth embodiment of the present inventive concept.

Referring to FIGS. 78 to 80, as shown in FIG. 78, the via frame 4110 may include a through-hole 4010 therein and the chip 4120 may be disposed in the through-hole 4010. That is, the via frame 4110 may be formed to surround the chip 4120. Therefore, the molding layer 4130 may fill an interior of the through-hole 4010 to integrate the via frame 4110 with the chip 4120. Further, FIGS. 79 and 80 illustrate a structure in which the via frame 4110 is disposed on one side or both sides of the chip 4120. That is, the via frame 4110 may be disposed on one side of the chip 4120 as shown in FIG. 79, or the via frame 4110 may be disposed on both sides of the chip 4120 as shown in FIG. 80. As shown in FIG. 79, the chip package 4100 according to the sixth embodiment of the present inventive concept may have a structure in which the via frame 4110 is disposed on one side of the chip 4120.

As described above, according to the arrangement of the via frame 4110 around the chip 4120, a wiring structure of the upper re-wiring layer 4140 electrically connecting the pad 4121 of the chip 4120 to a via may also be changed to match the structure of the via frame 4110.

Continuing with reference to FIG. 77, the molding layer 4130 may be molded to integrate the chip 4120 with the via frame 4110. That is, the molding layer 4130 may fill in a space between the via frame 4110 and the chip 4120.

The molding layer 4130 may be formed of a conventional EMC or encapsulant material, and the EMC or encapsulant material may be supplied in a liquid phase or a powder phase. When the EMC or encapsulant material is supplied in a liquid phase, the EMC or encapsulant material is formed into the molding layer 4130 through volatilization of a solvent. Further, the molding layer 4130 may include an insulating polymer as a main component and may further include silica particles and the like.

The molding layer 4130 may include a first surface 4131 coplanar with the active surface of the chip 4120 and a second surface 4132 opposite to the first surface 4131.

Further, the molding layer 4130 may include a second via hole 4133. The second via hole 4133 may be formed in the molding layer 4130 by forming a via to extend from the second surface 4132 of the molding layer 4130 to the second via contact pad 4113. For example, a width of the second via hole 4133 may be smaller or larger than that of the first via hole 4111 and may have a solder ball shape in which a width thereof is gradually increased and then decreased.

Like the first via hole 4111, an interior of the second via hole 4133 may be filled with a conductive filling material such as a conductive paste and may be electrically connected to the first via hole 4111 through the second via contact pad 4113.

Further, a third via contact pad 4160 may be formed below the second via hole 4133. That is, one side of the second via hole 4133 may be in contact with the second via contact pad 4113 and the other side thereof may be in contact with the third via contact pad 4160. The third via contact pad 4160 may be formed on the second surface 4132 of the molding layer 4130 and electrically connected to the lower re-wiring layer 4150 which will be described below.

Figure 81:
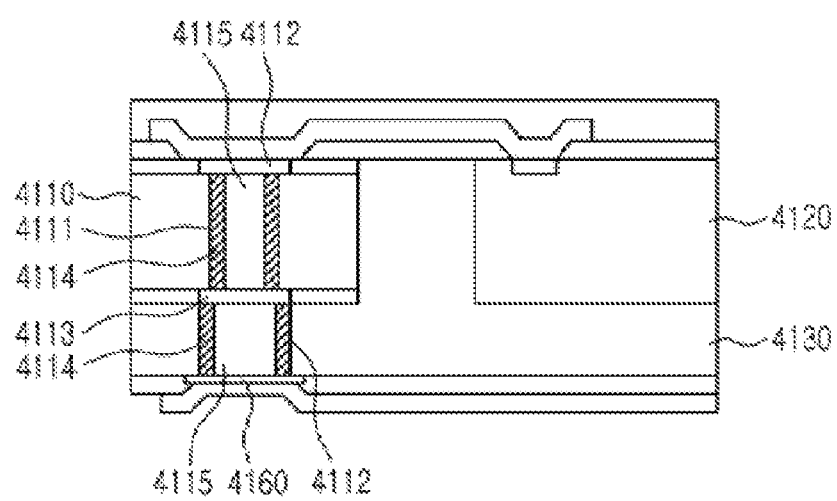
FIG. 81 is a diagram illustrating another example of a via hole according to the sixth embodiment of the present inventive concept.

FIG. 81 is a diagram illustrating another example of the via hole according to the sixth embodiment of the present inventive concept.

Referring to FIG. 81, a through wiring 4114 may be included in the first via hole 4111 and the second via hole 4133. The through wiring 4114 may be made of a conductive material provided along inner circumferential surfaces of the first via hole 4111 and the second via hole 4133 or may be a metal layer applied on the first via hole 4111 and the second via hole 4133. Alternatively, two or more rows of through wiring 4114 may be provided in the via holes 4111 and 4133 or may be formed in only one via hole of the first via hole 4111 or the second via hole 4133.

The through wiring 4114 may be provided in a cylindrical shape, and a through member 4115 may be accommodated in a hollow portion of the through wiring 4114. The through member 4115 may be formed of a non-conductive resin and may be formed to fill in the hollow portion of the through wiring 4114. Alternatively, the through member 4115 may be formed of a conductive material.

Further, the through wiring 4114 may be provided in the form of a solder ball or the like passing through the via holes 4111 and 4113 and may be solder resist ink filling therein. A forming of the through wiring 4114 includes electroless plating, electrolytic plating, sputtering, or printing.

The through wiring 4114 may be formed in both of the first via hole 4111 and the second via hole 4133 or formed in only one via hole of the first via hole 4111 and the second via hole 4133.

Continuing with reference to FIG. 77, the chip package 4100 according to the present inventive concept may include the upper re-wiring layer 4140 and the lower re-wiring layer 4150.

The upper re-wiring layer 4140 may be formed on the first surface 4131 of the molding layer 4130, and the lower re-wiring layer 4150 may be formed on the second surface 4132 of the molding layer 4130.

More specifically, the upper re-wiring layer 4140 is formed on the active surface of the chip 4120, the first surface 4131 of the molding layer 4130, and the via frame 4110 to electrically connect the pad 4121 of the chip 4120 and the first via contact pad 4112. For example, the re-wiring layer 4140 may include a first upper insulating layer 4141, an upper wiring layer 4142, and a second upper insulating layer 4143.

The first upper insulating layer 4141 may be made of an insulating material and provided in the form of a film. Further, the first upper insulating layer 4141 exposes the pad 4121 of the chip 4120, opens the first via contact pad 4112 of the via frame 4110, and blocks the active region of the chip 4120.

The upper wiring layer 4142 includes a conductive material and may be formed on the first upper insulating layer 4141 through a relocation process. A portion of the upper wiring layer 4142 is connected to the pad 4121 of the chip 4120 by filling an open space of the first upper insulating layer 4141, which exposes the pad 4121 of the chip 4120. Further, the upper wiring layer 4142 is electrically connected to the first via contact pad 4112 of the via frame 4110.

However, when the chip 4120 of the chip package according to the present inventive concept performs a function of a fingerprint sensor, it is preferable that the upper wiring layer 4142 is formed to open the active surface of the chip 4120 so that the sensing portion 4122 of the chip 4120 has an open form.

The upper wiring layer 4142 may include a metal as a conductive material, for example, Cu, a Cu alloy, Al, or an Al alloy.

The second upper insulating layer 4143 may be formed to be stacked on the first upper insulating layer 4141 and the upper wiring layer 4142 to insulate the upper wiring layer 4142 from the outside. However, in the drawing, the second upper insulating layer 4143 has been shown as encapsulating the upper wiring layer 4142. Alternatively, the upper second insulating layer 4143 may be provided to expose a portion of the upper wiring layer 4142, and an additional wiring line is formed through the exposed portion of the upper wiring layer 4142 so that the upper wiring layer 4142 may be electrically connected to the outside (a main substrate, the chip, or the package). That is, a POP structure in which a package is stacked on a package or a SIP structure may be achieved. Alternatively, a plurality of chips 4120 may be disposed adjacent to each other or in contact with each other in a width direction.

The lower re-wiring layer 4150 may be formed on the second surface 4132 and the third via contact pad 4160 of the molding layer 4130 to electrically connect the third via contact pad 4160. Further, the lower re-wiring layer 4150 may include a lower insulating layer 4151 and a lower wiring layer 4152.

Like the upper insulating layer, the lower insulating layer 4151 may be made of an insulating material and provided in the form of a film. Further, the lower insulating layer 4151 exposes a third via contact pad 4160 and blocks the second surface 4132 of the molding layer 4130.

The lower wiring layer 4152 includes a conductive material and may be formed on the lower insulating layer 4151 through a relocation process. A portion of the lower wiring layer 4152 is connected to the third via contact pad 4160 by filling an open space of the lower insulating layer 4151, which exposes the third via contact pad 4160.

Accordingly, the chip 4120 may be electrically connected through the pad 4121 of the chip 4120, the upper re-wiring layer 4140, the first via hole 4111, the second via hole 4133, and the lower re-wiring layer 4150.

Figure 82:
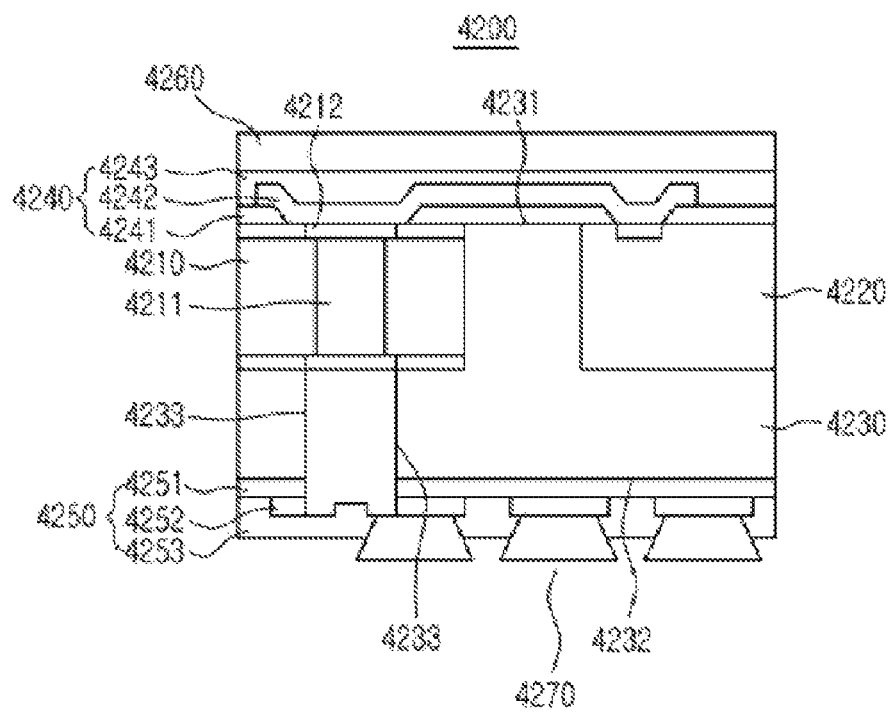
FIG. 82 is a cross-sectional view illustrating a chip package according to a seventh embodiment of the present inventive concept.
Figure 83:
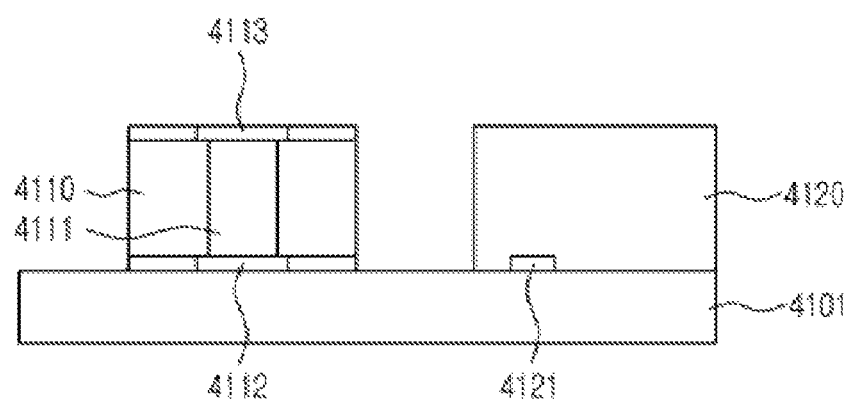
FIGS. 83 to 91 are cross-sectional views for describing a manufacturing method of the chip package according to the sixth embodiment of the present inventive concept.

FIG. 82 is a cross-sectional view illustrating a chip package according to a seventh embodiment of the present inventive concept.

Referring to FIG. 82, a chip package 4200 according to a seventh embodiment of the present inventive concept includes a via frame 4210, a chip 4220, a molding layer 4230, an upper re-wiring layer 4240, a lower re-wiring layer 4250, a protective layer 4260, and a land grid array (LGA) pad 4270.

Structures and materials of the via frame 4210, the chip 4220, the molding layer 4230, and the upper re-wiring layer 4240 are the same as those of the chip package 4100 of the sixth embodiment shown in FIG. 77.

The protective layer 4260 may be formed on the upper re-wiring layer 4240. The protective layer 4260 may be formed to cover the upper re-wiring layer 4240 to prevent the upper re-wiring layer 4240 from being exposed to the outside. The protective layer 4260 may be made of an epoxy film, thermal epoxy, an epoxy resin, a B-stage epoxy film, an ultraviolet (UV) B-stage film having an optional acrylic polymer, a dielectric film, or other suitable material.

The lower re-wiring layer 4250 may include a first lower insulating layer 4251, a lower wiring layer 4252, and a second lower insulating layer 4253.

The first lower insulating layer 4251 may be formed on a second surface 4232 of the molding layer 4230, and a second via hole 4233 may be included in the molding layer 4230 and the first lower insulating layer 4251. Unlike the sixth embodiment 4100 in which the via is formed in only the molding layer 4230, in the seventh exemplary embodiment 4200, the second via hole 4233 may be formed to expose a second via contact pad 4213 by forming a via in the molding layer 4230 and the first lower insulating layer 4251. A conductive filling material such as a conductive paste or the like may fill in the second via hole 4233 to be electrically connected to the second via contact pad 4213.

The lower wiring layer 4252 may be formed on the first lower insulating layer 4251 and the second via hole 4233. Unlike the sixth embodiment 4100, a plurality of lower wiring layers 4252 may be formed to be spaced apart from each other. Further, the lower wiring layers 4252 may be connected to a plurality of pads of the chip 4220.

The second lower insulating layer 4253 may be formed on the first lower insulating layer 4251 and the lower wiring layer 4252 and formed to expose a portion of the lower wiring layer 4252.

The LGA pad 4270 is formed on the exposed lower wiring layer 4252. That is, the LGA pad 4270 may be formed on the lower wiring layer 4252 exposed to the second lower insulating layer 4253. Like the lower wiring layer 4252, a plurality of LGA pads 4270 may be formed to be spaced apart from each other.

The LGA pad 4270 forms a path through which the chip 4220 may be electrically connected to an external circuit. Further, the LGA pad 4270 may be electrically insulated from the lower wiring layer 4252 due to the second lower insulating layer 4253. That is, a thickness of the package may be effectively reduced by forming the LGA pad 4270 on the lower wiring layer 4252 instead of the conventional solder ball shape.

Further, the first via hole 4211 and the second via hole 4233 of the chip package 4200 according to the seventh embodiment may include even the through wiring 4114 and the through member 4115 which are shown in FIG. 81. The through wiring 4114 may be formed in both of the first via hole 4211 and the second via hole 4233 or formed in only one via hole of the first via hole 4211 and the second via hole 4233.

FIGS. 83 to 91 are cross-sectional views for describing a manufacturing method of the chip package according to the sixth embodiment of the present inventive concept.

Referring to FIGS. 83 to 91, FIG. 83 illustrates stacking of the via frame 4110 and the chip 4120 on a carrier substrate 4101. The via frame 4110 may be made of an insulating substrate. The via frame 4110 may include an insulating material, for example, silicon, glass, ceramic, plastic, or polymer. The via frame 4110 may be provided in a flat-plate shape or provided in a circle shape or a polygon shape.

Further, the via frame 4110 may have a form in which through-holes are formed to surround the chip 4120 or have a structure of being disposed on one side or both sides of the chip 4120.

Before the via frame 4110 is stacked on the carrier substrate 4101, the first via hole 4111 may be formed in the via frame 4110. The first via hole 4111 may be provided to vertically pass through the via frame 4110, and a plurality of via holes 4111 may be formed or positions thereof may be changed as necessary. The first via hole 4111 may be filled with a conductive filling material such as a conductive paste or the like.

Further, a first via contact pad 4112 and a second via contact pad 4113 may be formed at the both ends of the first via hole 4111. The first via contact pad 4112 and the second via contact pad 4113 may be formed of a conductive material including a metal.

When the first via hole 4111, the first via contact pad 4112, and the second via contact pad 4113 are formed on the via frame 4110, the via frame 4110 and the chip 4120 may be stacked on the carrier substrate. For example, a first adhesive layer may be bonded to an upper surface of the carrier substrate so that the first via contact pad 4112 of the via frame 4110 may be stacked on the first adhesive layer to be in contact therewith. Further, the chip 4120 may be stacked on the first adhesive layer to be adjacent to the via frame 4110 and may be stacked such that an active surface of the chip 4120 is in contact with the first adhesive layer.

Figure 84:
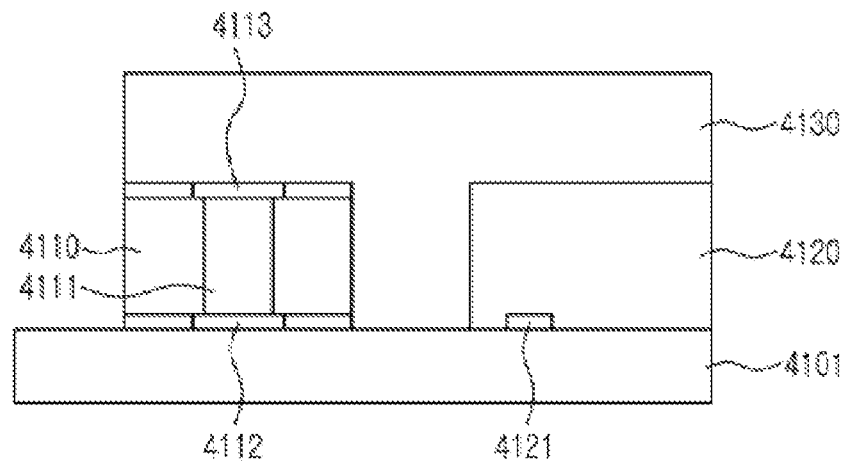

FIG. 84 illustrates the covering of the via frame 4110 and the chip 4120 with the molding layer 4130.

The molding layer 4130 may cover a side surface and a non-active surface of the chip 4120 and may fill in the carrier substrate such that one side surface of the via frame 4110 and the second via contact pad 4113 are covered. Therefore, the via frame 4110 may be integrated with the chip 4120 due to the molding layer 4130, and the molding layer 4130 may protect the via frame 4110 and the chip 4120 from the outside. Further, the molding layer 4130 may include the first surface 4131 coplanar with the active surface of the chip 4120 and the second surface 4132 opposite to the first surface 4131. The molding layer 4130 may include an insulating material, for example, an EMC or an encapsulant. The molding layer 4130 may be formed using a printing method or a compression molding method.

Figure 85:
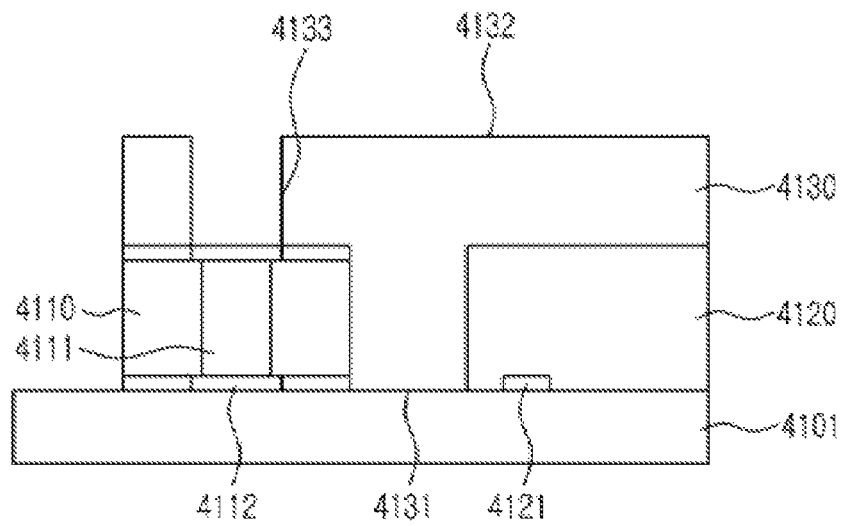
Figure 86:
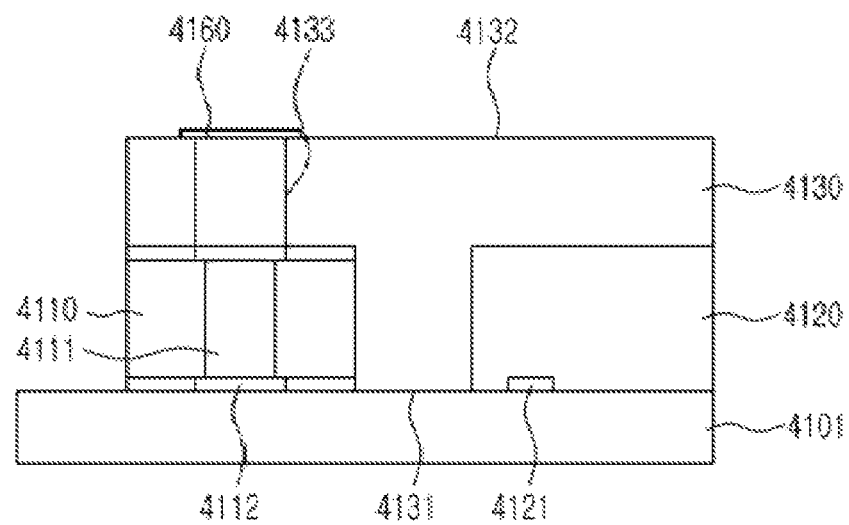

FIGS. 85 and 86 illustrate the formation of the second via hole 4133 and the third via contact pad 4160 in the molding layer 4130.

As shown in FIG. 85, the second via hole 4133 may be formed in the molding layer 4130 by forming a via to extend from the second surface 4132 of the molding layer 4130 to the second via contact pad 4113. Preferably, the second via hole 4133 may be formed to expose the second via contact pad 4113 on the second via contact pad 4113 of the via frame 4110. When the second via hole 4133 is formed in the molding layer 4130, a conductive filling material such as a conductive paste may fill in the second via hole 4133.

Further, as shown in FIG. 86, the third via contact pad 4160 may be formed on the second via hole 4133. That is, the third via contact pad 4160 may be formed on one side of the second via hole 4133 and the second surface 4132 of the molding layer 4130. The third via contact pad 4160 may be made of a conductive material including a metal which is the same material as the first via contact pad 4112 and the second via contact pad 4113.

Figure 87:
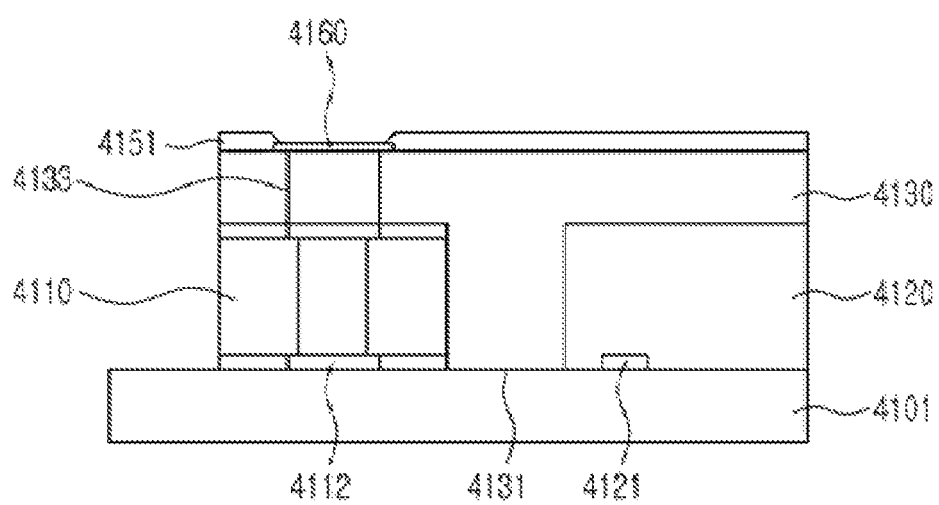
Figure 88:
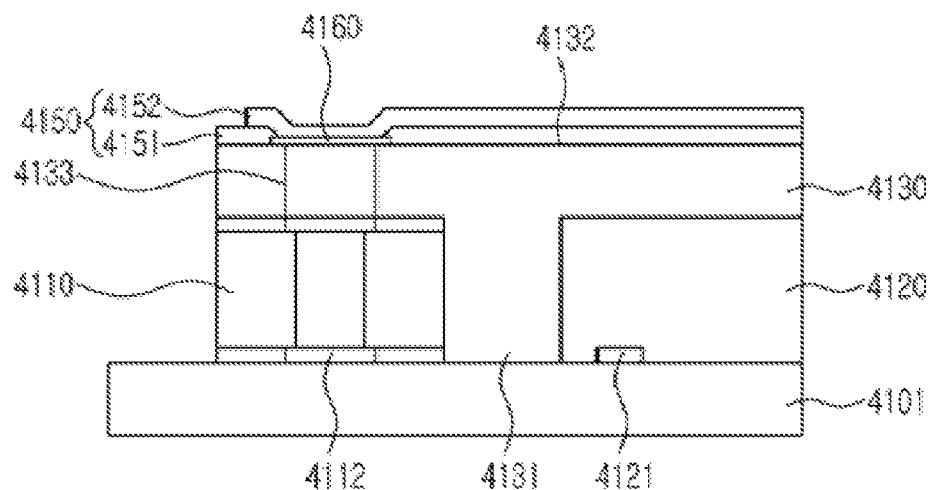

FIGS. 87 and 88 illustrate the formation of the lower re-wiring layer 4150. The lower re-wiring layer 4150 may be formed on the second surface 4132 of the molding layer 4130 and the third via contact pad 4160. Further, the lower re-wiring layer 4150 may include the lower insulating layer 4151 and the lower wiring layer 4152.

As shown in FIG. 87, the lower insulating layer 4151 may be stacked to cover the second surface 4132 of the molding layer 4130 and stacked to expose the third via contact pad 4160. The exposure of the third via contact pad 4160 may employ an etching process or a laser ablation process. The lower insulating layer 4151 may include an insulating material, for example, an oxide, a nitride, an EMC, or the like.

As shown in FIG. 88, the lower wiring layer 4152 may be formed on the lower insulating layer 4151. The lower wiring layer 4152 includes a conductive material and may be formed on the lower insulating layer 4151 through a relocation process. A portion of the lower wiring layer 4152 is connected to the third via contact pad 4160 by filling an open space of the lower insulating layer 4151, which exposes the third via contact pad 4160. The lower wiring layer 4152 may include a conductive material, for example, a metal such as Cu, a Cu alloy, Al, or an Al alloy. The lower wiring layer 4152 may be formed using various methods such as deposition, plating, printing, and the like.

Figure 89:
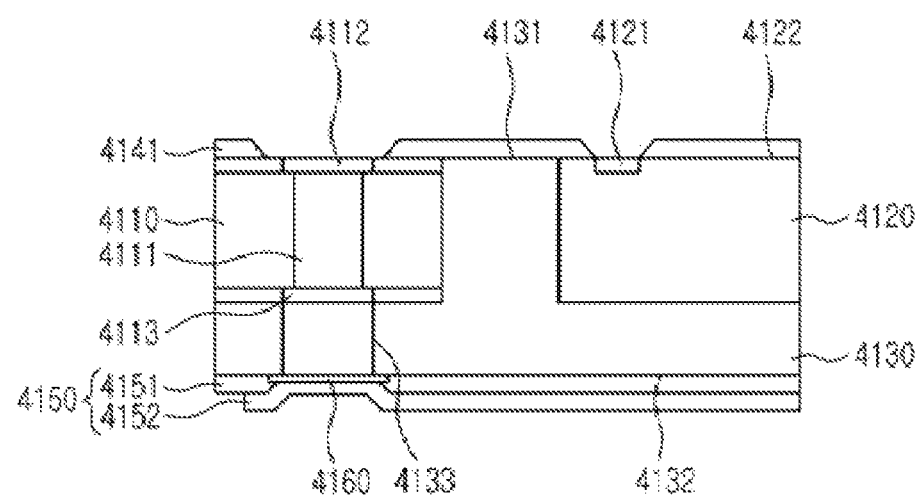
Figure 90:
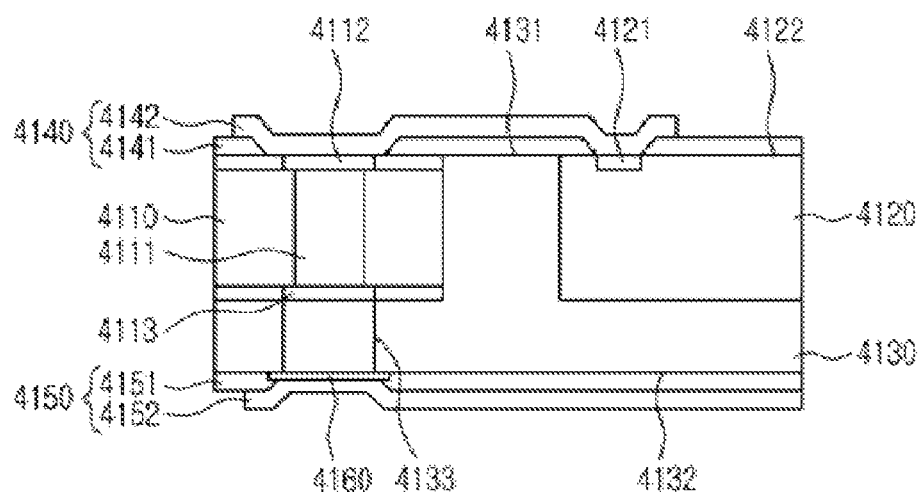
Figure 91:
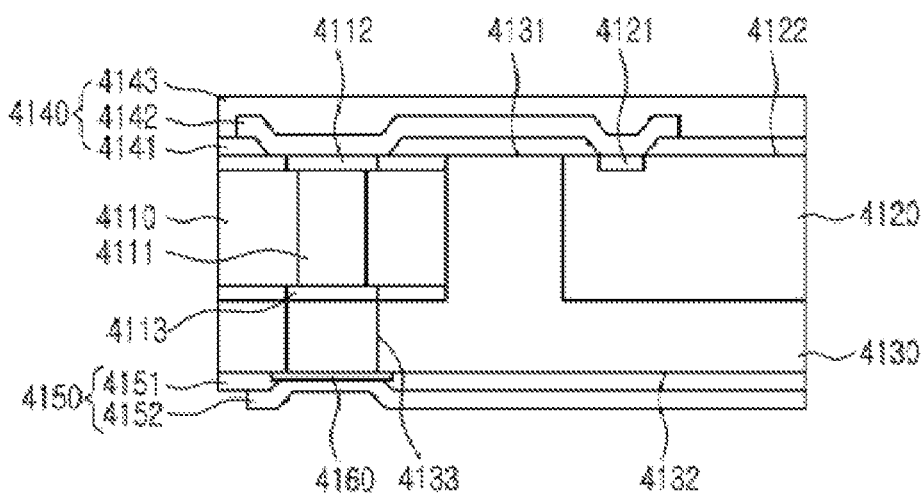

FIGS. 89 and 91 illustrate the formation of the upper re-wiring layer 4140.

Before the upper re-wiring layer 4140 is formed, the carrier substrate is removed. Since the carrier substrate is removed, the active area of the chip 4120, the via frame 4110, and the first surface 4131 of the molding layer 4130 may be exposed. The upper re-wiring layer 4140 may be formed on the exposed surfaces to electrically connect the pad 4121 of the chip 4120 to the first via contact pad 4112. Further, the upper re-wiring layer 4140 may include the first upper insulating layer 4141, the upper wiring layer 4142, and the second upper insulating layer 4143.

The first upper insulating layer 4141 is formed on the active area of the chip 4120, the via frame 4110, and the first surface 4131 of the molding layer 4130. Further, the first upper insulating layer 4141 may be formed to expose the pad 4121 of the chip 4120, open the first via contact pad 4112 of the via frame 4110, and cover the active region of the chip 4120. Further, the first upper insulating layer 4141 may be made of an insulating material and provided in the form of a film.

The exposure of the pad 4121 of the chip 4120 and the first via contact pad 4112 may employ an etching process or a laser ablation process. The first upper insulating layer 4141 may include an insulating material, for example, an oxide, a nitride, an EMC, or the like.

The upper wiring layer 4142 includes a conductive material and may be formed on the first upper insulating layer 4141 through a relocation process. A portion of the upper wiring layer 4142 is connected to the pad 4121 of the chip 4120 by filling an open space of the first upper insulating layer 4141, which exposes the pad 4121 of the chip 4120. Further, the upper wiring layer 4142 is electrically connected to the first via contact pad 4112 of the via frame 4110.

However, when the chip 4120 of the chip package according to the present inventive concept performs a function of a fingerprint sensor, it is preferable that the upper wiring layer 4142 is formed to open the active surface of the chip 4120 so that the sensing portion 4122 of the chip 4120 has an open form. The upper wiring layer 4142 may include a metal as a conductive material, for example, Cu, a Cu alloy, Al, or an Al alloy.

The second upper insulating layer 4143 may be formed to be stacked on the exposed surfaces of the first upper insulating layer 4141 and the upper wiring layer 4142 to insulate the first upper insulating layer 4141 and the upper wiring layer 4142 from the outside. However, in the drawing, the second upper insulating layer 4143 has been shown as encapsulating the upper wiring layer 4142. Alternatively, the upper second insulating layer 4143 may be provided to expose a portion of the upper wiring layer 4142, and an additional wiring line is formed through the exposed portion of the upper wiring layer 4142 so that the upper wiring layer 4142 may be electrically connected to the outside (a main substrate, the chip, or the package). That is, a POP structure in which a package is stacked on a package or a SIP structure may be achieved. The second upper insulating layer 4143 may include an insulating material, for example, an oxide, a nitride, an EMC, or the like.

FIGS. 92 to 100 are cross-sectional views for describing a manufacturing method of the chip package according to the seventh embodiment of the present inventive concept.

Figure 92:
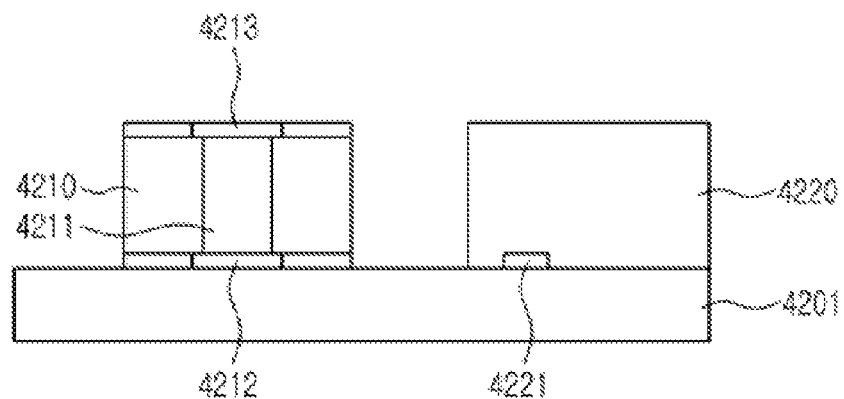
FIGS. 92 to 100 are cross-sectional views for describing a manufacturing method of the chip package according to the seventh embodiment of the present inventive concept.
Figure 93:
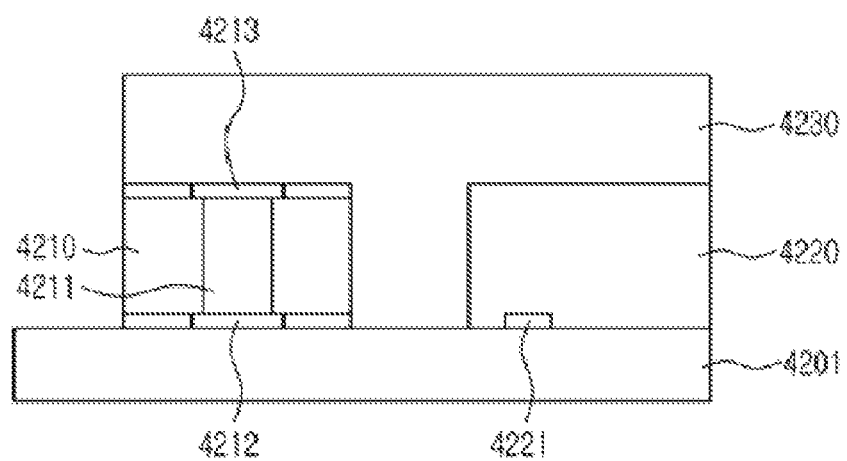

Referring to FIGS. 92 to 100, FIG. 92 illustrates the stacking of the via frame 4210 and the chip 4220 on the carrier substrate, and FIG. 93 illustrates the covering of the via frame 4210 and the chip 4220 with the molding layer 4230. The processes shown in FIGS. 92 and 93 are the same as those of the sixth embodiment 4100, and thus detailed descriptions thereof will be omitted herein.

Figure 94:
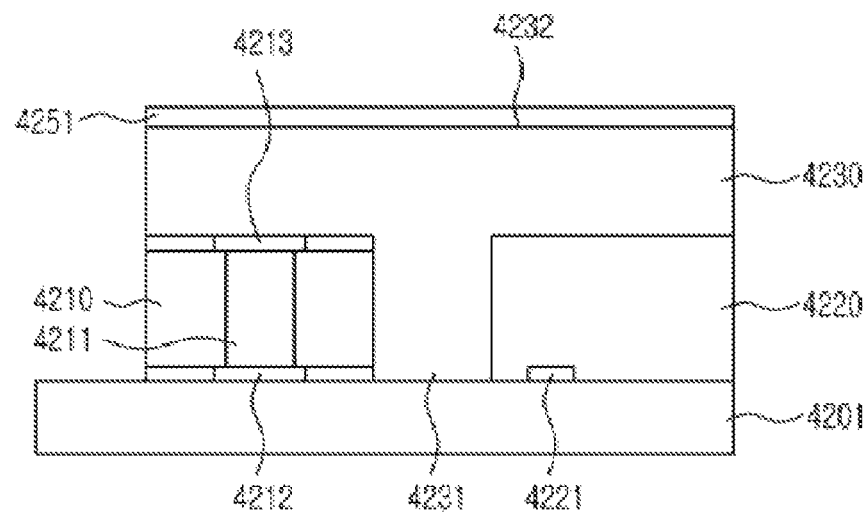

FIG. 94 illustrates the formation of the first lower insulating layer 4251 of the lower re-wiring layer 4250. The first lower insulating layer 4251 may be stacked on the second surface of the molding layer 4230 to cover the molding layer 4230.

Figure 95:
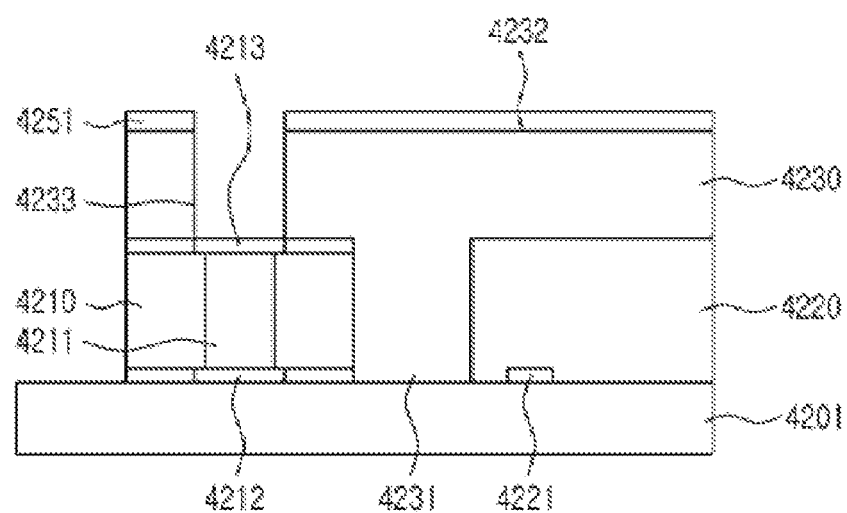

FIG. 95 illustrates the formation of the second via hole 4233. The second via hole 4233 may be formed to extend from the first lower insulating layer 4251 to the second via contact pad. That is, the second via hole 4233 may be formed to expose the second via contact pad by forming vias in the first lower insulating layer 4251 and the molding layer 4230.

Figure 96:
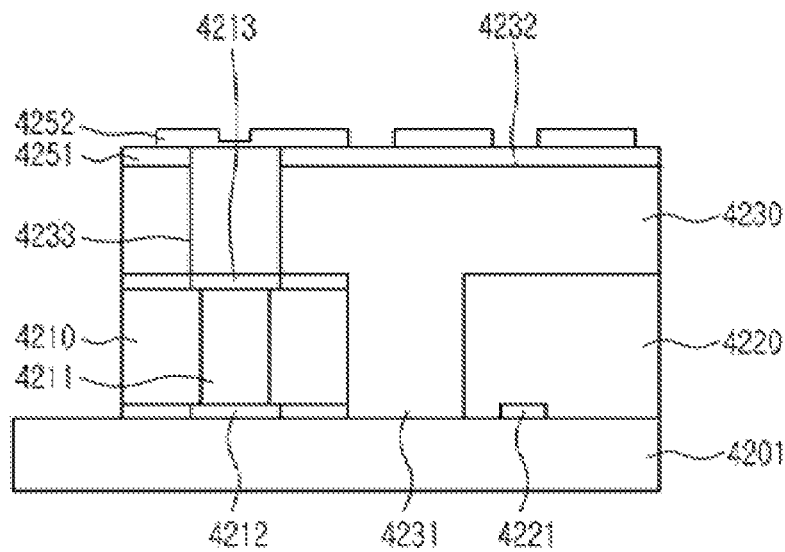

FIG. 96 illustrates the formation of the lower wiring layer 4252 of the lower re-wiring layer 4250. Before the lower wiring layer 4252 is formed, a conductive filling material such as a conductive paste or the like may fill in the second via hole 4233.

After the conductive filling material fills the second via hole 4233, the lower wiring layer 4252 may be formed on the first lower insulating layer 4251 and the second via hole 4233 through a relocation process. The lower wiring layer 4252 may be electrically connected to the second via hole 4233, and a plurality of lower wiring layers 4252 may be formed to be spaced apart from each other on the first lower insulating layer 4251. That is, the lower wiring layers 4252 may be connected to a plurality of pads of the chip 4220. Like the upper wiring layer, the lower wiring layer 4252 may include a metal as a conductive material, for example, Cu, a Cu alloy, Al, or an Al alloy.

Figure 97:
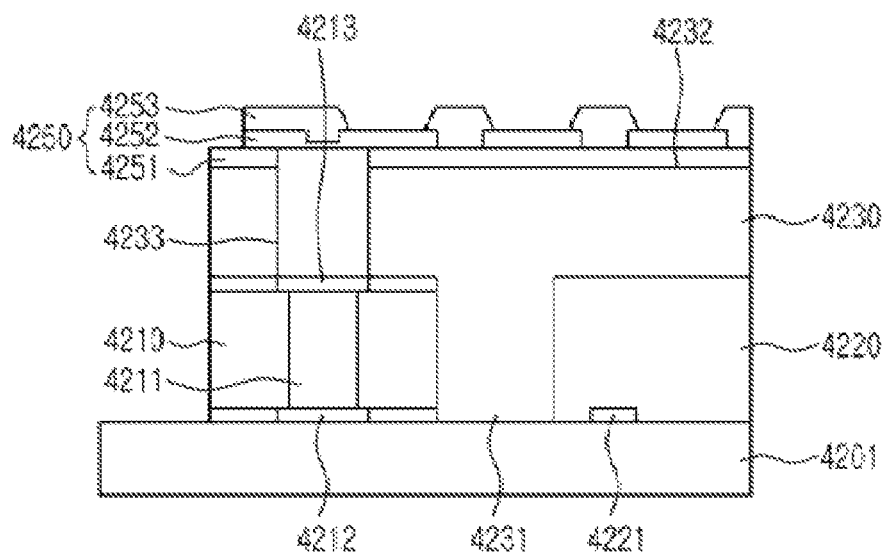

FIG. 97 illustrates the formation of the second lower insulating layer 4253 of the lower re-wiring layer 4250. The second lower insulating layer 4253 may be formed on the first lower insulating layer 4251 and the lower wiring layer 4252 and formed to expose a portion of the lower wiring layer 4252. In order to expose the lower wiring layer 4252, a photoresist may be formed in a region of the lower wiring layer 4252, which will be exposed, and then the second lower insulating layer 4253 may fill in a region in which the photoresist is not formed so that the second lower insulating layer 4253 may be formed. Accordingly, the second lower insulating layer 4253 may be formed to cover a portion of the lower wiring layer 4252 and the first lower insulating layer 4251 so that a plurality of lower wiring layers 4252 formed to be spaced apart from each other may be electrically insulated from each other.

Figure 98:
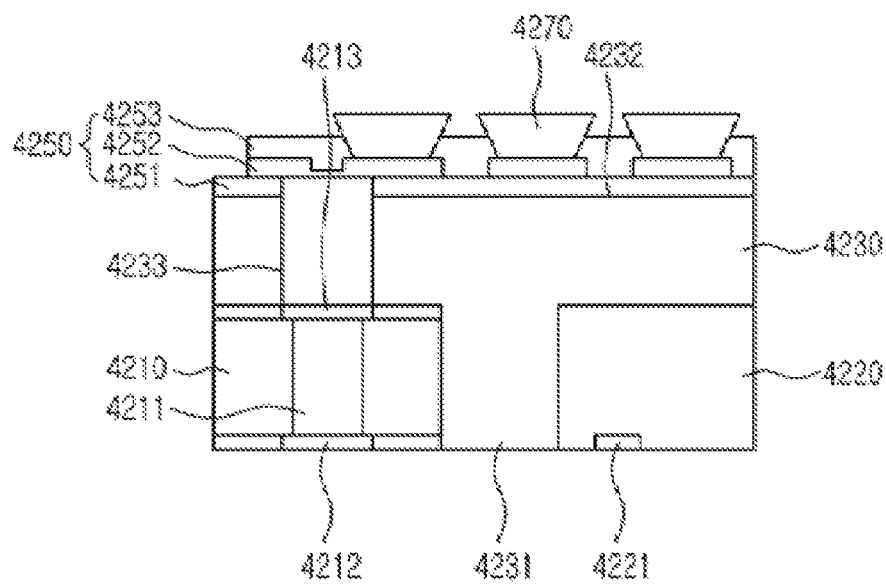

FIG. 98 illustrates the formation of the LGA pad 4270. The LGA pad 4270 may be formed on the lower wiring layer 4252 exposed through the second lower insulating layer 4253. That is, the LGA pad 4270 may be formed on each of the plurality of lower wiring layers 4252 exposed through the second lower insulating layer 4253. Further, a plurality of LGA pads 4270 may be electrically connected to the lower wiring layers 4252 and insulated from each other due to the second lower insulating layer 4253.

As described above, the LGA pad 4270 is formed on the lower wiring layer 4252 so that it is possible to effectively reduce the thickness of the package more than that of a conventional external connection terminal of a solder ball type.

Figure 99:
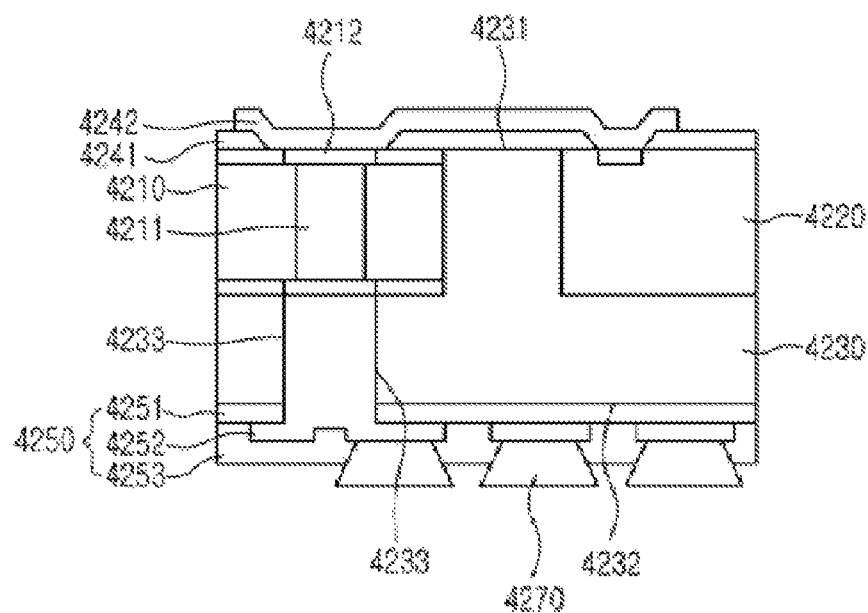

FIG. 99 illustrates the formation of the upper re-wiring layer 4240. Since the formation of the upper re-wiring layer 4240 is the same as that of the sixth embodiment 4100, a detailed description thereof will be omitted herein.

Figure 100:
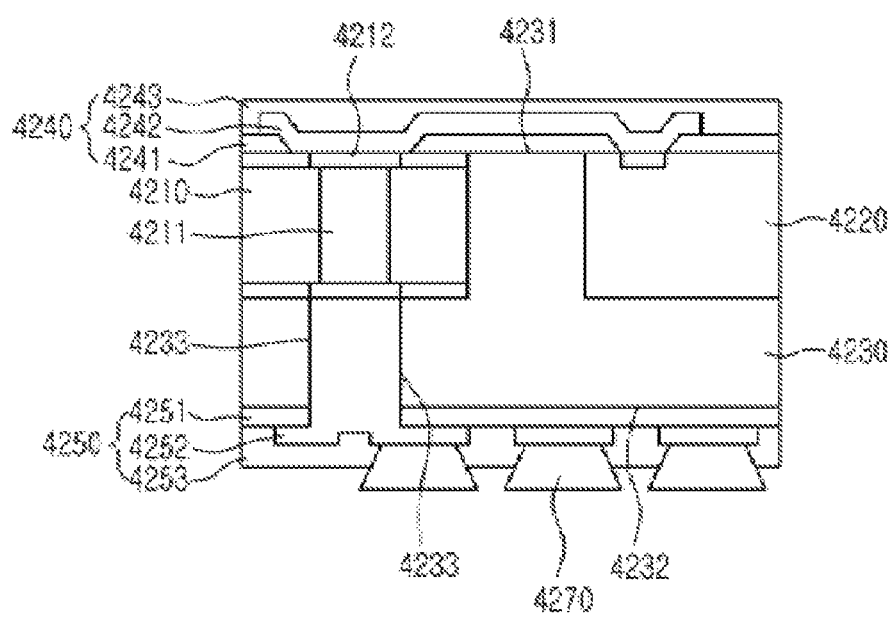

FIG. 100 illustrates the formation of the protective layer 4260. The protective layer 4260 may be formed on the upper re-wiring layer 4240, more specifically, the upper second insulating layer. The protective layer 4260 may be formed to cover the upper re-wiring layer 4240 to prevent the upper re-wiring layer 4240 from being exposed to the outside. The protective layer 4260 may be made of an epoxy film, thermal epoxy, an epoxy resin, a B-stage epoxy film, a UV B-stage film having an optional acrylic polymer, a dielectric film, or other suitable material.

As described above, the chip package according to the present inventive concept may improve durability of the package by further forming the reinforcing layer 1300 on the chip 1200 using the adhesive layer 1310 and integrally molding the chip 1200 and the reinforcing layer 1300 using the molding layer 1400.

Further, the solder ball 2120 is formed between the base substrate 2110 and the re-wiring layer 2150 and a structure, in which the base substrate 2110 and the re-wiring layer 2150 are integrated with the molding layer 2140, is achieved so that it is possible to improve the strength of the package. Since PI is used as the molding layer 3130, the wiring layer 3141 may be directly formed on the molding layer 3130 without consuming a separate insulating layer formed on the molding layer 3130 as in the related art. Therefore, since a process of forming a separate insulating layer below the wiring layer 3141 may be omitted, there is an effect which is capable of reducing the consumption of the insulating layer, a process time, and a thickness of the package due to the reduction of the insulating layer.

Further, since the re-wiring layers 4140 and 4150 are formed on the upper and lower portions of the via frame 4110, the chip 4120 may be electrically connected to the external connection terminal so that it is possible to effectively reduce the thickness of the package.

Meanwhile, the embodiments of the present inventive concept disclosed in the present disclosure and the accompanying drawings are merely presented as specific examples to aid understanding and are not intended to limit the scope of the present inventive concept. It will be apparent to those skilled in the art that other modifications based on the technical idea of the present inventive concept can be implemented in addition to the embodiments disclosed herein.

The invention claimed is:
1. A chip package comprising:
a chip including an active surface on which a pad is formed and a non-active surface opposite to the active surface;
an encapsulation portion including a first surface which covers the chip and is formed in the same direction as the active surface of the chip and a second surface opposite to the first surface;
an external connection terminal connected to the chip and electrically connected to the outside; and a wiring portion electrically connected to the pad and the external connection terminal,
a reinforcing layer provided on the non-active surface of the chip,
wherein the wiring portion includes:
an upper wiring portion formed on a first surface of the encapsulation portion and configured to extend out of an area of the chip;
a lower wiring portion formed on the second surface of the encapsulation portion; and
a connection portion configured to electrically connect the upper wiring portion to the lower wiring portion, and
wherein the reinforcing layer includes:
an insertion hole formed to allow the connection portion to be inserted thereinto; and
an injection hole formed to allow the encapsulation portion to be injected below the reinforcing layer to cover the chip.

2. The chip package of claim 1, wherein the upper wiring portion includes:
an upper insulating layer formed on the active surface of the chip and the first surface of the encapsulation portion; and
an upper wiring layer formed on the upper insulating layer and electrically connected to the pad.

3. The chip package of claim 1, wherein the connection portion includes
a body portion,
at least one through portion configured to pass through at least a portion of the body portion, and
a conductive connection portion provided in the through portion.

4. The chip package of claim 3, wherein the connection portion is disposed in a region of one side of the chip or disposed in regions of both sides thereof.

5. The chip package of claim 3, wherein the connection portion is formed to surround a periphery of the chip.

6. The chip package of claim 1, wherein the reinforcing layer is formed of any one among stainless steel (SUS), Cu, Ag, Au, W, Pt, Cr, epoxy, and urethane.

7. A chip package comprising:
a chip including an active surface on which a pad is formed and a non-active surface opposite to the active surface;
an encapsulation portion including a first surface which covers the chip and is formed in the same direction as the active surface of the chip and a second surface opposite to the first surface;
an external connection terminal connected to the chip and electrically connected to the outside; and
a wiring portion electrically connected to the pad and the external connection terminal,
wherein the wiring portion includes:
an upper wiring portion formed on a first surface of the encapsulation portion and configured to extend out of an area of the chip;
a lower wiring portion formed on the second surface of the encapsulation portion; and
a connection portion configured to electrically connect the upper wiring portion to the lower wiring portion,
wherein the connection portion includes a first mold via and a second mold via which are formed in the encapsulation portion,
wherein the upper wiring portion includes:
an upper wiring layer formed to be in contact with the first surface of the encapsulation portion and configured to electrically connect the first mold via to the second mold via; and
an upper insulating layer formed on the upper wiring layer,
wherein the first mold via is connected to the lower wiring portion, and the second mold via is connected to the pad.

8. The chip package of claim 7, wherein the connection portion includes:
a body portion,
at least one through portion configured to pass through at least a portion of the body portion, and
a conductive connection portion provided in the through portion.

9. The chip package of claim 8, wherein the connection portion includes a via post configured to protrude upward from the body portion and electrically connect to the conductive connection portion.

10. The chip package of claim 9, wherein a diameter of the via post is greater than or equal to that of the conductive connection portion.

11. The chip package of claim 8, wherein the conductive connection portion includes:
a via contact connected to the first mold via;
a via connected to the via contact and configured to extend vertically; and
a lower wiring configured to extend a predetermined distance from the via and connected to the external connection terminal.

12. The chip package of claim 7, wherein the connection portion is formed to pass through the encapsulation portion, and a width of the connection portion becomes narrower in a vertical direction based on a center point of a vertical cross section of the connection portion.

13. The chip package of claim 7, wherein a light transmissive insulating layer is formed on the active surface of the chip.

14. A chip package comprising:
a chip including an active surface on which a pad is formed and a non-active surface opposite to the active surface;
an encapsulation portion including a first surface which covers the chip and is formed in the same direction as the active surface of the chip and a second surface opposite to the first surface;
an external connection terminal connected to the chip and electrically connected to the outside; and
a wiring portion electrically connected to the pad and the external connection terminal,
wherein the wiring portion includes:
an upper wiring portion includes a first upper insulating layer formed on the active surface of the chip and the first surface of the encapsulation portion, an upper wiring layer formed on the first upper insulating layer and electrically connected to the pad, and a second upper insulating layer formed on the upper wiring layer;
a connection portion includes a body portion, at least one through portion configured to pass through at least a portion of the body portion, and a conductive connection portion provided in the through portion;
a lower wiring portion formed on the second surface of the encapsulation portion;
a mold via configured to electrically connect the conductive connection portion to the lower wiring portion, wherein the mold via is included on the second surface of the encapsulation portion; and
a protective layer provided on the upper wiring portion and configured to cover the upper wiring portion.

15. The chip package of claim 14, wherein the connection portion is disposed in a region of one side of the chip or disposed in regions of both sides thereof.

16. The chip package of claim 14, wherein the connection portion is formed to surround a periphery of the chip.

* * * * *